(12) United States Patent
Miura et al.

(10) Patent No.: US 7,280,426 B2
(45) Date of Patent: Oct. 9, 2007

(54) SEMICONDUCTOR DEVICE WITH NON-VOLATILE MEMORY AND RANDOM ACCESS MEMORY

(75) Inventors: Seiji Miura, Hachioji (JP); Kazushige Ayukawa, Kokubunji (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 11/439,139

(22) Filed: May 24, 2006

(65) Prior Publication Data

US 2006/0221756 A1     Oct. 5, 2006

Related U.S. Application Data

(63) Continuation of application No. 11/152,526, filed on Jun. 13, 2005, now Pat. No. 7,068,562, which is a continuation of application No. 10/861,452, filed on Jun. 7, 2004, now Pat. No. 6,952,368, which is a continuation of application No. 10/164,905, filed on Jun. 10, 2002, now Pat. No. 6,791,877.

(30) Foreign Application Priority Data

Jun. 11, 2001   (JP)   ............................. 2001-174978

(51) Int. Cl.
*G11C 8/00*   (2006.01)
*G11C 7/00*   (2006.01)

(52) U.S. Cl. ..................... 365/230.03; 365/63; 365/201

(58) Field of Classification Search ........... 365/230.03, 365/63, 201
See application file for complete search history.

(56) References Cited

U.S. PATENT DOCUMENTS 5,315,549 A     5/1994   Scherpenberg et al.

(Continued)

FOREIGN PATENT DOCUMENTS

| EP | 0 566 306 A2 | 4/1993 |
|----|--------------|--------|
| JP | 7-146820 | 4/1994 |
| JP | 2001-5723 | 6/1999 |

OTHER PUBLICATIONS

Sharp Corporation, "LRS1337 Stacked Chip 32M Flash Memory and 4M SDRAM" Data Sheet, 1999, pp. 1-24.
Keith D. Gann, "High Density Packaging of Flash Memory", 1998 Int'l Non Volatile Memory Technology Conference, pp. 96-98.

*Primary Examiner*—Son Dinh
(74) *Attorney, Agent, or Firm*—Reed Smith LLP; Stanley P. Fisher, Esq.; Juan Carlos A. Marquez, Esq.

(57) ABSTRACT

A semiconductor device including a large capacity non-volatile memory and at least one random access memory, said the access time of said device being matched to the access time of each random access memory. The semiconductor memory device is comprised of: a non-volatile memory FLASH having a first reading time; a random access memory DRAM having a second reading time which is more than 100 times shorter than the first reading time; a circuit that includes a control circuit connected to both the FLASH and the DRAM and enabled to control accesses to those FLASH and DRAM; and a plurality of I/O terminals connected to the circuit. As a result, FLASH data is transferred to the DRAM before the DRAM is accessed, thereby matching the access time between the FLASH and the DRAM. Data is written back from the DRAM to the FLASH as needed, thereby keeping data matched between the FLASH and the DRAM and storing the data.

7 Claims, 43 Drawing Sheets

U.S. PATENT DOCUMENTS

| | | |
|---|---|---|
| 5,530,673 A | 6/1996 | Tobita et al. |
| 5,625,840 A * | 4/1997 | Numata et al. ............... 710/5 |
| 5,650,976 A | 7/1997 | McLaury |
| 6,029,046 A | 2/2000 | Khan et al. |
| 6,173,358 B1 * | 1/2001 | Combs ..................... 711/100 |
| 6,324,103 B2 | 11/2001 | Hiraki et al. |
| 6,484,270 B1 | 11/2002 | Odani |

* cited by examiner

FIG. 11

EXTERNAL
- CLK
- COM
- A0~A15
- IO0~IO15

DRAM1
- D1-CLK
- D1-COM
- D1-A0 ~D1-A15
- D1-DQ0 ~D1-DQ15
- WAIT

FIG. 12

EXTERNAL
- CLK
- COM
- A0~A15
- IO0~IO15

DRAM1
- D1-CLK
- D1-COM
- D1-A0 ~D1-A15
- D1-DQ0 ~D1-DQ15
- WAIT

EXTERNAL
- CLK
- COM
- A0~A15
- IO0~IO15

DRAM1
- D1-CLK
- D1-COM
- D1-A0 ~D1-A15
- D1-DQ0 ~D1-DQ15
- WAIT

| Temp | tREF (ms) | T1 [70ns×8192] | T2 [70ns×tREF/8/80ns] | T3 |
|---|---|---|---|---|
| HIGH | 48 | 0.573ms | 5.25ms | 0.144ms |
| NORMAL | 64 | 0.573ms | 7ms | 0.287ms |
| LOW | 128 | 0.573ms | 14ms | 1.15ms |

SEMICONDUCTOR DEVICE WITH NON-VOLATILE MEMORY AND RANDOM ACCESS MEMORY

CROSS-REFERENCE TO RELATED APPLICATIONS

This application is a Continuation application of U.S. application Ser. No. 11/152,526 filed Jun. 13, 2005 now U.S. Pat. No. 7,068,562, which is a Continuation application of U.S. application Ser. No. 10/861,452 filed Jun. 7, 2004 now U.S. Pat. No. 6,952,368, which is a Continuation application of U.S. application Ser. No. 10/164,905 filed Jun. 10, 2002 now U.S. Pat. No. 6,791,877. Priority is claimed based on U.S. application Ser. No. 11/152,526 filed Jun. 13, 2005, which claims the priority U.S. application Ser. No. 10/861, 452 filed Jun. 7, 2004, which claims the priority U.S. application Ser. No. 10/164,905 filed Jun. 10, 2002, which claims the priority date of Japanese Patent Application No. 2001-174978 filed Jun. 11, 2001, all of which is incorporated by reference.

BACKGROUND OF THE INVENTION

1. Field of the Invention

The present invention relates to a stacked memory semiconductor device that includes various kinds of memories, and, more particularly, the present invention relates to a combination of said stacked memories, a method for controlling those memories, and a structure for integrating those memories into a multi-chip module.

2. Description of the Background

The following documents are referenced in this specification. The documents are numbered, and hereinafter, they will be described with reference to these numbers. ["Document 1"]: LRS1337 Stacked Chip 32M Flash Memory and 4M SRAM Data Sheet (Apr. 21, 2000); ["Document 2"]: Official Gazette of JP-A 299616/1991 (Official Gazette of European Patent No. 566,360, Oct. 20, 1993); ["Document 3"]: Official Gazette of JP-A 146820/1993; and ["Document 4"]: Official Gazette of JP-A 5723/2001.

Document 1 discloses a stacked semiconductor memory in which a flash memory (capacity: 32M bits) and an SRAM (capacity: 4M bits) are molded together on a stacked chip in an FBGA package. The flash memory and the SRAM share address input terminals and data I/O terminals connected to the input/output electrodes of the FBGA package respectively. However, the control terminals of the memories are independent of each other.

FIG. 17 in Document 2 shows a stacked semiconductor memory in which a flash memory chip and a DRAM chip are molded together in a lead frame package. FIG. 1 in Document 2 shows a stacked memory in which a flash memory and a DRAM share address input terminals, data I/O terminals, as well as a control terminal connected to the input/output electrodes of the package respectively.

FIG. 1 in Document 3 shows a system comprised of a flash memory used as a main storage, a cache memory, a controller, and a CPU.

FIG. 2 in Document 4 shows a semiconductor memory comprised of a flash memory, a DRAM, and a transfer control circuit.

An examination of cellular telephones, as well as memory modules used for those cellular phones, confirms that, in each of those memory modules, a flash memory and an SRAM are mounted together in one package. Cellular phones are often provided with various functions (related to the distribution of music, games, etc.), and the size of the corresponding application programs, data, and work areas thereof are ever increasing. It is to be expected that cellular phones with larger capacity flash memories and SRAMs will soon be needed. Additionally, the recent enhancement of cellular phone functionalities may also require larger capacity memories.

Presently, a cellular phone uses a flash memory that employs so-called "NOR memory cell arrays." The NOR flash memory employs memory cell arrays that suppress the parasitic resistance. The NOR flash memory lowers the resistance by providing one through-hole to bit line for two cells connected in parallel. This reduces the reading time to about 80 ns, which is almost equal to the reading time of a large capacity, medium access speed SRAM. On the contrary, because one through-hole to bit line must be provided for two cells, the ratio of the through-hole to bit line area to the chip area increases such that the one-bit memory cell area also increases. It has been difficult to give a large capacity to the NOR flash memory. This has been a problem.

Typical large capacity flash memories are roughly classified into two types: AND flash memories that employ the AND memory arrays and NAND flash memories that employ the NAND memory arrays. In each of these flash memories, one through-hole to bit line is formed for 16 to 128 cells, so that the flash memory can form high density memory arrays. Consequently, it is possible to reduce the one-bit area per memory cell more than that of NOR flash memories. A larger capacity can thus be given to those flash memories. On the contrary, the reading time for outputting the first data becomes about 25 μs to 50 μs, so that those flash memories can not easily match the read access speed of an SRAM.

A flash memory can keep data even when the power supply to the cellular phone (or other device) is shut off. However, power is kept supplied to an SRAM so as to hold data therein even when the power to the cellular phone is off. To hold data in an SRAM for an extended period of time, therefore, the data retention current should be minimized. Large capacity SRAMs are confronted with problems in that the data retention current increases in proportion to an increase in the capacity of the memory and the data retention current increases due to an increase in the gate leakage current. This occurs because a tunnel current flows to the substrate from a gate when the oxide insulator of the MOS transistor is thinned in a micro-machining process meant to increase the capacity of the SRAM. As a result, the data retention current increases. It has been noted that it is increasingly difficult to reduce the data retention current in larger capacity SRAMs.

To address the above-mentioned problems, the present invention preferably provides a ROM that has an increased memory capacity and the ability to read and write data quickly, as well as a RAM that has an increased memory capacity and requires reduced data retention current.

SUMMARY OF THE INVENTION

In at least one preferred embodiment, the present invention provides a semiconductor device comprising: a non-volatile memory having a first reading time; a random access memory RAM having a second reading time, which is more than 100 times shorter than the first reading time; a circuit that includes a control circuit that is connected to and controls access to both the non-volatile memory and the random access memory; and a plurality of input/output terminals connected to the circuit.

The control circuit is preferably adapted such that at least part of the data stored in the non-volatile memory (flash memory) is transferred to the DRAM (random access memory) before operation of the device. To write data in the non-volatile memory, the data should be initially written to the RAM and then written to the non-volatile memory from the RAM between access requests from devices located outside the semiconductor device. In addition, the control circuit may be adapted to control such that refreshment of the DRAM is hidden from external when the RAM is a DRAM.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein:

FIG. 11 is an example of the operation of the DRAM executed with a LOAD command issued from external;

FIG. 12 is an example of the operation of the DRAM executed with a STORE command issued from external;

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided hereinbelow with reference to the attached drawings.

Hereunder, the preferred embodiments of the present invention will be described in detail with reference to the accompanying drawings. Although the circuit elements of each block in each of the embodiments are not specifically limited, the elements are assumed to be formed on a semiconductor substrate such as single crystal silicon using known integrated circuit techniques, such as CMOS (complementary MOS transistor) and the like.

First Exemplary Embodiment

Figure 1:
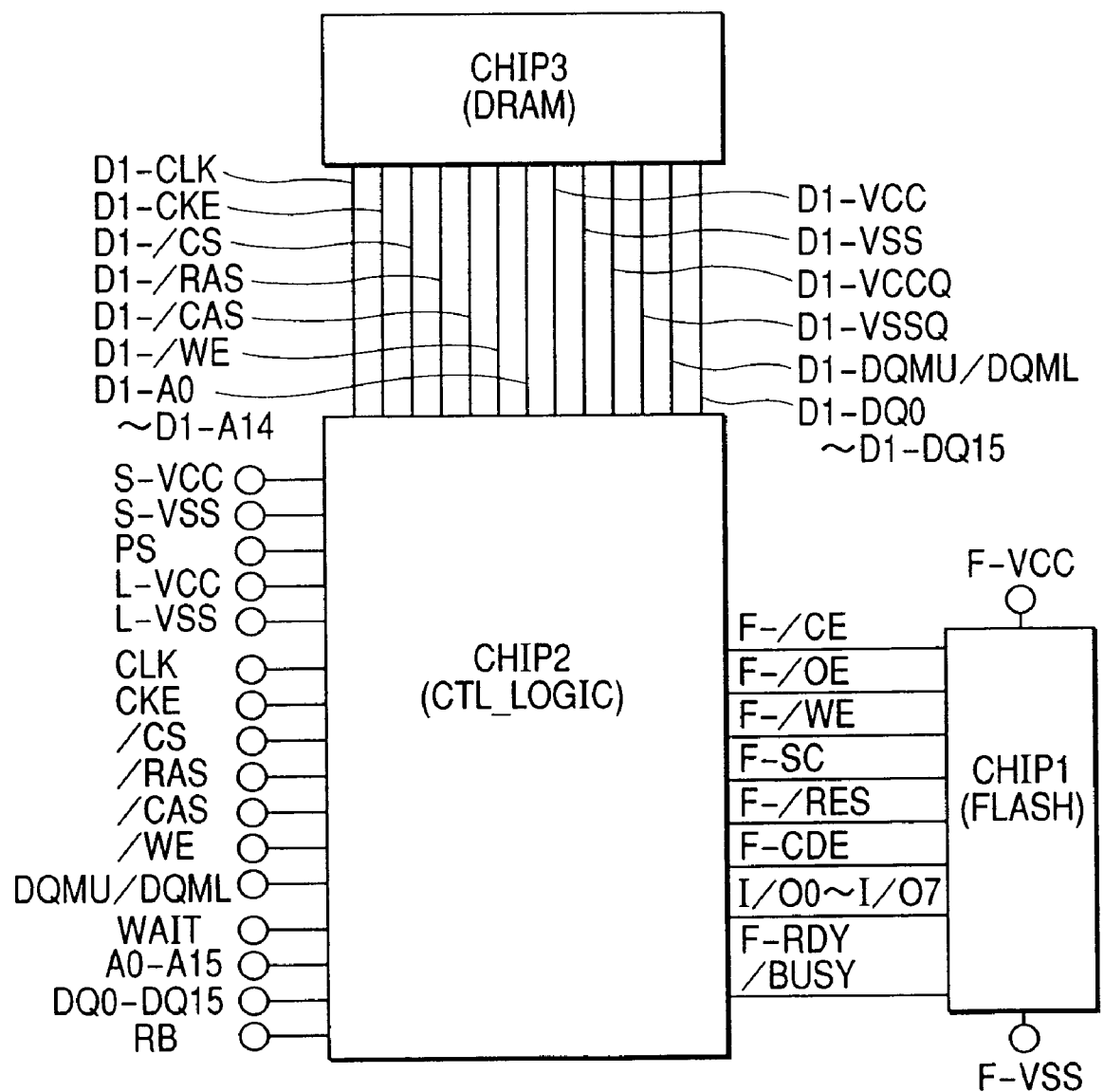
FIG. 1 is a block diagram of a memory module of the present invention.

FIG. 1 shows a first embodiment of a memory module, which is an example of the semiconductor device of the present invention. This memory module is preferably comprised of three chips. Each of those three chips is now described.

The chip 1 (FLASH) is a non-volatile memory. This non-volatile memory may be a ROM (Read Only Memory), an EEPROM (Electrically Erasable and Programmable ROM), a flash memory, or any similar storage element. A typical example of the non-volatile memory used as chip 1 in this embodiment is a NAND flash memory (to be described below) in the broad sense. The NAND flash memory may have a memory capacity of about 256 Mb and a reading time (time required between a read request and data output) of about 25 μs to 50 μs, which is comparatively slow. On the contrary, the SDRAM used as chip 3 has a large memory capacity of about 256 Mb and a reading time of about 35 ns. Specifically, the reading time of chip 3 is preferably more than 100 times shorter than that of the chip 1. This provides an excellent contrast with the NOR flash memory whose reading time is about 80 ns, which is on the same order of magnitude of the reading time of the DRAM. The present invention provides a solution to efficient accesses to memories, like these, with reading times that differ significantly from each other.

The DRAM is preferably divided into various kinds such as EDO, SDRAM, DDR-SDRAM, and similar types according to differences in the internal configuration and the interface type among them. Although any DRAM may be used as this memory module, this exemplary embodiment employs the SDRAM, which is a typical DRAM synchronized with a clock. Chip 2 (CTL_LOGIC) is provided with a control circuit for controlling chips 1 and 3.

The present memory module receives addresses (A0 to A15), a clock signal (CLK), and command signals (CKE, /CS, /RAS, /CAS, /WE, DQMU/DQML) input from external. It should be noted here that the terms "external" and "from external" refer to devices/operations outside of the memory module of the present invention. The memory module is powered via S-VCC, S-VSS, L-VCC, L-VSS, F-VCC, F-VSS, D1-VCC, and D1-VSS. The memory module uses DQ0 to DQ15 for data input/output. The memory module uses a so-called SDRAM interface for operations.

Chip 2 supplies signals required to operate chips 1 and 3. Chip 2 supplies a serial clock (F-SC), addresses (A0 to A15), flash data (I/O0 to I/O7), and commands (F-CE, F-/OE, F-/WE, F-SC, F-/RES, F-CDE, F-RDY/BUSY) to chip 1. In addition, chip 2 supplies a clock (D1-CLK), addresses (D1-A0 to D1-A14), commands (D1-CKE, D1-/CS, D1-/RAS, D1-/CAS, D1-/WE, D1-DQMU/DQML), and DRAM data (D1-DQ0 to D1-DQ15) to chip 3.

Hereunder, each command signal will be described briefly. The signals input to chip 2 are as follows: the CLK is a clock signal; the CKE is a clock enable signal; the /CE is a chip select signal; the /RAS is a row address strobe signal; the /CAS is a column address strobe signal; the /WE is a write enable signal; and the DQMU/DQML is an I/O data mask signal. The signals input to chip 3 are as follows: the D1-CLK is a clock signal; the D1-CKE is a clock enable signal; the D1-/CS is a chip select signal; the D1-/RAS is a row address strobe signal; the D1-/CAS is a column address strobe signal; the D1-/WE is a write enable signal; and the D1-DQMU/DQML is an I/O data mask signal. The signals input to chip 1 are as follows: the F-/CE is a chip enable signal; the F-/OE is an output enable signal; the F-/WE is a write enable signal; the F-SC is a serial clock signal; the F-/RES is a reset signal; the F-CDE is a command data enable signal; the F-RDY/BUSY is ready/busy signal; and the I/O0 to I/O7 are I/O signals used to input addresses, as well as input/output data.

The control circuit (CTL_LOGIC) of chip 2 selects a command register provided in the control circuit (CTL_LOGIC) of chip 2, the DRAM of chip 3, or the FLASH of chip 1 according to an address value received from external. Accesses from external can be distinguished among access to the command register, access to the DRAM, and access to the FLASH according to a value preset in the control register provided in the control circuit (CTL_LOGIC). An SDRAM interface is preferably used to receive each of these accesses.

The DRAM is divided into a work area and a FLASH data copy area. The work area is used as a work memory in which programs are executed, and the FLASH data copy area is used as a memory for enabling FLASH data to be copied therein.

The command register in the control circuit (CTL_LOGIC) is accessed to write a LOAD instruction code and a STORE instruction code, thereby copying (loading) FLASH data into the FLASH data copy area and writing back (storing) data into the FLASH from the FLASH data copy area of the DRAM.

In a case in which an address for accessing the command register is input via address signal lines (A0 to A15), a WRITE command is input via a command signal line (CKE, /CS, /RAS, /CAS, /WE, DQMU/DQML), and a LOAD instruction code followed by the start and end addresses of an address range for selecting the FLASH are input to the command register via the I/O data signal lines (D1-DQ0 to D1-DQ15). The LOAD instruction code, as well as the start and end addresses with respect to the loading are written to the command register. After this process, the target data is read from the address range between the start and end addresses in the flash memory and is then transferred to the FLASH data copy area of the DRAM. Consequently, the FLASH data is held in the DRAM.

When a STORE instruction code, as well as start and end addresses for selecting the FLASH are written in the command register, the target data is written in the address range between the start and end addresses from the FLASH data copy area of the DRAM.

A value may be preset in the control register provided in the control circuit (CTL_LOGIC) to determine address correspondence between an address range in the FLASH and an address range in the FLASH data copy area of the DRAM.

The reliability of the FLASH is degraded when rewriting therein is repeated, whereby written data is read incorrectly and rewriting is sometimes disabled. When the control circuit (CTL_LOGIC) reads data from the FLASH, chip 2 (CTL_LOGIC) preferably checks whether or not read data contains an error, corrects the error if any, and transfers the corrected data to the DRAM.

When the control circuit (CTL_LOGIC) writes data to the FLASH, chip 2 (CTL_LOGIC) checks whether or not the writing is performed successfully. When chip 2 detects an error (not successful in an address), chip 2 writes the data to another address. This checking operation is so-called "replacement processing." Chip 2 also manages such a fail address and the replacement processing executed for the fail address.

When accessing the FLASH data copy area of the DRAM, addresses for selecting the FLASH and a READ command are input via address signal lines (A0 to A15) and a command signal line (CKE, /CS, /RAS, /CAS, /WE, DQMU/DQML). The control circuit of chip 2 then accesses the DRAM to read the target data from the address range in the FLASH data copy area of the corresponding DRAM. Consequently, data may be read from the FLASH data copy area of the DRAM at the same speed as that of the DRAM.

To access the work area in the DRAM, address and command signals required for the access are input to the command register. The control circuit (CTL_LOGIC) then generates an address for the work area in the DRAM and accesses the DRAM. For a read access, the data read from the DRAM is output to the data I/O lines (DQ0 to DQ15) via the DRAM data I/O lines (D1-DQ0 to D1-DQ15). For a write access, write data is input via data I/O lines (DQ0 to DQ15) of the memory module, then input to the DRAM via DRAM data I/O lines (D1-DQ0 to D1-DQ15).

As described above, the memory module of the present invention that uses the SDRAM interface makes it possible to read data from the FLASH almost at the same speed as that of the DRAM because the module includes an area enabled to copy part or all of the data from the FLASH and transfer the data into the DRAM before operation of the module. Data may also be written to the FLASH at the same speed as that of the DRAM because the data is initially written to the DRAM and thereafter written back to the FLASH as needed. To read data from the FLASH in the memory module, the processing can be sped up and the reliability can be assured because errors are detected and corrected and replacement processing is undertaken for each fail address in which data is not correctly written. Additionally, because a large capacity DRAM is preferably used for the memory module, a FLASH data copy area as well as a large capacity work area may be secured in the DRAM, allowing the memory module to cope with the enhanced functions of any cellular telephone.

Figure 2:
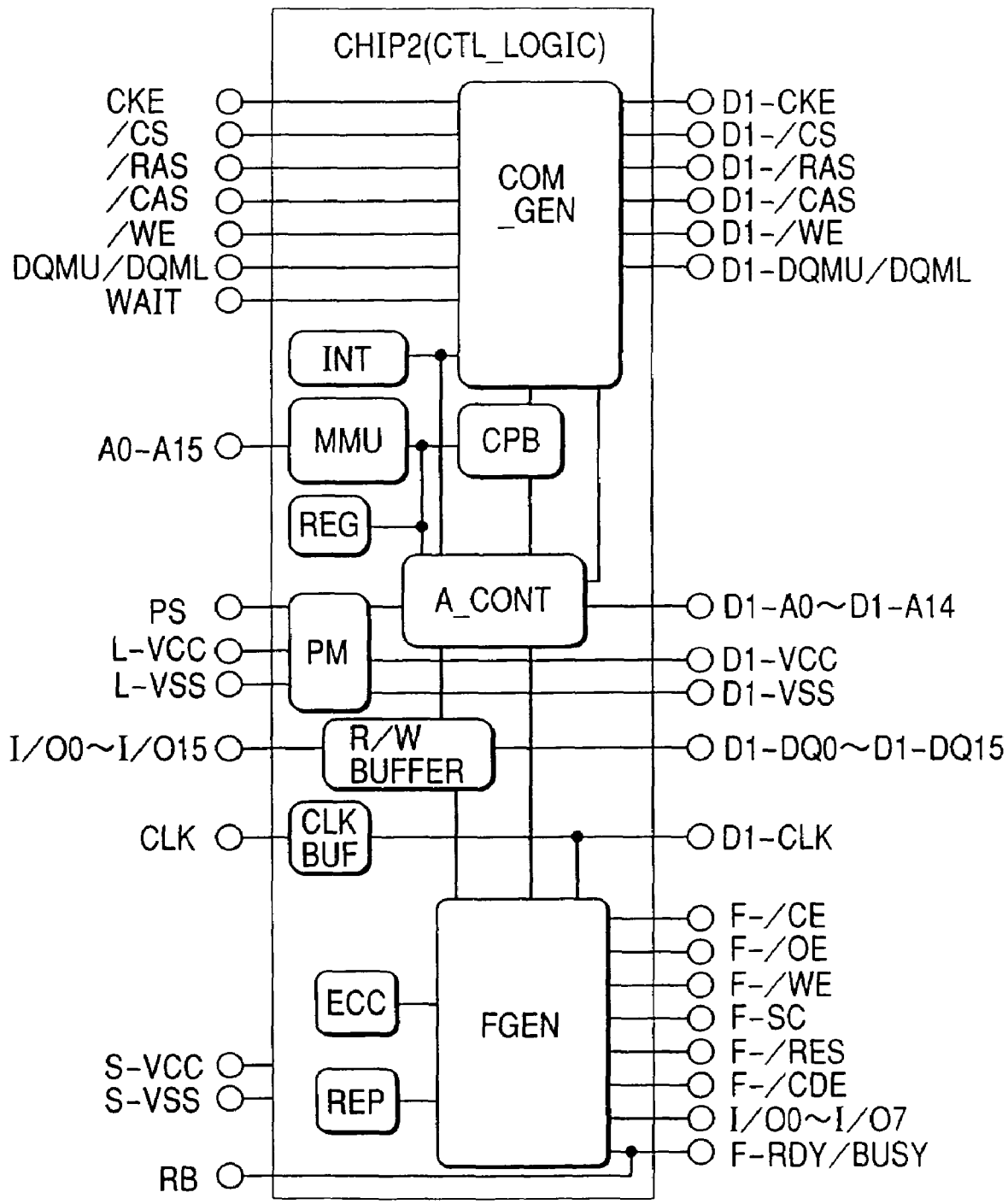
FIG. 2 is a block diagram of the chip 2 shown in FIG. 1.

FIG. 2 shows a block diagram of chip 2 (CTL_LOGIC). Chip 2 (CTL_LOGIC) is a control circuit that receives signals from external via an SDRAM interface to control both chip 3 (DRAM) and chip 1 (FLASH). The operation of each circuit block of chip 2 (CTL_LOGIC) will now be described.

The initialization circuit INT initializes the control register in a memory management unit MMU and the DRAM when the DRAM is powered. The memory management unit MMU translates addresses input from external according to a value preset in a built-in control register to select a target to access, that is, a command register REG, a DRAM work area, a FLASH data copy area, or the FLASH. The value in the control register is initialized by the initialization circuit INT when the DRAM is powered. Afterwords, the value may be updated when an MMU CHANGE command is input to the command register REG. When data is written in an address of the FLASH data copy area of the DRAM, a data renewing address management circuit CPB holds the address information. The command register REG holds LOAD, STORE, MMU CHANGE and other instruction codes, as well as the start and end addresses for loading, storing, and other functions.

A data buffer R/W BUFFER holds data read/written from/to the DRAM, as well as data temporarily read/written from/to the FLASH. A clock buffer CLKBUF supplies a clock signal to both the DRAM and the FLASH control circuit FGEN. A command generator COM_GEN generates commands required for accesses to the DRAM. An access controller A_CONT generates addresses for controlling all of chip 2 and accessing the DRAM. A power module PM supplies power to the DRAM and controls the power supply. A FLASH control signal generator FGEN controls reading/writing data from/to the FLASH.

An error correction circuit ECC checks whether or not the data read from the FLASH contains any error and corrects the error when detected. A replacement processing circuit REP checks whether or not writing to the FLASH is done correctly. When writing to an address fails, the REP writes the data to another address previously prepared in the FLASH (i.e., address replacement processing).

The operation of the above-described memory module will now be described. The initialization circuit INT initializes the control register located in the memory management unit MMU and the DRAM when the DRAM is powered. In the case where the command register REG is selected and a LOAD command is written in the command register REG, data transfer from the FLASH to the DRAM begins. At first, the FLASH control signal generator FGEN reads target data from the FLASH. When no error is detected in the data read from the FLASH, the data is transferred directly to the data buffer R/W BUFFER. When an error is detected in the data, the error correction circuit ECC corrects the error and transfers the corrected data to the data buffer R/W BUFFER. After this, the DRAM receives a WRITE command from the command generator COM_GEN, address signals from the access controller A_CONT, and data read from the FLASH from the data buffer R/W BUFFER. The data is then written to the FLASH data copy area of the DRAM.

When data is written to the FLASH data copy area of the DRAM, the data renewing management circuit CPB holds the write address information. When the command register REG is selected and a STORE command is written to the command register REG, data transfer from the FLASH data copy area of the DRAM to the FLASH begins.

Initially, the DRAM receives a READ command from the command generator COM_GEN and address signals from the access controller A_CONT whereby the target data is read from the DRAM. The data read from the DRAM is transferred to the FLASH controller FGEN via the data buffer R/W BUFFER, then the FLASH control signal generator FGEN writes the data in the FLASH.

The address replacement processing circuit REP checks whether or not writing is done successfully and terminates the processing when the writing is done successfully. When the writing in an address fails, data is written in another address prepared beforehand in the FLASH (address replacement processing). When such a replacement processing is done, the circuit REP holds and manages the address information that denotes such a fail address in which the replacement processing is done. The data renewing management circuit CPB clears the information of each FLASH address in which writing is ended sequentially from DRAM address information held therein. In this way, the data renewing management circuit CPB can manage the latest one of the addresses in which data is updated.

When the DRAM work area and the FLASH data copy area are selected and a READ command is received by the memory module, the DRAM receives the READ command signal from the command generator COM_GEN and address signals from the access controller A_CONT whereby the target data is read from the DRAM. When the DRAM work area and the FLASH data copy area are selected and a WRITE command is received by the memory module, the DRAM receives the WRITE command signal from the command generator COM_GEN, address signals from the address generator A_CONT, and data from the data buffer R/W BUFFER whereby the target data is written in the DRAM.

The data renewing management circuit CPB, when receiving a DRAM POWER-OFF command via the signal PS line, transfers the DRAM data corresponding to the address held therein to the FLASH. Initially, the DRAM receives a READ command and address signals from the command generator COM_GEN and the access controller A_CONT, respectively, whereby target data is read from the DRAM. The data read from the DRAM is transferred to the FLASH controller FGEN via the data buffer R/W BUFFER and is then written in the FLASH by the FLASH control signal generator FGEN.

The data renewing management circuit CPB then clears information of each FLASH address in which data is already written sequentially from the DRAM address information held therein. When all the data items are written to the FLASH corresponding to the held addresses, the address information in the data renewing management circuit CPB is all cleared. After all the data items are transferred from the DRAM to the FLASH, the power to the DRAM is shut off. This power shut-off reduces the power consumption of the DRAM.

To restart the DRAM after the power supply to the DRAM is shut off, the DRAM must be powered again with a POWER-ON command input from the PS signal line and then initialized by the access controller (A_CONT) in a predetermined initialization procedure as instructed by the initialization circuit INT.

Figure 3:
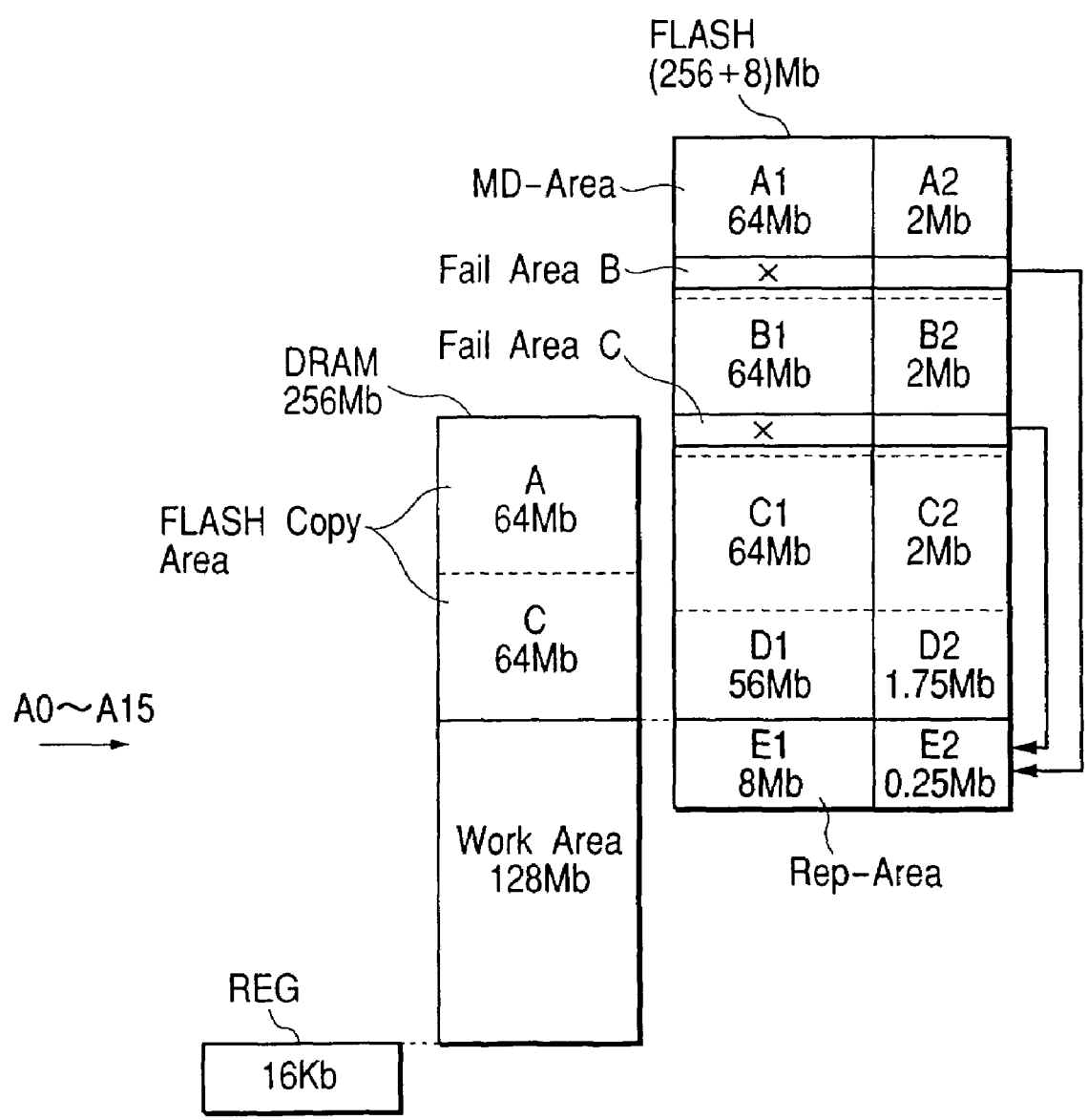
FIG. 3 is an example of address maps of the memory module of the present invention.
Figure 4:
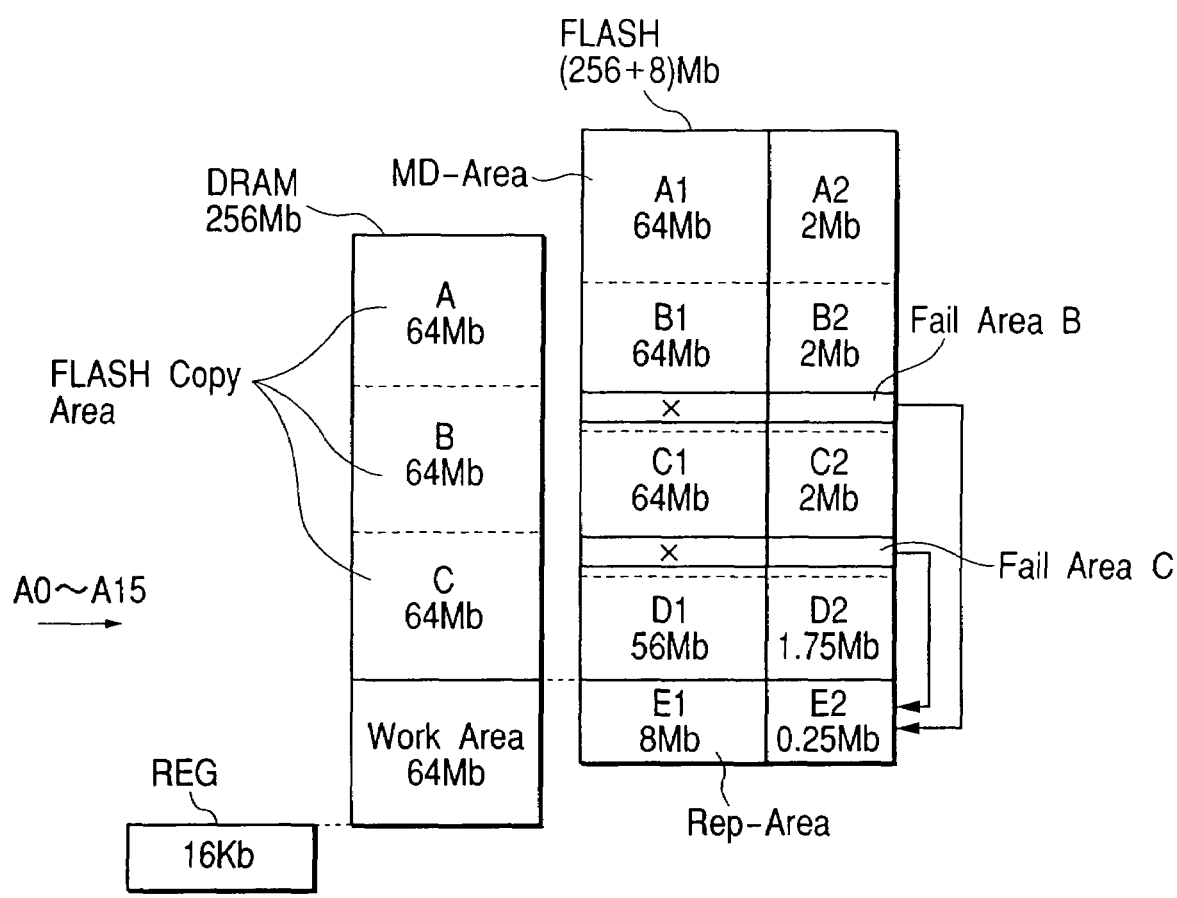
FIG. 4 is an example of the address maps of the memory module of the present invention.

FIGS. 3 and 4 show memory maps in which addresses are translated by the memory management unit MMU. The user may select any of the memory maps according to a value set in the control register in the MMU. Although not specifically limited, in this embodiment, the memory maps are assumed to be formed for a memory module in which the non-volatile memory includes a recording area of 256+8 Mb and the DRAM includes a recording area of 256 Mb. The capacity of the command register REG is 16 kb.

In the maps shown in FIG. 3, the row addresses (A0 to A15) and the column addresses (A0 to A9) input via the address signal lines A0 to A15 are translated by the memory management unit MMU to those used in the command register REG (8 kb), the DRAM work area (128M bits), the DRAM FLASH copy area (128M bits), and the FLASH (256M bits+8 Mb). Although not specifically limited, the command register REG, the DRAM, and the FLASH are mapped at the bottom of each memory map address space. The command register REG in the chip 2 (CTL_LOGIC) receives instruction codes such as LOAD, STORE, MMU CHANGE, POWER-OFF, etc., as well as the start and end addresses for loading, storing, etc. written therein from external.

The DRAM is shown divided into a work area (128M bits) and a FLASH data copy area (128M bits). The work area is used as a work memory in which programs are executed. The FLASH data copy area is used to copy and hold part of the data stored in the FLASH area. When part of the data is to be copied from the FLASH to the FLASH data copy area, the memory management unit MMU determines the address correspondence between an address range in the FLASH and an address range in the FLASH data copy area according to a value preset in the control register located in the MMU. FIG. 3 shows an example of such address correspondence denoting that the data in the A1 area (64 Mb) and the C1 area (64 Mb) in the FLASH area can be copied into the A area (64 Mb) and the C area (64 Mb) in the FLASH copy area of the DRAM. It is also possible to change the address correspondence so that the data in the B1 area (64 Mb) and the D1 area (64 Mb) in the FLASH can be copied into the FLASH copy area of the DRAM by changing the value preset in the internal control register located in the memory management unit MMU. The value in the MMU control register can be changed from external by writing an MMU CHANGE command and a new register value into the command register.

Although not specifically limited, the FLASH (256 Mb+8 Mb) is shown divided into a main data area MD-Area (A1, A2, B1, B2, C1, C2, D1, D2: 255.75 Mb) and a replacement area Rep-Area (E1, E2: 8.25 Mb). The main data area MD-Area is shown further divided into a data area (A1, B1, C1, D1) and a redundant area (A2, B2, C2, D2). The data area is used to store programs and data, and the redundant area is used to store ECC parity data and other data required to detect and correct errors. Data in the FLASH data area is transferred to the FLASH copy area of the DRAM, or data in the FLASH copy area of the DRAM is transferred to the FLASH data area.

The reliability of the FLASH is degraded when rewriting is repeated therein, whereby data incorrect may be written and rewriting may be disabled. The replacement area is meant to replace a fail area (fail area B, fail area C) with another area for writing the data therein. The size of the replacement area is not specifically limited, but it should be determined so as to assure the reliability of the FLASH.

Data is transferred from the FLASH to the DRAM as follows. To transfer data from the FLASH area A1 to the FLASH copy area A located in the DRAM, a LOAD command as well as start and end addresses SAD and EAD for the A1 area in the FLASH are written to the command register. Thereafter, the control circuit (CTL_LOGIC) reads the data from the address range specified by the start and end addresses FSAD and FEAD of the FLASH area A1 and then transfers the data to the address range specified by the DSAD and DEAD of the FLASH copy area A in the DRAM. The memory management unit MMU preferably determines the correspondence between the address ranges (FSAD→DSAD and FEAD→.DEAD).

For error correction, when reading data from the FLASH, the control circuit reads the data from the FLASH data area A1 and the ECC parity data from the redundant area A2, respectively. When an error is detected in the read data, the error correction circuit ECC corrects the error and then transfers only the corrected data to the DRAM.

Data is transferred from the DRAM to the FLASH as follows. To transfer data from the FLASH copy area A to the FLASH area A1, a STORE command as well as start and end addresses SAD and EAD for the FLASH area A1 are written to the command register. The control circuit (CTL_LOGIC) then reads the target data from the address range specified by the start and end addresses DSAD and DEAD of the FLASH copy area A located in the DRAM and then writes the data in the address range specified by the FSAD and FEAD of the FLASH area A1. The memory management unit MMU preferably determines the correspondence between the address ranges (DSAD→FSAD and DEAD→FEAD).

For error correction, when writing data to the FLASH, the error correction circuit ECC generates ECC parity data. The data read from the DRAM by the FLASH control circuit FGEN is written to the FLASH data area A1, and the generated ECC parity data is written to the redundant area A2. The address replacement processing circuit REP checks whether or not the writing is performed successfully. If the write is successful, the circuit REP terminates the processing. If the write fails, the circuit REP selects another address in the FLASH replacement area and writes the data to the replacement data area E1 and the generated ECC parity data to the redundant area E2, respectively.

A description will now be made of a process for reading data from the FLASH copy area A located in the DRAM. When an address FAD0 of the FLASH A1 area and a READ command are input to the command register from external, the MMU translates the address FAD0 to an address DAD0 of the FLASH copy area A in the corresponding DRAM. Consequently, the DRAM is selected, and FLASH data copied to the DRAM can be read therefrom. In other words, data in the FLASH can be read at the same speed as that of the DRAM.

Data is read from the work area located in the DRAM as follows. When an address WAD0 of the work area and a READ command are input to the command register from external, the MMU outputs the address WAD0 to the access controller A_CONT. Consequently, data can be read from the address WAD0 of the work area in the DRAM.

Data is written to the FLASH copy area A in the DRAM as follows. When an address FAD0 of the FLASH area A1, a WRITE command, and write data are input to the command register from external, the MMU translates the address FAD0 to an address DAD0 of the FLASH copy area A in the corresponding DRAM. Consequently, the DRAM is selected, and data is written in the FLASH copy area A in the DRAM. When data is written in the FLASH copy area A in the DRAM corresponding to the FLASH data area A1 in this way, FLASH data can be written at the same speed as that of the SRAM.

Data is written to the DRAM work area as follows. When an address WAD0 of the work area, a WRITE command, and input data are input to the command register from external, the access controller A_CONT outputs the address WAD0 to the DRAM. Consequently, data is written in the address WAD0 in the DRAM work area.

FIG. 4 shows memory maps when the FLASH data copy area is reserved over 192 Mb in the DRAM. The copy area is therefore larger than that shown in FIG. 3. In the maps shown in FIG. 4, the memory management unit MMU translates row addresses (A0 to A15) and column addresses (A0 to A9) input via the address signal lines A0 to A15 to addresses used in the register area, the DRAM work area (64 Mb), the FLASH data copy area in the DRAM (192 Mb), and the FLASH (256 Mb).

The user may freely select any of the memory maps in the user's system by changing the preset value in the control register located in the MMU. The preset value in the control register in the MMU may be changed from external by writing an MMU CHANGE instruction code and a new register value in the command register.

Figure 5:
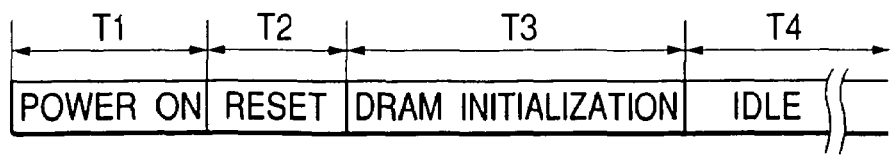
FIG. 5 is an example of the operation of the memory module of the present invention, executed when the module is powered.

FIG. 5 shows initialization of the control circuit (CTL_LOGIC) when power is supplied. When the DRAM is powered in a time period T1, the control circuit (CTL_LOGIC) is initialized in reset period T2. The value in the control register provided in the memory management unit MMU is also initialized in period T2. In period T3, the initialization circuit INT initializes both the DRAM and the FLASH. When the initialization ends, the memory module goes into the idle state T4 and prepares to accept accesses from external.

Figure 6:
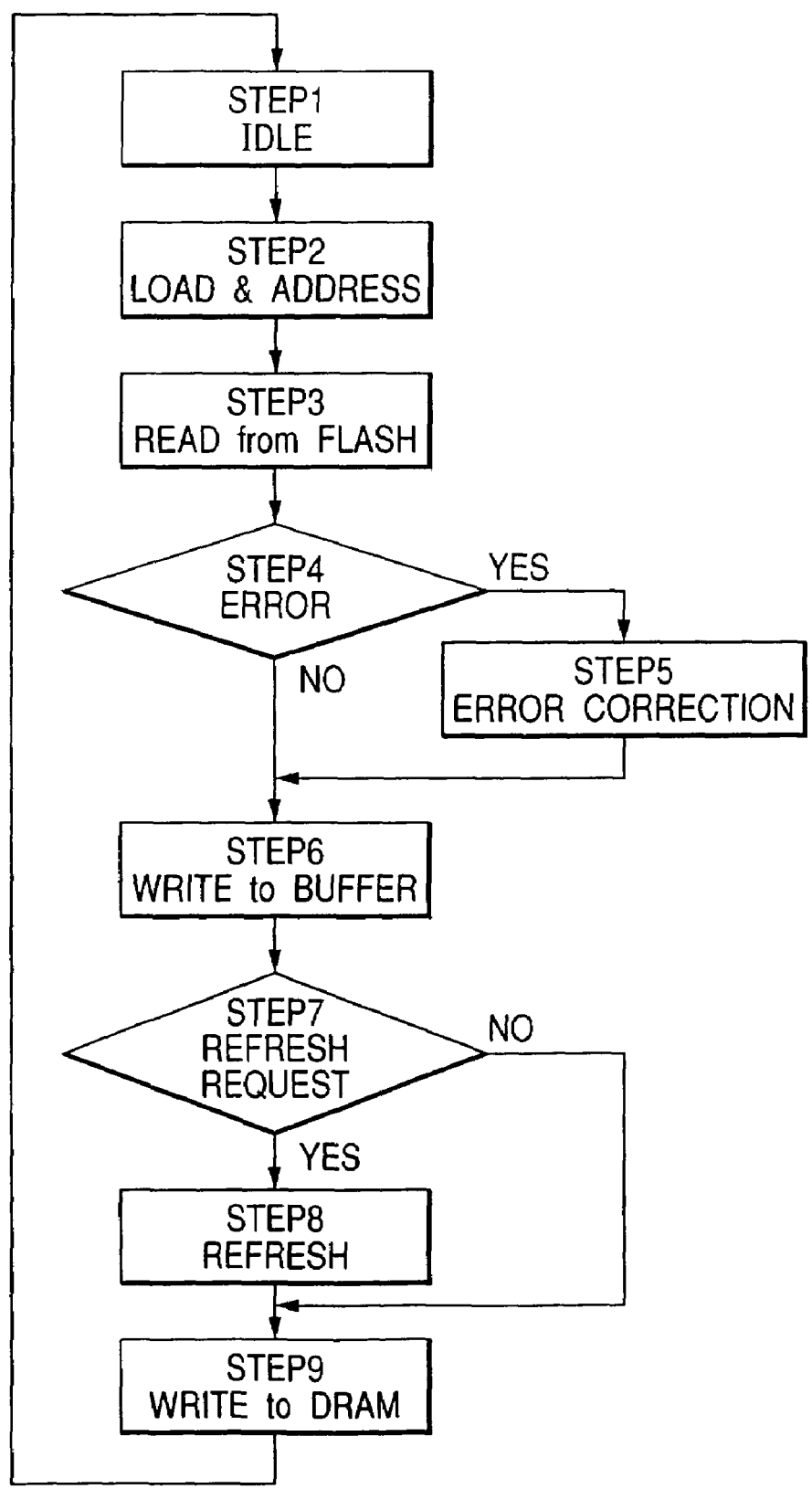
FIG. 6 is a flowchart of data transfer from a FLASH to a DRAM in the memory module of the present invention.

FIG. 6 shows a flowchart of data transfer from the FLASH to the DRAM. When a LOAD command and addresses for selecting the FLASH are input (step 2) while the memory module waits for a command from external in the idle state (step 1), the memory module reads the data corresponding to the input FLASH address range and the ECC parity data (step 3). An error check is then performed for the read data (step 4). If an error is detected in the data, the error is corrected (step 5), and the corrected data is written to the buffer (step 6). If no error is detected, the data is written directly to the buffer R/W BUFFER (step 6). When data is transferred from the buffer R/W BUFFER to the DRAM, a check is made to determine whether or not a refresh request is issued to the DRAM (step 7). If a refresh request is issued, a refresh processing is done (step 8) and data is written to the DRAM (step 9). If no refresh request is issued, data is written to the DRAM immediately (step 9).

Figure 7:
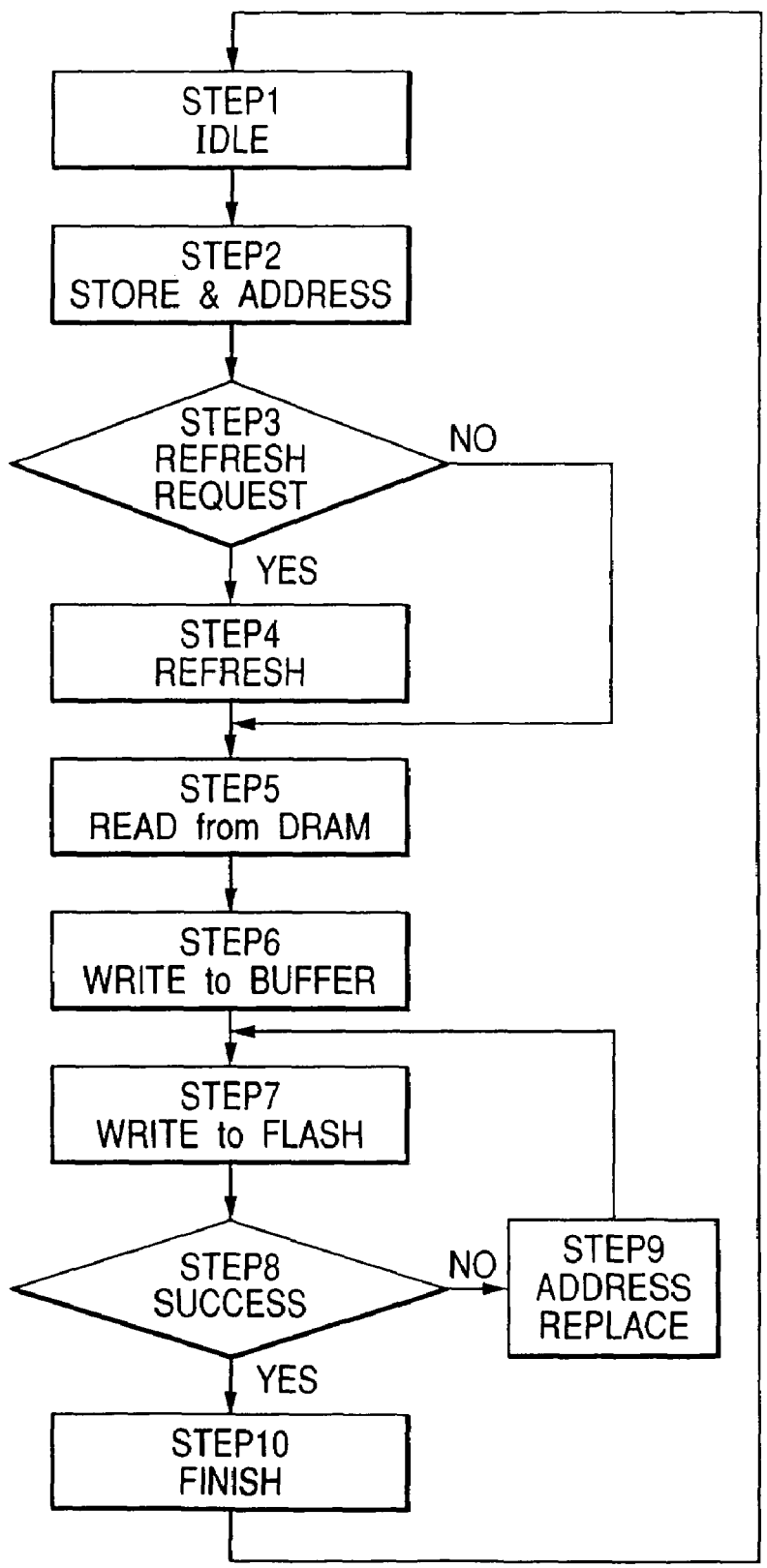
FIG. 7 is a flowchart of data transfer from the DRAM to the FLASH in the memory module of the present invention.

FIG. 7 shows a flowchart of data transfer from the DRAM to the FLASH. When a STORE command and addresses for selecting the FLASH are input (step 2) while the memory module waits for a command from external in the idle state (step 1), the memory module begins reading the target data from the address range of the DRAM. At this time, the memory module checks whether or not a refresh request is issued to the DRAM (step 3). If a refresh request is issued, the memory module refreshes the DRAM (step 4) and then reads data from the DRAM (step 5). If no refresh request is issued, the memory module reads the target data from the DRAM immediately (step 5). The read data is transferred to the buffer R/W BUFFER (step 6) and is then written into the FLASH (step 7). To write data in the FLASH (step 7), the memory module writes the data read from the DRAM and the ECC parity data generated by the error correction circuit ECC into the FLASH, respectively. The memory module then checks whether or not the writing in the FLASH is successful (step 8). If the write is successful, the processing is terminated (step 10). If the write fails, the memory module selects another address (step 9) and then writes the data in the address (step 7). Thereafter, the memory module rechecks whether or not the writing is successful (step 11). When successful, the processing is terminated (step 10).

Figure 8A:
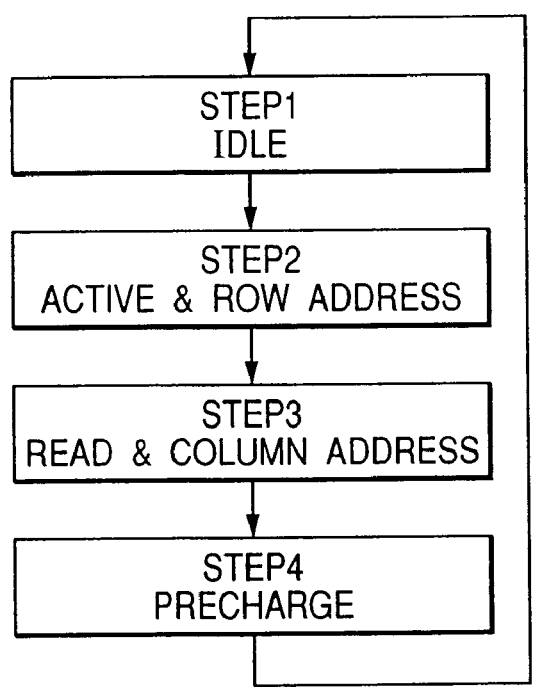
FIGS. 8A and 8B are flowcharts of reading/writing from/ to the DRAM in the memory module of the present invention.
Figure 8B:
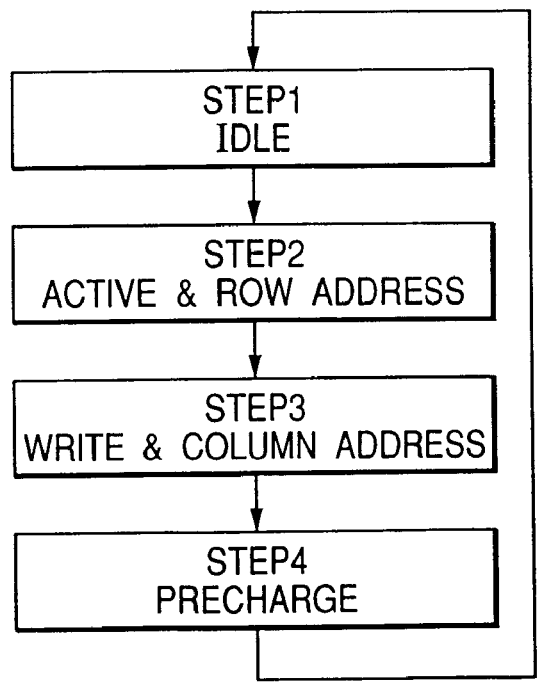

FIG. 8A shows a flowchart of commands issued from external for reading data from a DRAM provided in the memory module. FIG. 8B shows a flowchart of commands issued from external for writing data into the DRAM provided in the memory module. Commands are preferably input from external via the SDRAM interface respectively.

The flowchart shown in FIG. 8A will now be described. The memory module waits for a command from external in the idle state (step 1). When an ACTIVE command and a row address (step 2), and then a READ command and a column address are received from external (step 3), the memory module reads the data from the DRAM memory cells selected by the input row and column addresses and outputs the data to external via the I/O data signal lines (DQ0 to DQ15). Receiving a PRECHARGE command (step 4), the memory module goes into the idle state.

The flowchart shown in FIG. 8B will now be described. At first, the memory module waits for a command from external in the idle state (step 1). When an ACTIVE command and a row address (step 2), and then a WRITE command and a column address are received from external (step 3), the memory module writes the data input via the I/O data signal lines (DQ0 to DQ15) in the DRAM memory cells selected by the input row and column addresses. Receiving a PRECHARGE command (step 4), the memory module goes into the idle state.

Figure 9:
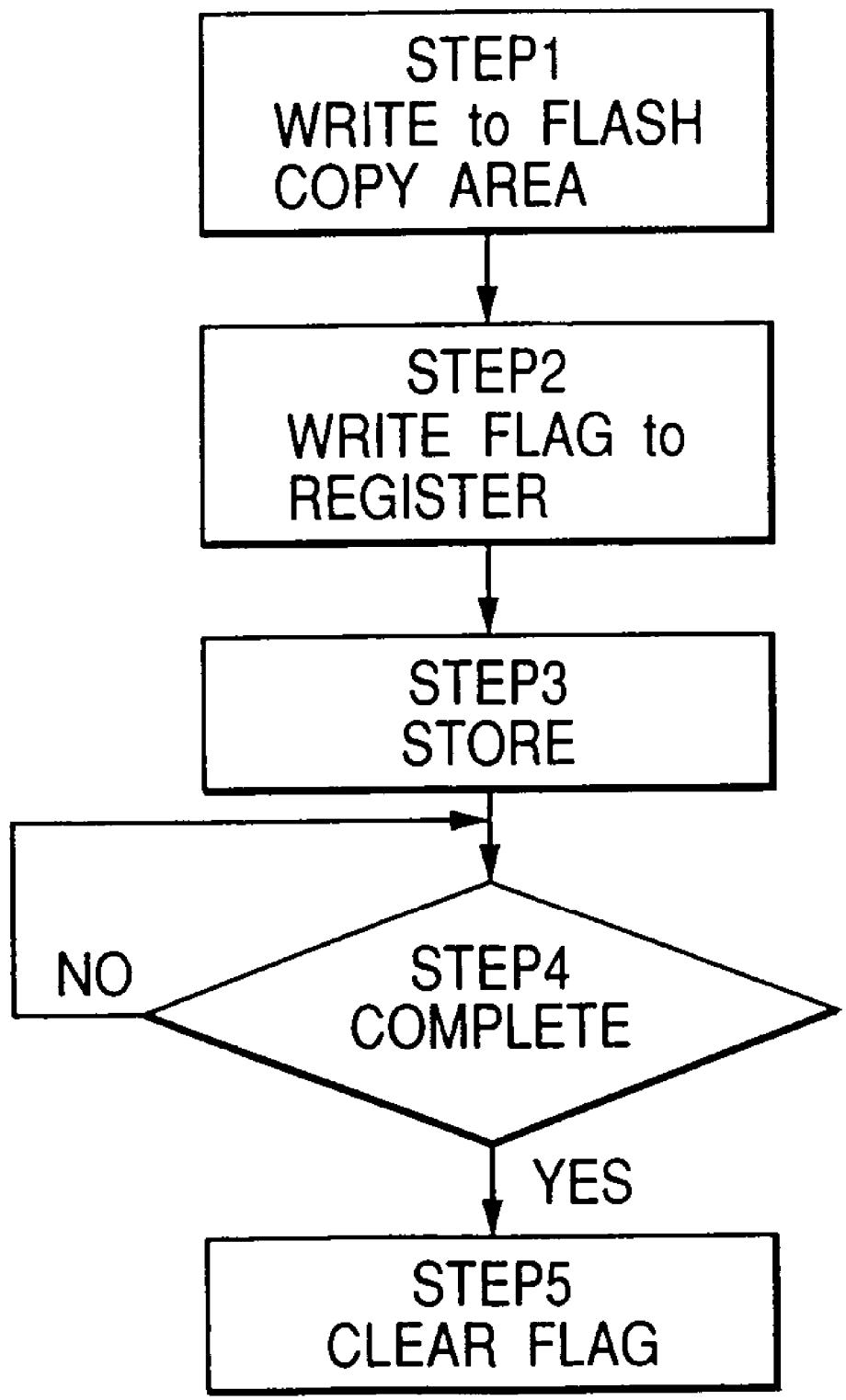
FIG. 9 is an example of the operation of a data renewing management circuit CPB shown in FIG. 2.

FIG. 9 shows a flowchart of address holding and address clearing by the data renewing management circuit CPB. When data is written to the FLASH copy area in the DRAM in response to a WRITE command received from external (step 1), a flag signal corresponding to the write address is written to a flag register provided in the data renewing management circuit CPB (step 2). When a STORE command and addresses are input from external, data transfer from the FLASH data copy area in the DRAM to the FLASH begins (step 3). Then, the memory module repeatedly checks whether or not the transfer is completed (step 4). When the check result is "YES" (completed), the CPB clears the flag in the transfer complete address in the flag register.

Figure 10:
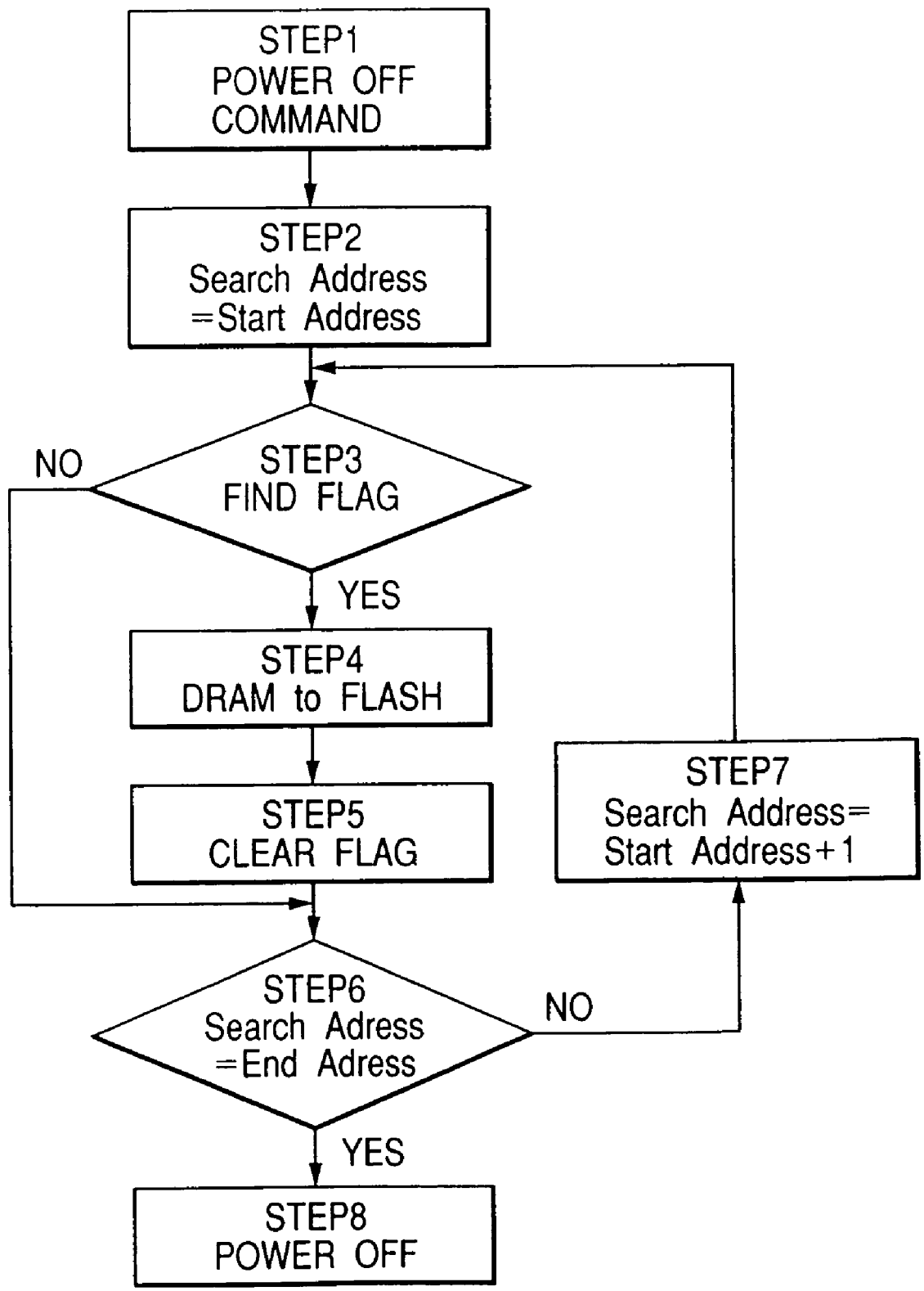
FIG. 10 is a flowchart of the operation of the memory module of the present invention, executed when the power supply to the module is shut off.

FIG. 10 shows a flowchart of the operation of the memory module when a DRAM POWER-OFF command is input thereto. When a POWER-OFF command is input to the command register, all the data in the FLASH data copy area of the DRAM, which is not written back in the FLASH, is transferred to the FLASH.

When a POWER-OFF command is input to the command register (step 1), the memory module initially sets a search address as a start address for searching the data that has not yet written back to the FLASH from the data written in the FLASH data copy area of the DRAM (step 2). Upon finding a flag written to the flag register provided in the data renewing management circuit CPB corresponding to the search address (step 3), the memory module transfers the DRAM data corresponding to the search address to the FLASH (step 4). Completing the transfer, the memory module clears this flag (step 5). The memory module then checks whether or not the current search address is the final one (step 6). If the current address is not the final address, the memory module increments the current search address (adds one) to set the next search address (step 7) and then repeats the processings in steps 3 to 6. When the current address is the final address, the memory module completes the processing and shuts off the power supply to the DRAM (step 8).

FIG. 11 shows how the DRAM (e.g., SRAM) operates in the module when data is transferred from the FLASH to the DRAM in response to a LOAD command input to the command register. An ACTIVE command A and a row address R, as well as a WRITE command W and a column address C are input from external via the SDRAM interface of the memory module, and a LOAD instruction code Ld is input from external via the I/O signal lines IO0 to IO15 (note: the external I/O signal lines IO0 to IO15 are shown in FIG. 1 as I/O signal lines DQ0-DQ15). Thereafter, both start and end addresses Sa and Ea of the data in the FLASH to be copied into the DRAM are input via the I/O signal line IO0 to IO15. The command register is selected according to the row and column addresses R and C, and the LOAD instruction code Ld, as well as the start and end addresses Sa and Ea are then written in the command register.

The control circuit then reads the data between the start and end addresses Sa and Ea from the FLASH and holds the data in the buffer. The control circuit then writes the data in the DRAM1.

The DRAM1 addresses in which data is to be written are translated by the memory management unit MMU so that the start address Sa is translated into a row address R0 and a column address C0, and the end address Ea is translated into a row address R0 and a column address CF for the FLASH copy area of the DRAM respectively.

Writing data into the DRAM1 is accomplished as follows. Initially, an ACTIVE command A is input via the D1-COM line and a row address R0 is input via the D1-A0 to D1-A15 lines, and then a WRITE command W is input via the D1-COM line and a column address C0 is input via the D1-A0 to D1-A15 lines. Thereafter, data is input via the I/O signal lines D1-DQ0 to D1-DQ15. The writing of both column address and data is continued up to the final address CF. The writing is terminated by a PRECHARGE command P. A high WAIT signal is output between the start and end of the data writing in the DRAM to denote that data is being transferred to the DRAM.

FIG. 12 shows the operation of the DRAM in the memory module while data is transferred from the DRAM to the FLASH in response to a STORE command input to the command register. An ACTIVE command A and a row address R, as well as a WRITE command W and a column address C are input from external via the SDRAM interface of the memory module. Thereafter, a STORE instruction code St is input via the I/O signal lines IO0 to IO15. Then, both start and end addresses Sa and Ea of the FLASH data to be copied back to the FLASH from DRAM are input via the I/O signal lines IO0 to IO15. The command register is selected according to the row and column addresses R and C, and the STORE instruction code St, and the start and end addresses Sa and Ea are written to the command register.

The control circuit reads the data from the address range between the start and end addresses Sa and Ea in the DRAM, and then writes the data in the FLASH. The addresses for reading data from the DRAM1 are translated by the memory management unit MMU so that the start address Sa is translated to a row address R0 and a column address C0 and the end address Ea is translated to a row address R0 and a column address CF for the FLASH data copy area in the SDRAM, respectively.

Reading data from the SDRAM1 is accomplished as follows: an ACTIVE command A is input via the D1-COM line and a row address R0 is input via the D1-A0 to D1-A15 lines; and then, a READ command R is input via the D1-COM line and a column address C0 is input via the D1-A0 to D1-A15 lines. The reading is continued up to the final column address CF and is terminated by a PRECHARGE command P. A High WAIT signal is output between the start and end of the reading from the DRAM, denoting that data is being transferred from the DRAM.

Figure 13A:
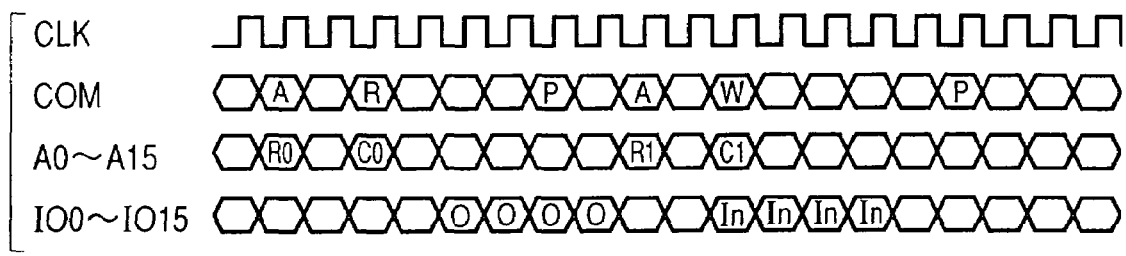
FIGS. 13A and 13B show an example of reading/writing data from/to the DRAM in the memory module of the present invention.
Figure 13A:
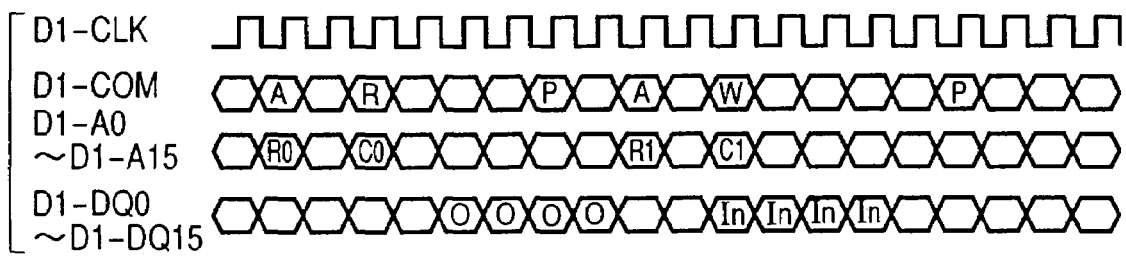
Figure 13B:
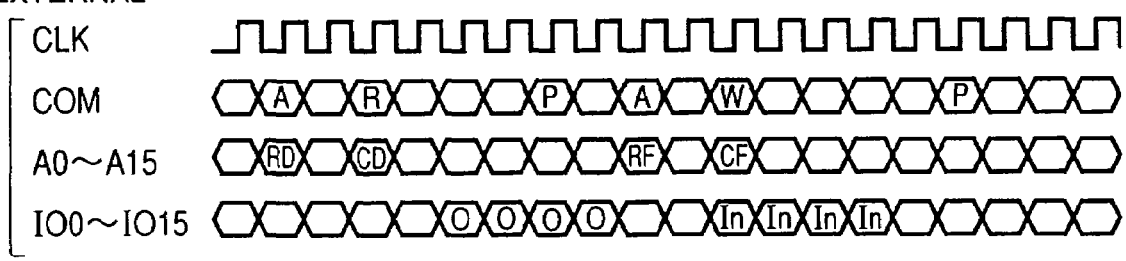
Figure 13B:
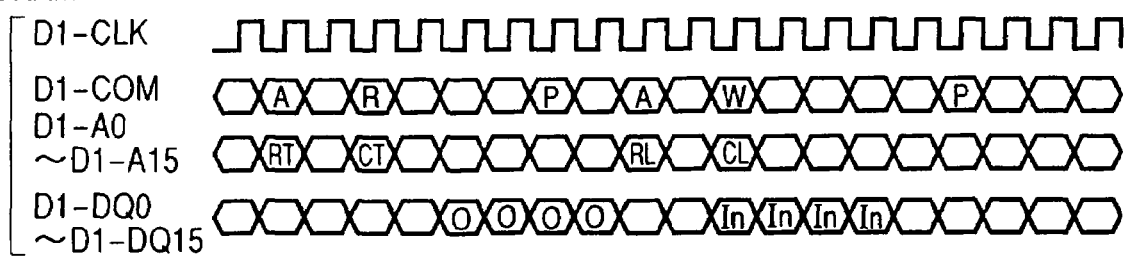

FIG. 13A shows the operation of the DRAM when the work area in the DRAM is accessed, and FIG. 13B shows the operation of the DRAM when the FLASH copy area in the DRAM is accessed.

The reading operation shown in FIG. 13A will now be described in detail. Initially, an ACTIVE command A and a row address R0 and a READ command R and a column address C0 are input from external via the SDRAM interface. The control circuit then transfers the ACTIVE command and the row address R0, and then the READ command R and the column address C0, to the DRAM1. As a result, the target data is output from the I/O signal lines D1-DQ0 to D1-DQ15 and is then output to external via the I/O signal lines IO0 to IO15.

The write operation shown in FIG. 13A is executed as follows. Initially, an ACTIVE command A and a row address R0 and then a WRITE command W and a column address C0 are input from external via the SDRAM interface. At this time, target data (In) is also input via the I/O signal lines IO0 to IO15. The control circuit then writes the ACTIVE command A and the row address R0, and then the WRITE command W and the column address C0, to the DRAM1. The target data (In) is written to the DRAM via the I/O signal lines D1-DQ0 to D1-DQ15.

The read operation shown in FIG. 13B is executed as follows. Initially, an ACTIVE command A and a row address RD, followed by a READ command R and a column address CD, are input from external via the SDRAM interface. The memory management unit MMU translates the row address RD of the FLASH to a row address RT of the FLASH data copy area and the column address CD of the FLASH to a column address CT of the FLASH data copy area, respectively. The ACTIVE command A and the row address RT, followed by the READ command R and the column address CT are input to the DRAM1. The target data is output from the I/O signal lines D1-DQ0 to D1-DQ15 and is then output to external from the I/O signal lines IO0 to IO15.

The write operation shown in FIG. 13B is executed as follows. Initially, an ACTIVE command A and a row address RF, followed by a WRITE command W and a column address CF, are input from external via the SDRAM interface. At this time, target data (In) is also input via the I/O signal lines IO0 to IO15. The memory management unit MMU translates the row address RF of the FLASH to a row address RL of the FLASH data copy area and the column address CF of the FLASH to a column address CL of the FLASH data copy area, respectively. The ACTIVE command A and the row address RL, followed by the WRITE command W and the column address CL, are input to the DRAM1. The target data is output from the I/O signal lines D1-DQ0 to D1-DQ15 and is then written in the DRAM.

Figure 14:
FIG. 14 is an example of reading data from the DRAM when a read request is issued from external to the DRAM while data is read from the DRAM with a STORE command.
Figure 14:
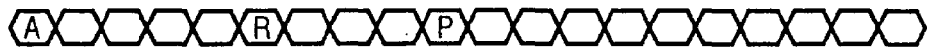
Figure 14:
Figure 14:
Figure 14:
Figure 14:
Figure 14:
Figure 14:
Figure 14:

FIG. 14 shows the operation of the DRAM when a READ command is received from external while data is read from the DRAM in response to a STORE command written in the command register from external. In the case where an ACTIVE command A and a row address R0 are received from external while the STORE command drives the WAIT signal into High, whereby data Os is read from the DRAM so as to be transferred to the FLASH, the control circuit issues a PRECHARGE command Ps to the DRAM1 and suspends the reading of the data Os that is being transferred from the DRAM to the FLASH. Thereafter, the control circuit issues an ACTIVE command A and a row address R0 to the DRAM1. Upon, receiving a READ command R and a column address C0 from external, the control circuit transfers the READ command R and the column address C0 to the DRAM1 to read data O, which is output from the IO0 to IO15.

Receiving a PRECHARGE command P and a bank address B0 from external, the control circuit transfers the PRECHARGE command P and the bank address B0 to the DRAM1 to complete the data reading. Thereafter, the control circuit issues an ACTIVE command AS, a row address R4, a READ command Rs, a column address C4, a READ command RS, and a column address C8 to the DRAM1 to restart reading of the data Os to be transferred from the DRAM to the FLASH.

Figure 15:
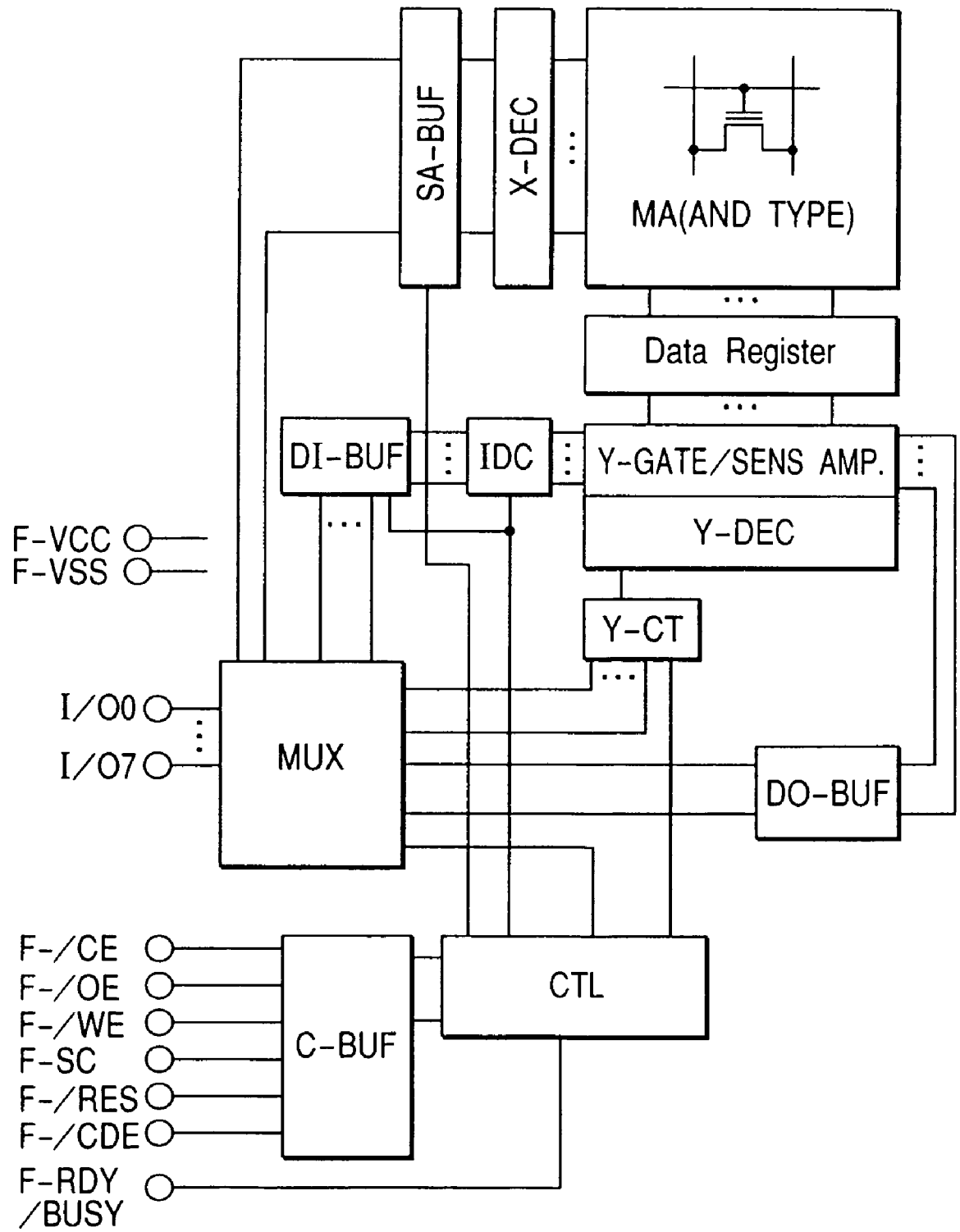
FIG. 15 is a block diagram of the FLASH shown in FIG. 1.

FIG. 15 shows a block diagram of chip 1 (FLASH) according to this embodiment. Chip 1 is comprised of: a control signal buffer C-BUF; a command controller CTL; a multiplexer MUX; a data input buffer DI-BUF; an input data controller IDC; a sector address buffer SA-BUF; an X decoder X-DEC; a memory cell array MA (FLASH); a Y address counter Y-CT; a Y decoder Y-DEC; a Y gate and sense amplifier circuit Y-GATE/SENS AMP; a data register; and a data output buffer DO-BUF. The operation of chip 1 is the same as that of any of the conventional AND FLASH memories. The AND FLASH memories are often referred to as large capacity flash memories and classified as NAND flash memories in the broad sense. In this specification, the term "NAND flash memory" also denotes an AND FLASH memory. Chip 1 (FLASH) can be used as a component of the memory module in this embodiment.

Figure 16:
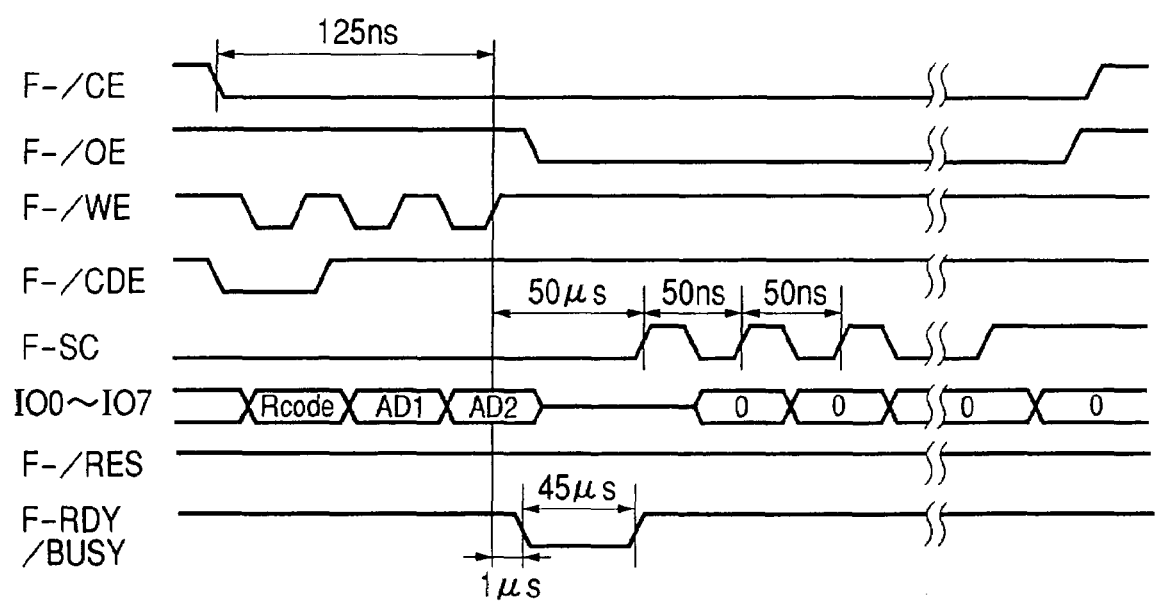
FIG. 16 is a timing chart of reading data from the FLASH shown in FIG. 15.

FIG. 16 illustrates a data read from an AND FLASH memory that may comprise chip 1. When the chip enable signal F-/CE and the command enable signal F-CDE are driven into low and the write enable signal F-/WE rises, a READ instruction code Rcode is input via the I/O signal lines I/O0 to I/O7. Then, a sector address is input via the I/O signal lines I/O0 to I/O7 at the rising of each of the second and third write enable signals F-/WE.

The 16 kb data corresponding to the input sector address is transferred to the data register from the memory cell array MA. While data is transferred from the memory cell array MA to the data register, the FLASH is busy and the F-RDY/BUSY drives the RDY/BUSY signal into low. When the data transfer ends, data is read from the data register sequentially in units of 8 bits synchronously with the rising of the serial clock signal F-SC and is then output from the I/O signal lines I/O0 to I/O7.

Figure 17:
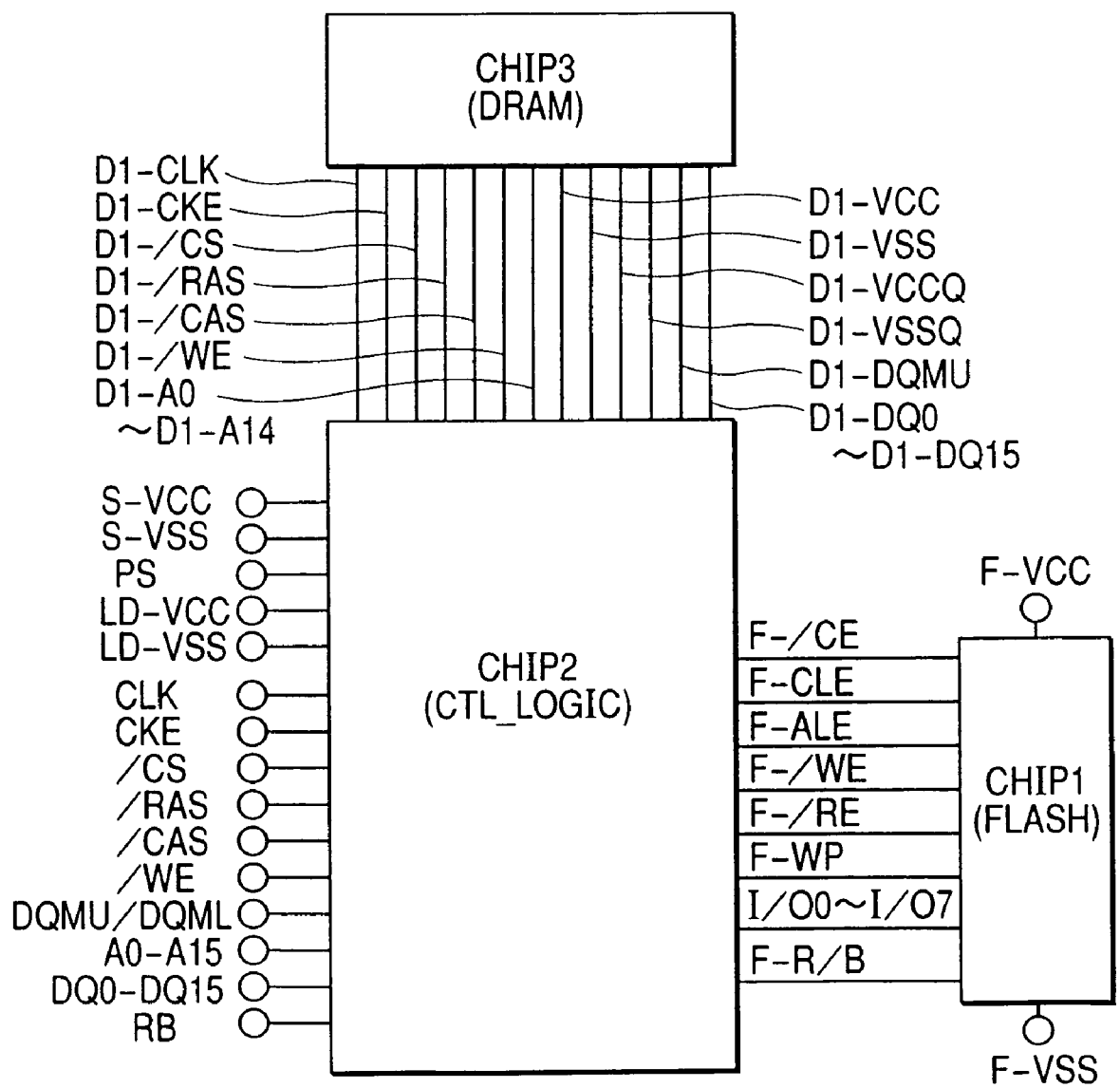
FIG. 17 is another block diagram of the memory module of the present invention.

FIG. 17 shows a block diagram of the memory module in which chip 1 is comprised of a NAND flash memory. The signals input to the chip 1 are as follows: the F-/CE is a chip enable signal; the F-/CLE is a command latch enable signal; the F-ALE is an address latch enable signal; the F-/WE is a write enable signal; the F-/RE is a read enable signal; the F-/WP is a write protect signal; the F-R/B is a ready/busy signal; and the I/O0 to I/O7 are I/O signals used to input addresses and data. In this way, the memory module can also use a NAND flash memory.

Figure 18:
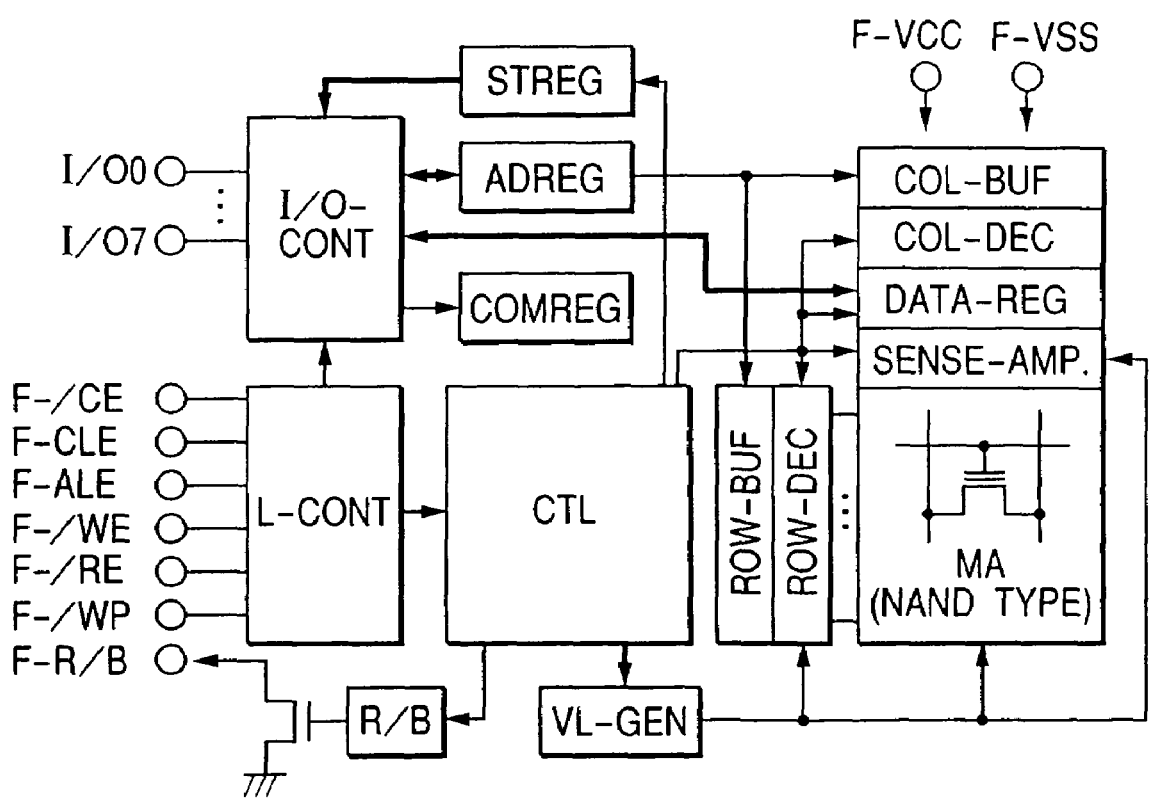
FIG. 18 is a block diagram of the FLASH shown in FIG. 17.

FIG. 18 shows a block diagram of a NAND flash memory used for this memory module. The NAND flash memory is comprised of: a logic controller L-CONT; a control circuit CTL; an I/O control circuit I/O-CONT; a status register STREG; an address register ADREG; a command register COMREG; a ready/busy circuit R/B; a high voltage generator VL-GEN; a row address buffer ROW-BUF; a row address decoder ROW-DEC; a column buffer COL-BUF; a column decoder COL-DEC; a data register DATA-REG; a sense amplifier SENSE-AMP; and a memory cell array MA.

The operation of this chip 1 is the same as that of any of the conventional NAND flash memories. As described above, this chip 1 (FLASH) can also be used as a component of the memory module in this embodiment.

Figure 19:
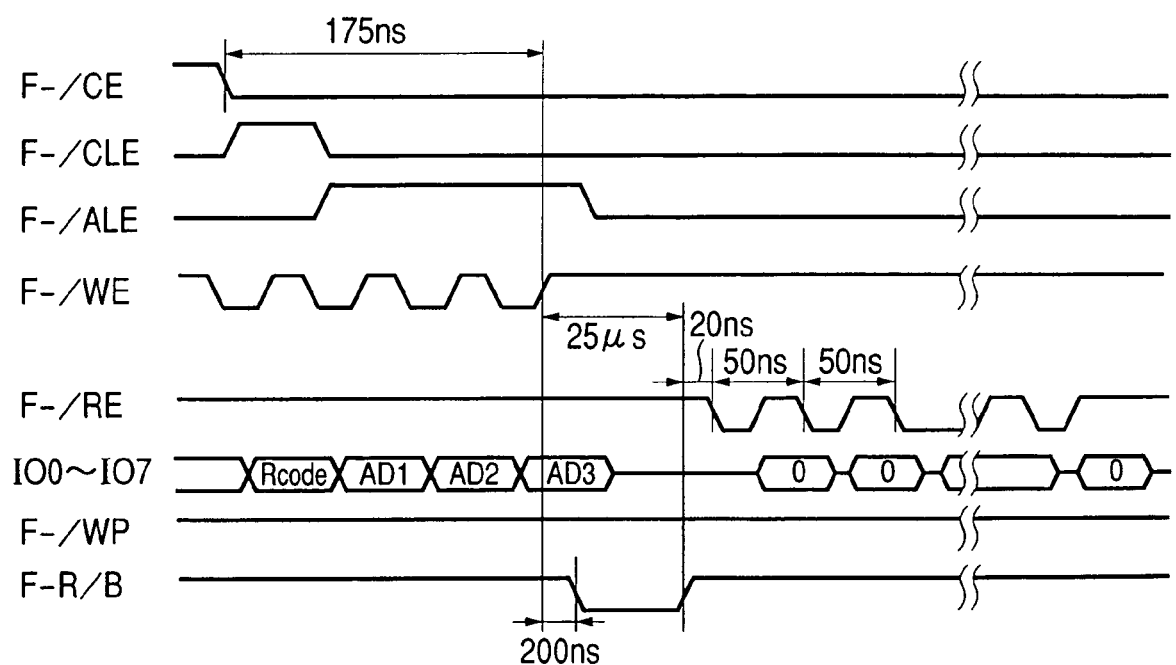
FIG. 19 is a timing chart for reading data from the FLASH shown in FIG. 18.

FIG. 19 illustrates a data read operation from the NAND flash memory used as chip 1. When the chip enable signal F-/CE is low, the command latch enable signal F-CLE is high, and the write enable signal F-/WE rises, a READ instruction code Rcode is input via the I/O signal lines I/O0 to I/O7. Thereafter, the address latch enable signal F-ALE becomes high, and the second to fourth write enable signals F-/WE rise. A page address is input via the I/O signal lines I/O0 to I/O7.

The 4 kbit (422-bit) data corresponding to the input page 4 kbit (422 bits) address is transferred to the data register DATA-REG from the memory cell array MA. While the data is transferred from the memory cell array MA to the data register DATA-REG, the FLASH is driven into the busy state and the F-R/B drives the ready/busy signal to low. When the data transfer ends, data is read from the data register DATA-REG sequentially in units of 8 bits synchronously with the falling of the read enable signal F-/RE and is output from the I/O signal lines I/O0 to I/O7.

Figure 20:
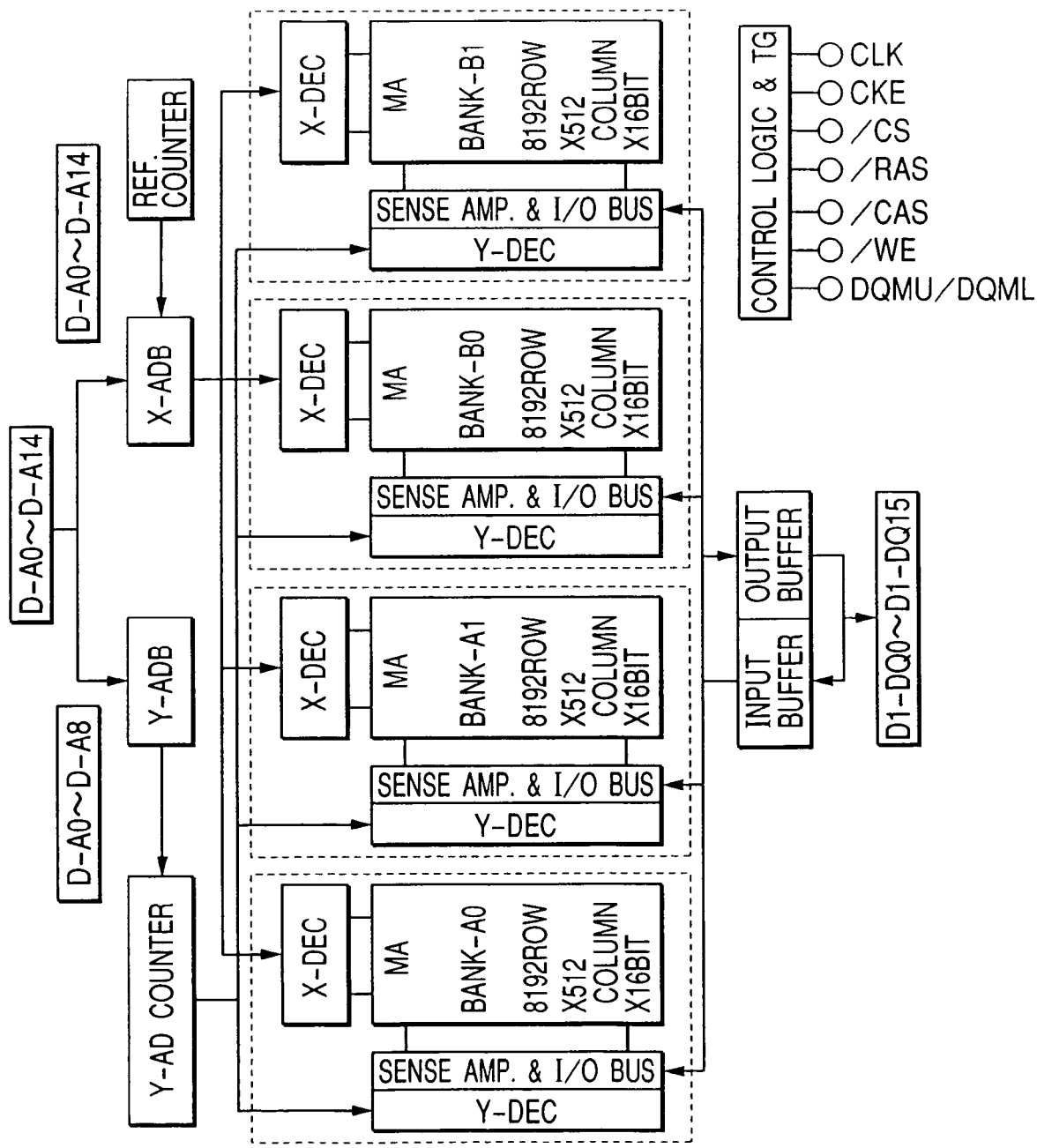
FIG. 20 is a block diagram of the DRAM.

FIG. 20 shows a block diagram of the DRAM in this embodiment. The DRAM is comprised of: an X address buffer X-ADB; a refresh counter REF. COUNTER; an X decoder X-DEC; memory cell arrays MA; a Y address buffer Y-ADB; a Y address counter Y-AD COUNTER; Y decoders Y-DEC; a sense amplifier circuit and Y gate (column switch) SENSE AMP. & I/O BUS; an input data buffer INPUT BUFFER; an output data buffer circuit OUTPUT BUFFER; and a control circuit and timing generator CONTROL LOGIC & TG The DRAM is preferably a conventional general-purpose SDRAM. In other words, the DRAM includes four independent memory banks, and those memory banks share address input terminals and data I/O terminals, which are used by each of the banks in a time-division manner. This DRAM may be used as a component of the memory module in this embodiment.

As described above, the memory module of the present invention that uses the SDRAM interface can read data from the FLASH almost at the same speed as that of the DRAM, since it includes an area reserved in the DRAM that can copy part or all of the data from the FLASH, so that the data is transferred from the FLASH to the DRAM prior to operation. When writing data to the FLASH, it is also possible to obtain the same write access time as that of the DRAM because data is written to the DRAM once, and then written back into the FLASH as needed.

When data is read from or written to the FLASH in the memory module, error detection and error correction are performed for the read/written data. When the writing fails, a replacement processing is done for the fail address so as to write the data in another address. The processing can thus be sped up, and the reliability of the memory module is assured.

Because the present invention uses a large capacity DRAM, it is possible to secure an area that can copy part or all of the data from the FLASH and a large capacity work area, the DRAM can cope with the enhanced functions of any cellular phone.

The sizes of the work area and the FLASH copy area to be secured in the DRAM, as well as the management units of those areas can be programmed from external and freely selected by the user as appropriate to the system.

Second Exemplary Embodiment

Figure 21:
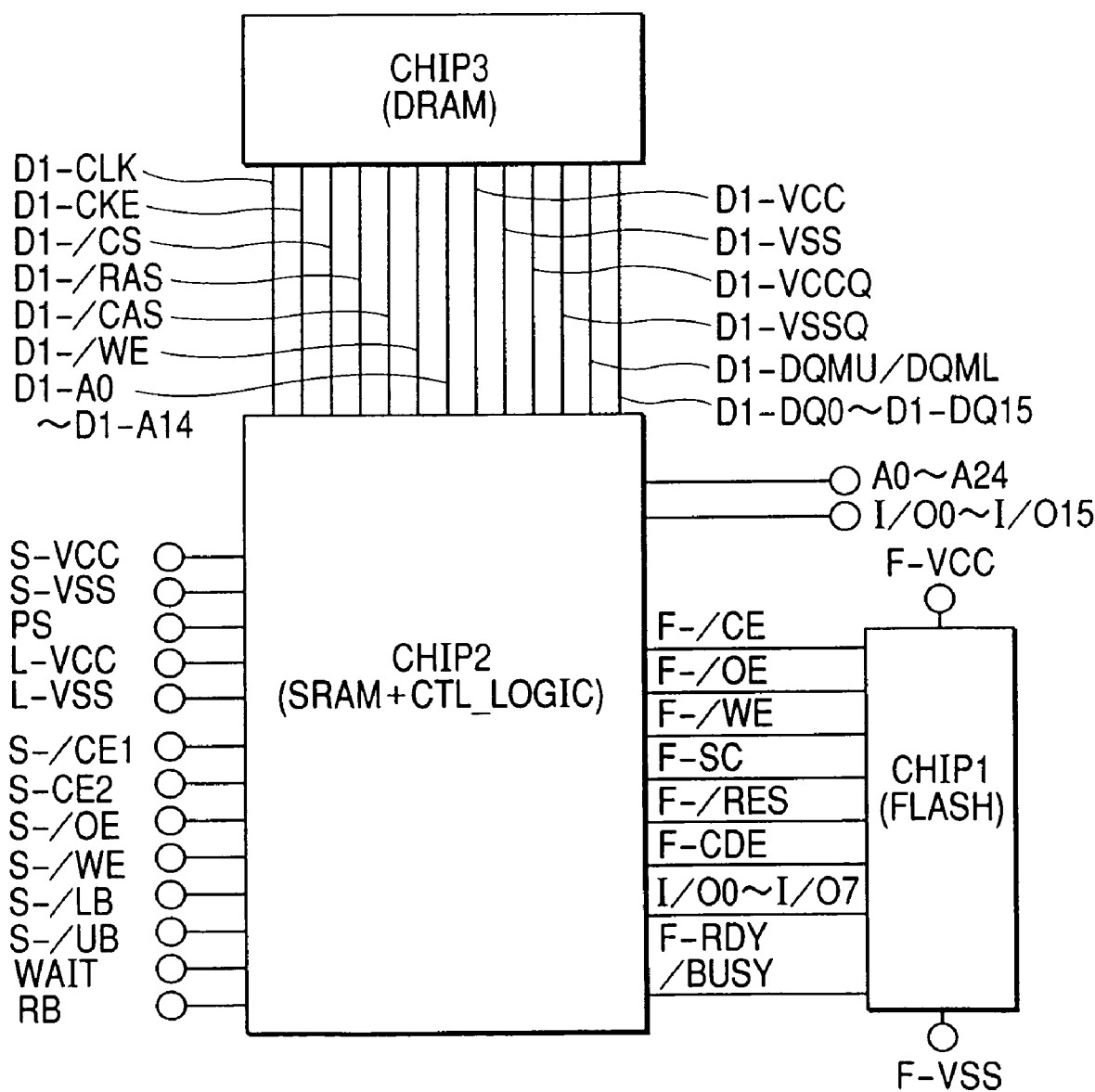
FIG. 21 is another block diagram of the memory module of the present invention.

FIG. 21 shows a second exemplary embodiment of the memory module of the present invention. This memory module is comprised of three chips. Hereinafter, each of the three chips will be described in detail. Chip 1 (FLASH) is preferably a non-volatile memory. This non-volatile memory may be a ROM (Read Only Memory), an EEPROM (Electrically Erasable and Programmable ROM), a flash memory, or the like. In this exemplary embodiment, a flash memory is employed. Chip 2 (SRAM+CTL_LOGIC) includes a static random access memory (SRAM) and a control circuit (CTL_LOGIC) that are integrated thereon. The control circuit controls the SRAM integrated on chip 2 as well as chip 3. Chip 3 is a dynamic random access memory (DRAM). The DRAM is classified into various types such as EDO, SDRAM, DDR, etc. according to the differences in the internal configurations and the interface types among them. This memory module may be any of those DRAM types, but the SDRAM is employed in this embodiment as an example.

This memory module receives addresses (A0 to A24) and command signals (S-/CE1, S-CE2, S-/OE, S-/WE, S-/LB, S-/UB, LS-EN, F-EN) input from external. Power is supplied to the memory module via S-VCC, S-VSS, LF-VCC, LF-VSS, LD-VCC, and LD-VSS. Data is input/output to/from this memory module via the I/O0 to I/O15 lines. So-called SRAM interfaces are used to operate this memory module. It should be noted that some of the above-mentioned signals may be altered or excluded for purposes of clarity or convenience in the drawings.

Chip 2 supplies signals required for the operation of chip 1 and chip 3. Chip 2 supplies a serial clock (F-SC), addresses and FLASH data (I/O0 to I/O7), commands (F-CE, F-/OE, F-/WE, F-/RES, F-CDE, F-RDY/BUSY) and power (F-VCC, F-VSS) to chip 1. Additionally, chip 2 supplies a clock (D1-CLK), addresses (D1-A0 to D1-A14), commands (D1-CKE, D1-/CS, D1-/RAS, D1-/CAS, D1-/WE, D1-DQMU/DQML), DRAM data (D1-DQ0 to D1-DQ15), and power (D1-VCC, D1-VSS, D1-VCCQ, D1-VSSQ) to chip 3.

The command signals input to chip 2 are as follows: the S-/CE1 and the S-CE2 are chip enable signals; the S-/OE is an output enables signal; the S-/WE is a write enable signal; the S-/LB is a lower byte select signal; and the S-/UB is an upper byte select signal.

The signals input to chip 1 are as follows: the F-/CE is a chip enable signal; the F-/OE is an output enable signal; the F-/WE is a write enable signal; the F-SC is a serial clock signal; the F-/RES is a reset signal; the F-CDE is a command data enable signal; and the F-RDY/BUSY is a ready/busy signal. The I/O0 to I/O7 are I/O signal lines used to input addresses and input/output data.

The chip 2 control circuit (CTL-LOGIC) selects one of the command register REG, the SRAM of chip 2, the DRAM of chip 3, and the FLASH of chip 1 provided therein according to a received address value. Accesses to the command register REG, the SRAM, the DRAM, and the FLASH described above can be distinguished according to a value preset in the control register provided in the control circuit (CTL_LOGIC). A so-called "SRAM interface" is preferably used to access each of those areas.

The DRAM is divided into a work area and a FLASH data copy area. The work area is used as a work memory in which programs are executed, and the FLASH data copy area is used as a memory to copy data from the FLASH.

To access the SRAM in chip 2, address signals for selecting the SRAM, command signals, and the like are input to the control circuit (CTL_LOGIC). For a read access to the SRAM, data is read from the SRAM and then output to the I/O signal lines (I/O0 to I/O15) of the memory module. For a write access to the SRAM, data is input via the data I/O lines (I/O0 to I/O15) of the memory module and then written to the SRAM.

FLASH data can be copied (loaded) into the FLASH data copy area located in the DRAM, and the data in the FLASH data copy area in the DRAM can be written back (stored) into the FLASH by accessing the command register REG in the control circuit (CTL_LOGIC) and writing LOAD and STORE instruction codes therein.

When an address for accessing the command register REG is input to an address signal line (A0 to A24), a WRITE command is inputted to a command signal line (S-/CE1, S-CE2, S-/OE, S-/WE, S-LB, S-/UB), and a LOAD instruction code and both start and end addresses of a FLASH area for loading are input to the I/O data signal lines (I/O0 to I/O15). The LOAD instruction code, as well as the start and end addresses for loading are written to the command register. Thereafter, data is read from an address range between the start and end addresses for loading in the FLASH and is transferred to the FLASH data copy area in the DRAM. Consequently, the FLASH data comes to be held in the DRAM.

When a STORE instruction code as well as both start and end addresses for storing, which are used to select the FLASH, are written to the command register, data is written back into an address range between the start and end addresses for storing in the FLASH from the FLASH data copy area located in the DRAM.

A value can be preset in the control register provided in the control circuit (CTL_LOGIC) so as to determine the address correspondence between an address range of the FLASH and an address range of the FLASH data copy area in the DRAM.

The reliability of the FLASH may be degraded due to repetitive rewriting of data therein, whereby written data is incorrectly read and rewriting is disabled. When data is read from the FLASH, chip 2 (CTL_LOGIC) detects and corrects errors, if any, so as to transfer the correct data to the DRAM.

For example, when data is written in the FLASH, chip 2 (CTL_LOGIC) checks whether or not the data is written correctly. If not written correctly, chip 2 (CTL_LOGIC) writes the data in another address. This is a so-called "address replacement processing". Chip 2 (CTL_LOGIC) also manages respective fail addresses, as well as replacement processings executed for those respective addresses.

When the FLASH data copy area in the DRAM is to be accessed, the FLASH area address range is input via address signal lines (A0 to A24), and a command is input via a command signal line (S-/CE1, S-CE2, S-/OE, S-/WE, S-/LB, S-/UB). When the command is a READ command, the control circuit of chip 2 accesses the DRAM and reads the target data from the address range in the DRAM FLASH data copy area, corresponding to the addresses in the FLASH area. When the command is a WRITE command, write data is input to the data I/O lines (I/O0 to I/O15) of the memory module and then input to the DRAM via the DRAM data I/O lines (D1-DQ0 to D1-DQ15). Consequently, both data reading and writing speeds of the FLASH become equal to those of the DRAM (in this case, an SDRAM.)

When the work area in the DRAM is to be accessed, address and command signals required to access the area are input via the corresponding address and command lines. The control circuit (CTL_LOGIC) then generates addresses for accessing the work area in the DRAM and accesses the DRAM. For a read access, data read from the DRAM is output to the data I/O lines (I/O0 to I/O15) via the DRAM data I/O lines (D1-DQ0 to D1-DQ15). For a write access, write data is input via the data I/O lines (I/O0 to I/O15) of the memory module and input to the DRAM via the DRAM data I/O lines (D1-DQ0 to D1-DQ15).

The power to chip 3 (DRAM) is supplied from the LD-VCC and the LD-VSS connected to the D1-VCC, the D1-VSS, the D1-VCCQ, and the D1-VSSQ via the control circuit (CTL_LOGIC). The power to the FLASH is supplied from the LF-VCC and the LF-VSS connected to the F-VCC and the F-VSS via the control circuit (CTL_LOGIC). The command signal PS is used to control the power supply to both the DRAM and the FLASH, so that the power supply is shut off when possible.

When the power supply to the DRAM is shut off, the control circuit (CTL_LOGIC) enables only the data that must be written back into the FLASH to be automatically written back from the DRAM and shuts off the power supply to the DRAM after the data writing-back is completed. To power the DRAM again, the DRAM must be initialized. The control circuit (CTL-LOGIC) generates signals required to initialize the DRAM and the FLASH and to control the timings thereof.

To periodically refresh the DRAM, the control circuit (CTL_LOGIC) may issue the BANK ACTIVE command. Generally, the refreshing characteristics of the DRAM are degraded at high temperatures. This problem is avoided, however, by providing the control circuit (CTL_LOGIC) with a thermometer, whereby the interval for issuing the BANK ACTIVE command at high temperatures may be narrowed. The DRAM can thus be used in a wider temperature range.

According to the embodiment as described above, it is possible to realize a large capacity memory module, which uses the SRAM interface method and low-price general-purpose SDRAM and FLASH memories. The memory module preferably has same access speed as that of the SRAM.

The memory module of the present invention can read FLASH data at the same speed as that of the SRAM because the DRAM includes an area that can copy part or all of the FLASH data therein so that the data is transferred to the DRAM from the FLASH prior to access of that data. When data is to be written to the FLASH, it is possible to write data in the DRAM once and then write the data back into the FLASH only as needed. Therefore, data can be written back into the FLASH at the same speed as that of an SRAM.

Because a large capacity SDRAM is used in this example, it is possible to secure an area that can copy FLASH data, as well as a large capacity work area in the SDRAM. When data is read from the FLASH, both error detection and error correction are performed for the read data. When data is not written in an address in the FLASH, an address replacement processing is accomplished for the fail address. The processing can thus be done quickly, and the reliability of the memory module is improved.

When the interval for DRAM refreshing executed in the memory module is changed according to a temperature, the temperature range of the DRAM operation can be widened, whereby a large capacity memory module with a wide operation temperature range can be realized. The present invention also preferably provides a memory module that requires a lower data retention current. In order to address this principle, the interval for refreshing the DRAM to be executed in the memory module at a low temperature is extended, whereby the data retention current is reduced. In order to further reduce the data retention current, the power supply to the DRAM may be shut off and only the data stored in the SRAM is held. Consequently, only the minimum data retention current is required to hold the necessary data.

Figure 22:
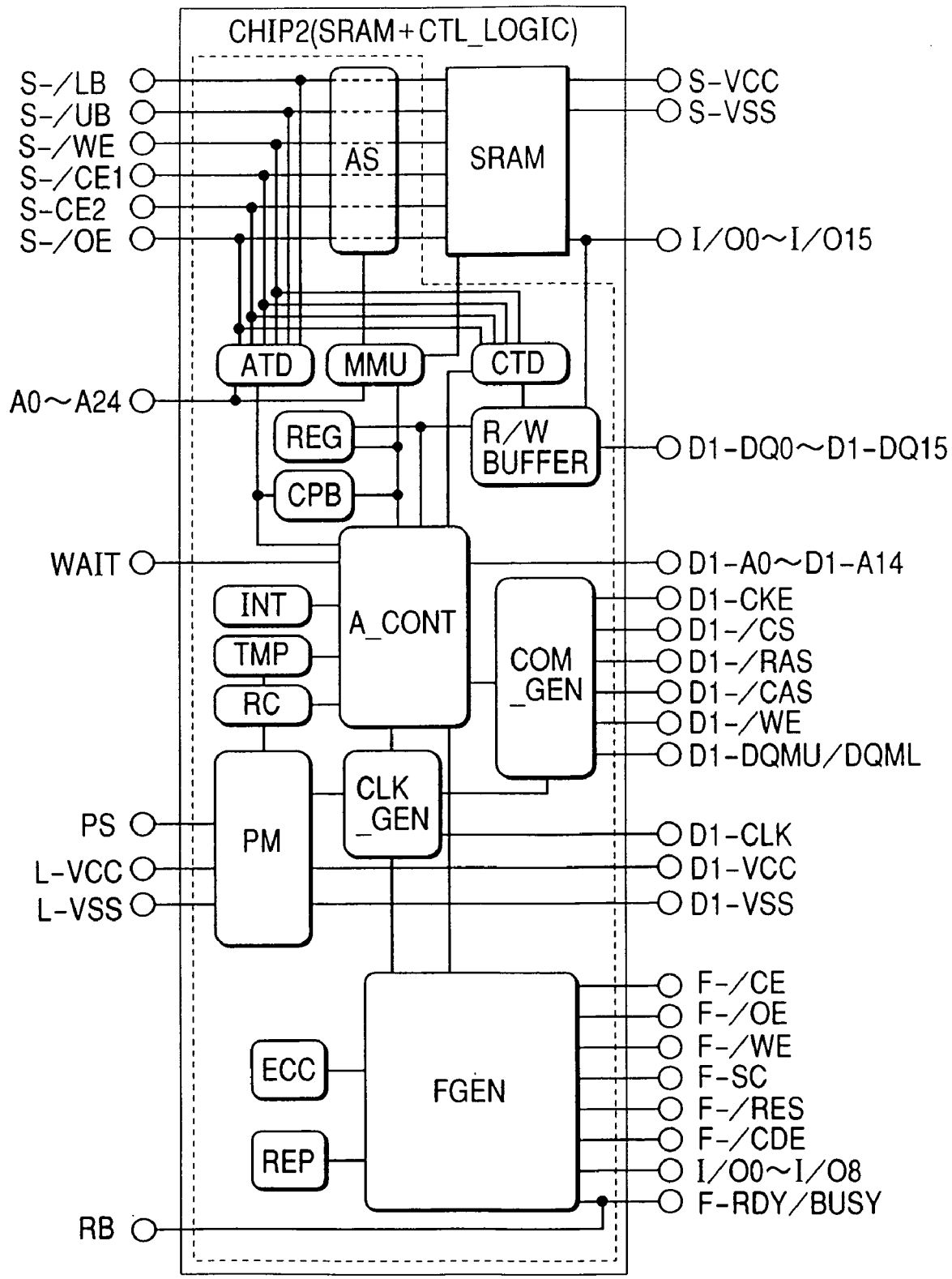
FIG. 22 is a block diagram of the chip 2 shown in FIG. 21.

FIG. 22 shows a block diagram of chip 2 (SRAM+ CTL_LOGIC). Chip 2 (SRAM+CTL_LOGIC) is preferably comprised of an SRAM and a control circuit (CTL_ LOGIC). The SRAM integrated on chip 2 is a conventional asynchronous SRAM used generally in system design. The control circuit (CTL_LOGIC) is shown as an area enclosed by a broken line in FIG. 22. The control circuit (CTL_ LOGIC) occupies most of the space of chip 2 except for the SRAM. The control circuit (CTL_LOGIC) is comprised of the circuit blocks of AS; MMU; ATD; ATD; CTD; R/W BUFFER; CPB; A_CONT; REG; INT; TMP; RC; PM; CLK_GEN; and COM_GEN. Hereinafter, the operation of each of those circuit blocks will be described in detail.

The initialization circuit INT initializes both the control register in the memory management unit MMU and the DRAM when the power is supplied.

The memory management unit MMU translates addresses input from external according to a value preset in the control register and selects the command register REG in the register area, the work area in the DRAM, the FLASH data copy area in the DRAM, or the FLASH and provides access to the selected one. The value in the control register is initialized by the initialization circuit INT when the memory module is powered. To change the value in the control register, a memory management MMU CHANGE command may be input to the command register REG When the SRAM is selected, the access switch (AS) sends address and command signals to the SRAM, whereby the SDRAM is accessed.

The address transition detector circuit (ATD) detects a change in any of the address and command signals and outputs pulses. The command transition detector circuit (CTD) detects a change in any of the command signals and outputs pulses. An access to the memory module begins when these detector circuits detect signal changes.

When data is written to an address in the FLASH data copy area in the DRAM, the data renewing address management circuit CPB stores the address information.

The command register REG receives and stores commands such as LOAD, STORE, MMU CHANGE, POWER-OFF, as well as start and end addresses for loading, storing, and other functions that are written thereto. The data buffer R/W BUFFER temporarily holds data read/written from/to the DRAM or data read/written from/to the FLASH. The command generator COM_GEN generates commands required to access the DRAM. The access controller A_CONT controls all of chip 2 and generates addresses required to access the DRAM. The FLASH control signal generator FGEN controls reading/writing data from/to the FLASH.

The error correction circuit ECC checks whether or not an error is included in read data. When an error is included, the circuit ECC corrects the error. The replacement processing circuit REP checks whether or not data is written to the FLASH correctly. When data is not written to an address correctly, the circuit REP writes the data to another address previously prepared in the FLASH (address replacement processing).

The temperature measuring module (TMP) measures temperatures and outputs a signal according to the measured temperature to both the RC and the A_CONT. The RC is a refresh counter that generates addresses for refreshing in accordance with the DRAM refreshing interval. The temperature measuring module (TMP) outputs a signal that changes the refreshing interval according to the measured temperature.

The power module (PM) controls the power supplies to the control circuit (CTL_LOGIC) of chip 2 and the DRAM. The clock generator (CLK_GEN) generates a clock and supplies the clock to the DRAM and the control circuit (CTL_LOGIC).

Next, the operation of this memory module will be described in detail. To access chip 2 (SRAM+CTL_LOGIC), the conventional general asynchronous SRAM method is used to interface the access. When a change occurs in any of the address signals (A0 to A24) and the command signals (S-/LB, S-/UB, S-/WE, S-/CE1, S-CE2, S-/OE), the ATD detects the change, whereby an access to the command register REG, the SRAM, the DRAM, or the FLASH begins.

The value of an address (A0 to A24) input from external is initially translated by the memory management unit MMU. According to the translated address, the access target (command register REG, SRAM, DRAM, or FLASH) is determined. The address translation pattern is determined by a value preset in the control register provided in the memory management unit MMU.

When the command register REG is selected and a LOAD instruction code is written to the command register REG, FLASH data is transferred to the DRAM as follows. Initially, the FLASH control signal generator FGEN reads data from the FLASH. If the read data contains no errors, the FGEN transfers the data directly to the data buffer R/W BUFFER. If the read data contains any error, the error correction circuit ECC corrects the error and transfers the corrected data to the data buffer R/W BUFFER. Thereafter, the DRAM receives a WRITE command from the command generator COM_GEN, address signals from the access controller A_CONT, and the data that was read from the FLASH from the data buffer R/W BUFFER, whereby the data is written in the FLASH data copy area in the DRAM.

When the command register REG is selected and a STORE command is written to the command register, data is transferred from the FLASH data copy area of the DRAM to the FLASH as follows. Initially, the DRAM receives a READ command from the command generator COM_GEN and address signals from the access controller A_CONT, whereby data is read from the DRAM. The data read from the DRAM is transferred to the FLASH controller FGEN via the data buffer R/W BUFFERS and the FLASH control signal generator FGEN writes the data in the FLASH. The address replacement circuit REP checks whether or not the data is written successfully. If successful, the REP terminates the processing. If not successful, the REP writes the data in another address prepared beforehand in the FLASH (address replacement processing). When such a replacement processing is done, the REP holds and manages the address information that denotes each address for which such a replacement processing is performed. The data renewing management circuit CPB selects the information of each FLASH address in which writing has already been sequentially performed and clears the address information. In this way, the data renewing management circuit CPB can keep management of addresses in which the latest renewed data is held.

When the DRAM work area or the FLASH data copy area are selected and a READ command is written to the command register, the DRAM receives the READ command signal from the command generator COM_GEN and address signals from the access controller A_CONT, whereby data is read from the DRAM. When the DRAM work area or the FLASH data copy area are selected and a WRITE command is written to the command register, the DRAM receives the WRITE command signal from the command generator COM_GEN, address signals from the address controller A_CONT, and data from the data buffer R/W BUFFER, whereby the data is written in the DRAM.

When the command register REG is selected and a POWER-OFF command is written to the command register, the data renewing management circuit CPB transfers the DRAM data corresponding to the address held therein as follows. Initially, the DRAM receives a READ command from the command generator COM_GEN and address signals from the access controller A_CONT, whereby data is read from the DRAM. The data read from the DRAM is transferred to the FLASH controller FGEN via the data buffer R/W BUFFER and is then written to the FLASH by the FLASH control signal generator FGEN.

The data renewing management circuit CPB selects the information of each DRAM address held therein from which data is written in the FLASH and clears the address information sequentially. When all the data corresponding to the addresses held therein is written to the FLASH, the address information in the data renewing management circuit CPB is all cleared.

When the memory module is used at high temperatures, the DRAM refreshing interval should be reduced so that the refresh process is performed more frequently. In this memory module, therefore, a temperature measuring module TMP measures the temperature and sends the measured temperature to both the refresh counter and the access controller. When the temperature rises, the refresh counter decreases the refreshing interval and outputs a refresh address. When the temperature falls, the refresh counter can extend the DRAM refreshing interval so as to reduce the data retention current. When the temperature falls, therefore, the refresh counter extends the refreshing interval and outputs a refresh address.

An apparatus in which the above memory module is mounted may desire current consumption to be reduced according to the operation state. A description will now be made of a method for reducing the power consumption of the memory module by changing the operation state with use of a power module.

Initially, the simplest method for reducing the power consumption as described above is to enable the power module to stop the refresh from being performed by the refresh counter with use of the command signal PS. Although the data stored in the DRAM is erased at this time, the refreshing power can be reduced. To further reduce the power consumption, the power to the DRAM may be shut off in the memory module. In this case, the power module stops the power supply to the D1-VCC, which is supplied to the DRAM, according to the command signal PS output from the subject apparatus.

To still further reduce the power consumption, the power module may stop the power supply to a part related to the access to the DRAM on chip 2 (SRAM+CTL_LOGIC) according to the command signal PS. In this state, for example, the power is supplied only to the SRAM, the MMU, and the AS on chip 2 (SRAM+CTL_LOGIC) to enable their operations so that the memory module is set in a mode that enables only the accesses to the SRAM. It may also be possible to enable the data in the SRAM to be held by the command signal PS. In this case, all the power supplies except for the S-VCC and S-VSS supplied to the SRAM may be shut off so that accesses to the memory module are disabled. In this state, the memory module holds the data stored in the SRAM.

To restart the DRAM after the power supply to the DRAM is shut off once, the DRAM must be initialized in addition to restarting of the power supply to the DRAM. The initialization proceeds normally, but this memory module uses an initialization circuit INT that instructs the access controller A_CONT to use a predetermined initialization procedure. To restart the DRAM after the DRAM refreshment is stopped, the DRAM must also be initialized. In this case, the initialization circuit INT instructs the access controller A_CONT to use the predetermined initialization procedure for the initialization.

FIGS. 23 to 26 show examples of the memory maps in which addresses are translated by the memory management unit MMU. The user may select any of these memory maps according to a value preset in the control register provided in the MMU. Although not specifically limited, it is assumed in this embodiment that the memory module is provided with a FLASH whose memory capacity is 256+8 Mb, a 2 Mb SRAM, and a 256 Mb DRAM. A description will be made hereinafter for typical memory maps used in the memory module.

Figure 23:
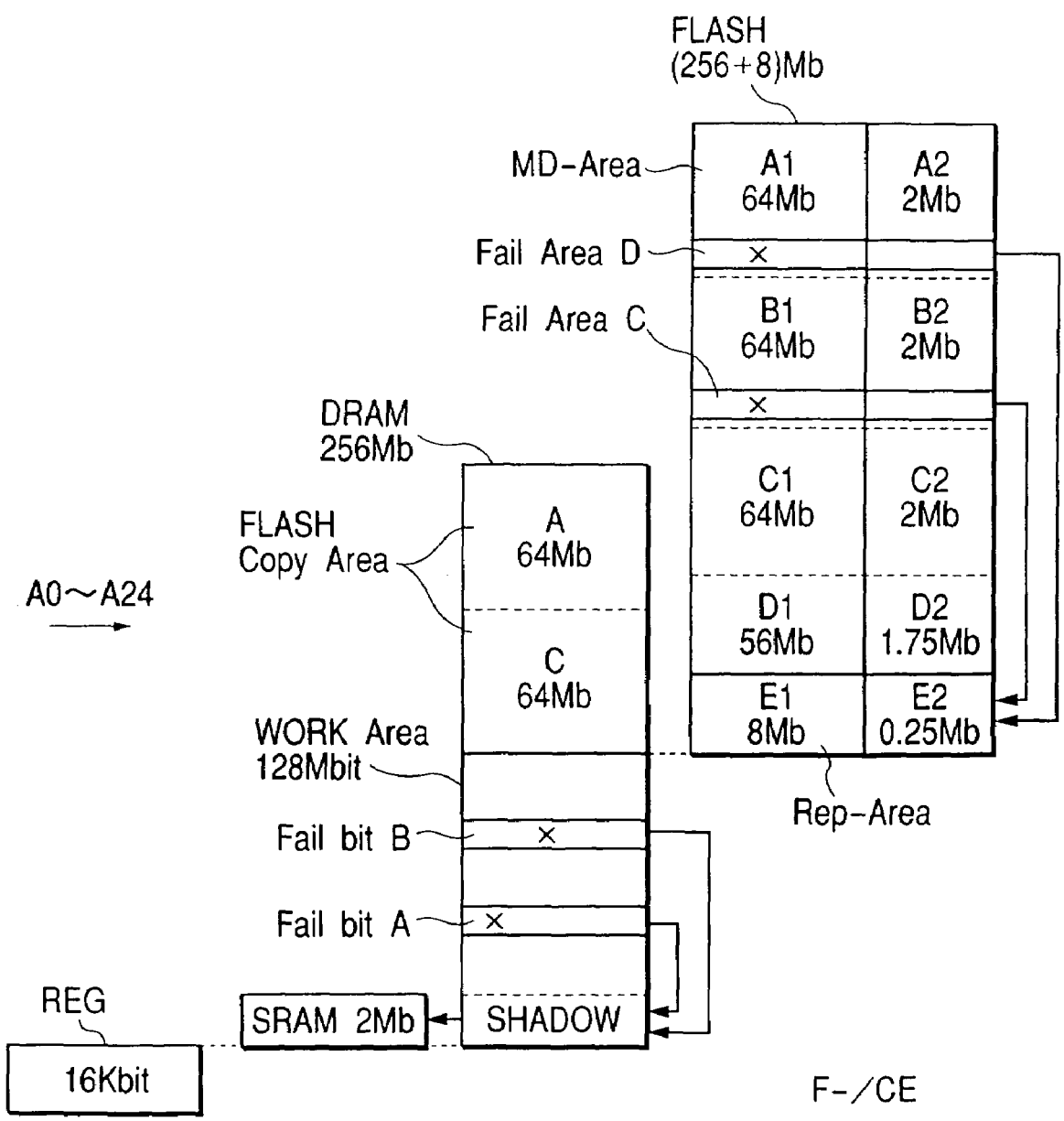
FIG. 23 is an example of address maps of the memory module of the present invention.

In the memory maps shown in FIG. 23, the memory management unit MMU translates addresses input via the address signal lines A0 to A24 to addresses used in the command register REG (16 kb), the SRAM data retention area (2 Mb), the work area (128 Mb) in the DRAM, the FLASH data copy area (128 Mb) in the DRAM, and the FLASH (256+8 Mb). Although not specifically limited, mapping of the command register REG, the SRAM, the DRAM, and the FLASH begins at the bottom of the address space in each memory map in this embodiment.

The command register REG holds instruction codes such as LOAD, STORE, and MMU REGISTER CHANGE, as well as the start and end addresses for loading, storing, and the like. The DRAM is divided into a work area (128 Mb) and a FLASH data copy area (128 Mb). The work area is used as a work memory in which programs are executed. The FLASH data copy area is used to copy and hold part of FLASH data.

The data retention area (2 Mb) in the SRAM is localized at the bottom of the address space in each memory map. Although this area is duplicated within the DRAM in the memory space, the DRAM is not accessed; only the SRAM is accessed. The SRAM areas can be managed exclusively when the power supply of the memory module is controlled to hold and use only the data in the SRAM.

The DRAM area (SHADOW) that is not accessed can be used for redundancy. This memory module is enabled to extend the DRAM refreshing interval when the memory module operates at a low temperature to reduce the power consumption. However, when the memory module operates at a low temperature, some memory cells (fail bits) might become difficult to retain data. The SHADOW area in the DRAM is used in such a case to hold the data instead of those fail bits. In FIG. 23, the DRAM includes fail bits A and B, and those fail addresses are registered beforehand, so that the SHADOW area is accessed instead of any of the fail bits to which an access to the DRAM is attempted. The fail bit is thus saved by the replacement processing through the use of the SHADOW, whereby the refreshing interval is extended to reduce the power consumption of the memory module when the memory module operates at a low temperature.

To copy part of the FLASH data into the FLASH data copy area, the memory management unit MMU determines the address correspondence between an address range in the FLASH data copy area and an address range in the FLASH according to a value preset in the internal register. FIG. 23 shows an example of such address correspondence denoting that data in the A1 (64 Mb) and C1 (64 Mb) areas in the FLASH can be copied into the A (64 Mb) and C area (64 Mb) in the FLASH data copy area of the DRAM, respectively. The address correspondence may be changed so that the data in the B1 (64 Mb) and D1 (64 Mb) in the FLASH can be copied into the FLASH data copy area in the DRAM respectively by changing the value preset in the internal control register in the memory management unit MMU.

Although not specifically limited, the FLASH (256+8 Mb) is divided into a main data area MD-Area (A1, A2, B1, B2, C1, C2, D1, D2: 255.75 Mb) and a replacement area Rep-Area (E1, E2: 8.25 Mb). The main data area is further divided into a data area (A1, B1, C1, D1) and a redundant area (A2, B2, C2, D2). The data area is used to store programs, and the redundant area is used to store ECC parity data and other data used to detect and correct errors. Data in the data area in the FLASH is transferred to the FLASH data copy area in the DRAM, or data in the FLASH data copy area in the DRAM is transferred to the data area in the FLASH.

The reliability of the FLASH, when rewriting is repeated therein, is degraded, whereby written data is incorrectly read and rewriting is disabled. The replacement area is used in such a case to write data when the writing in a fail area (fail area C, fail area D) fails. Although the size of the replacement area is not specifically limited, the size should be determined so as to assure the FLASH reliability.

Next, a process for transferring data from the FLASH to the DRAM will be described. To transfer data from the FLASH A1 data area to the FLASH data copy area A in the DRAM, a LOAD command as well as start and end addresses SAD and EAD of the FLASH data area A1 are written to the command register. The control circuit (CTL_LOGIC) then reads data from the address range denoted by the start and end addresses FSAD and FEAD in the FLASH data area A1 and transfers the data to the address range denoted by the start and end addresses DSAD and DEAD in the FLASH data copy area A in the DRAM. The correspondence between those address ranges is determined by the memory management unit MMU.

When reading data from the FLASH, the control circuit (CTL_LOGIC) reads the data from the FLASH data area A1 and the ECC parity data from the redundant area A2 in the data management unit (8 k bits), and the error correction circuit ECC performs error correction if any error is detected, whereby only corrected data is transferred to the DRAM.

Data is transferred from the DRAM to the FLASH as follows. To transfer data from the FLASH data copy area A in the DRAM to the FLASH data area A1, a STORE command as well as start and end addresses SAD and EAD of the FLASH data area A1 are written to the command register. The control circuit (CTL_LOGIC) then reads the data from the address range between the start and end addresses DSAD and DEAD of the FLASH data copy area A in the DRAM and writes the data in the address range between start and end addresses FSAD and FEAD of the FLASH data area A1. The correspondence between those address ranges is determined by the memory management unit MMU.

When writing data in the FLASH, the error correction circuit generates ECC parity data in the data management unit (8 kb in this case). The FLASH control circuit FGEN writes the data read from the DRAM to the FLASH data area A1 and the generated ECC parity data in the redundant area A2, respectively. The address replacement circuit REP checks whether or not the writing is done successfully. If successful, the REP terminates the processing. If not successful, the REP selects another address in the FLASH replacement area and writes the data read from the DRAM in the replacement area E1 and the generated ECC parity data in the replacement redundant area E2, respectively.

Data is read from the FLASH data copy area A of the DRAM as follows. When an address FAD0 of the FLASH data area A1 and a READ command are received from external, the MMU translates the address FAD0 to an address DAD0 of the FLASH data copy area A in the corresponding DRAM. Consequently, the DRAM is selected, and FLASH data copied into the DRAM can be read from the DRAM. In other words, FLASH data can be read at the same speed as that of the DRAM.

Data is read from the work area in the DRAM as follows. When an address WAD0 of the work area in the DRAM and a READ command are received from external, the MMU outputs the address WAD0 to the address generator A_CONT. Consequently, data can be read from the address WAD0 in the DRAM work area.

Data is written to the FLASH data copy area A in the DRAM as follows. When an address FAD0 of the FLASH data area A1, a WRITE command, and write data are received from external, the MMU translates the address FAD0 to the address DAD0 used in the FLASH data copy area in the corresponding DRAM. Consequently, the DRAM is selected, and data is written to the FLASH data copy area A in the DRAM. Because data is written to the FLASH data copy area A in the DRAM corresponding to the FLASH data area A1 in this way, FLASH data can be written to the DRAM at the same speed as that of the SRAM.

Data is written to the DRAM work area as follows. When an address WAD0 of the work area, a WRITE command, and input data are received from external, the address generator A_CONT outputs the address WAD0 to the DRAM. Consequently, data can be written in the address WAD0 in the DRAM work area.

Figure 24:
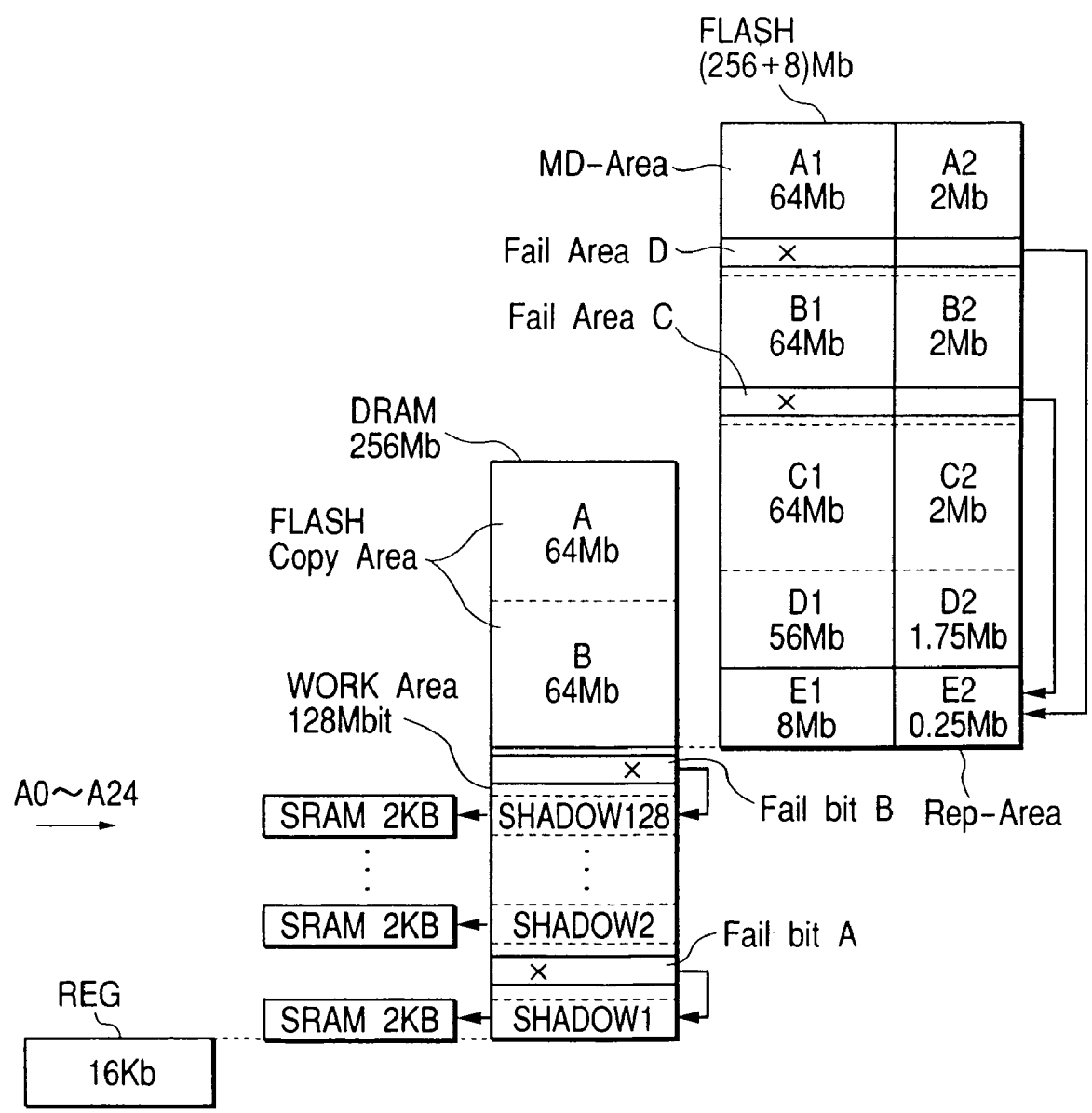
FIG. 24 is an example of the memory maps of the memory module of the present invention.

In the memory map example shown in FIG. 24, the SRAM area is dispersed in a plurality of address spaces. The SRAM address space is therefore duplicated with the DRAM address space, and access to the duplicated space is performed to the SRAM. A plurality of SHADOW areas are used to save a plurality of fail bits. In this example, the SRAM area is set in units of 2 kb. This is to adjust to the writing/erasing unit of the FLASH memory. When the same management unit is used for both address space and FLASH memory, the OS (operating system) and other programs can more easily handle memory spaces. When the power supply of the memory module is controlled to hold and use only the SRAM data, the SRAM area can be dispersed in the memory space.

Figure 25:
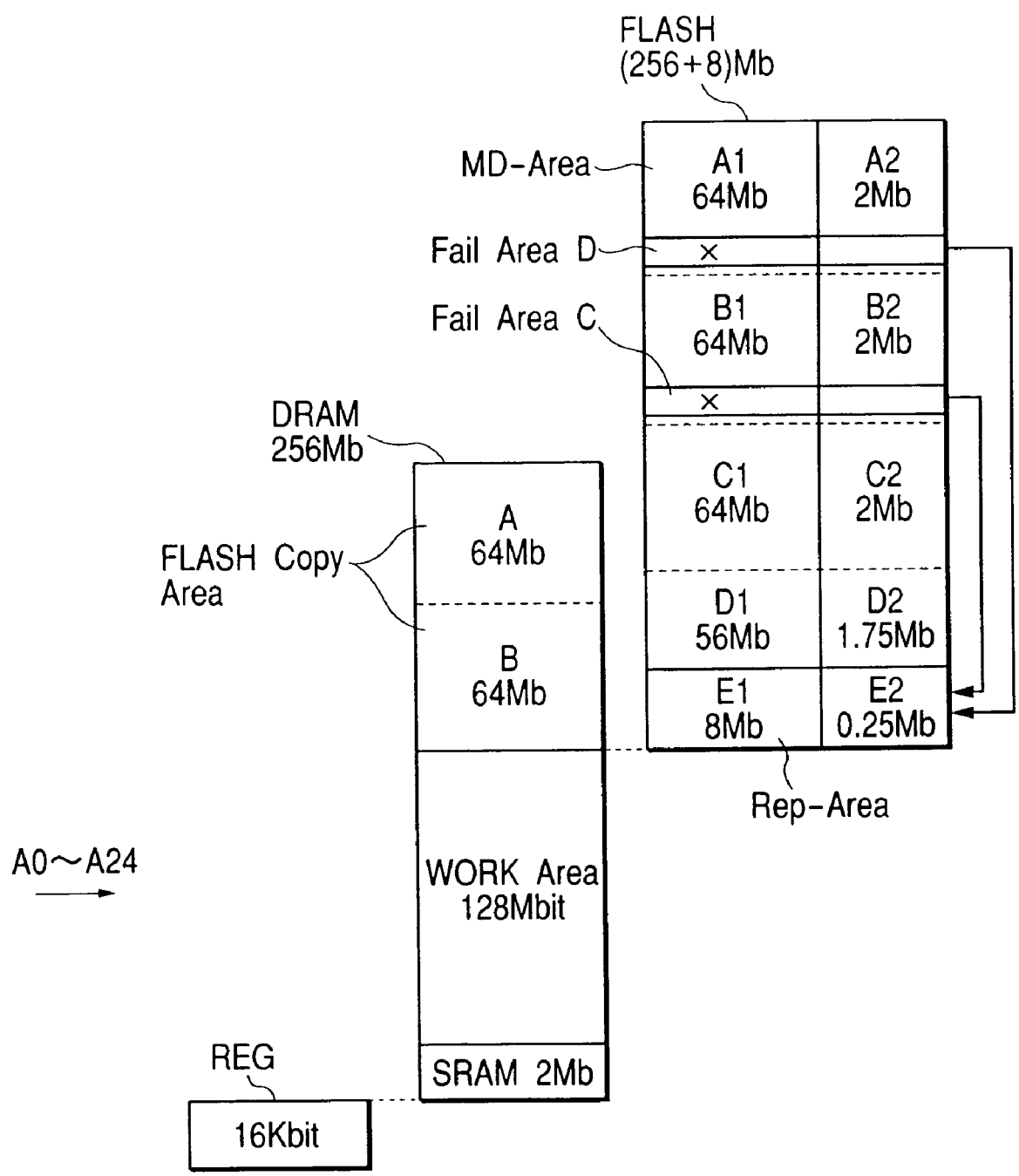
FIG. 25 is an example of the operation of the memory module of the present invention, executed when the module is powered.

FIG. 25 shows an example of memory maps in which the SRAM and the DRAM are mapped in different address spaces. There is no SHADOW area generated due to the duplication in the mapping. Consequently, the address space becomes as wide as 258 Mb (DRAM 256 Mb+SRAM 2 Mb).

Figure 26:
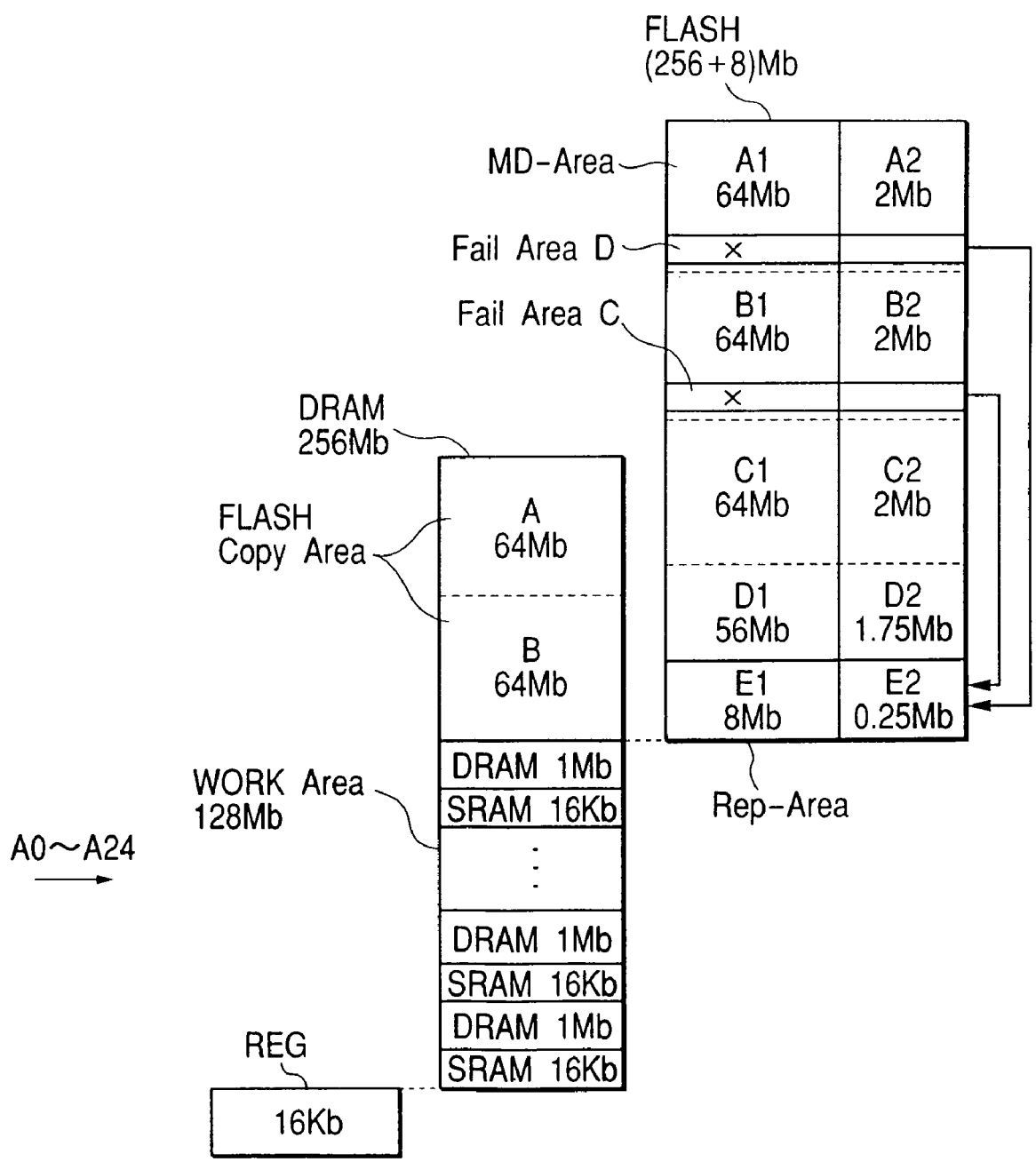
FIG. 26 is an example of the operation of the memory module of the present invention, executed when the module is powered.

In the memory maps shown in FIG. 26, the SRAM area shown in FIG. 22 is divided into 128 areas. As in the example shown in FIG. 25, the address space thus becomes wider. Just like the example shown in FIG. 22, when the power supply of the memory module is controlled to hold and use only the SRAM data, the SRAM area can be dispersed in the memory space. The MMU can thus allocate the SRAM area and the DRAM area in specified address spaces. The allocation can be changed easily by changing the value preset in the built-in control register of the MMU. Furthermore, to reduce the data retention current, it is only necessary to allocate an address space for storing the target data and to stop the power supply to the DRAM. This method will realize a memory module that requires less data retention current.

Figure 27A:
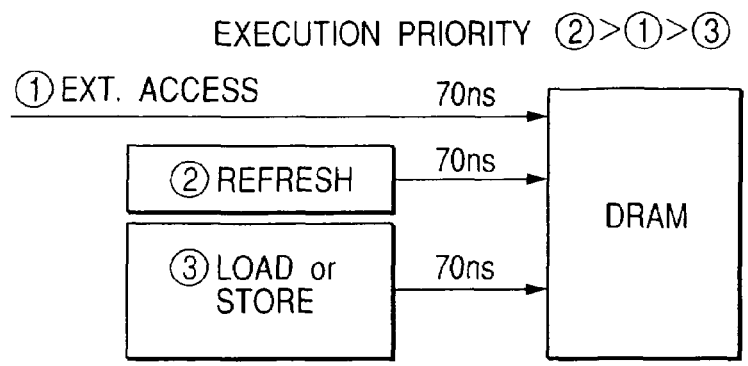
FIGS. 27A to 27C show an example of the access priority order for the operation of the memory module of the present invention.

FIG. 27A shows a priority order of accesses from external to the DRAM, that is, accesses for refreshing the DRAM and accesses with LOAD and STORE commands. In FIG. 27, the first priority is given to the access for refreshing, the second priority is given to the access from external, and the third priority is given to the access with the LOAD or STORE command.

Figure 27B:
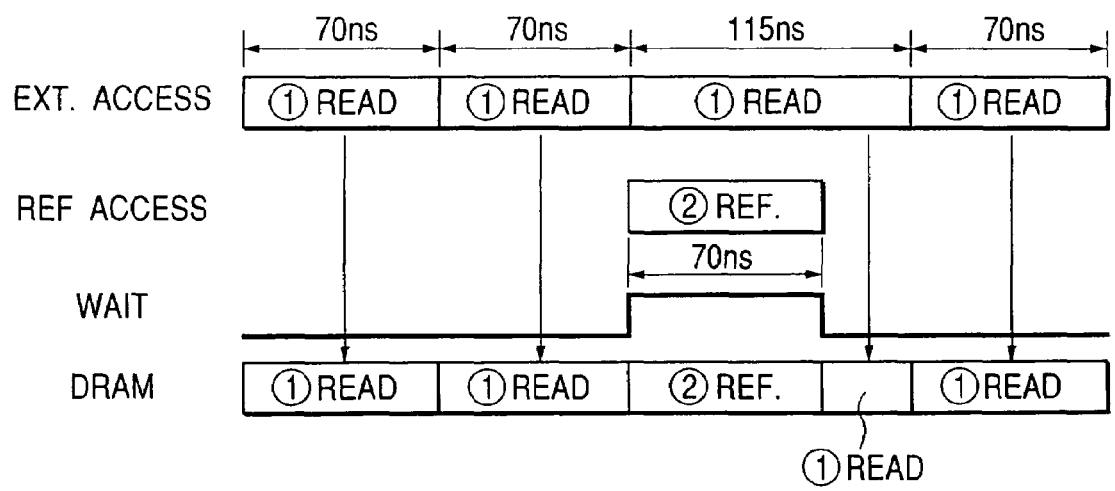
Figure 27C:
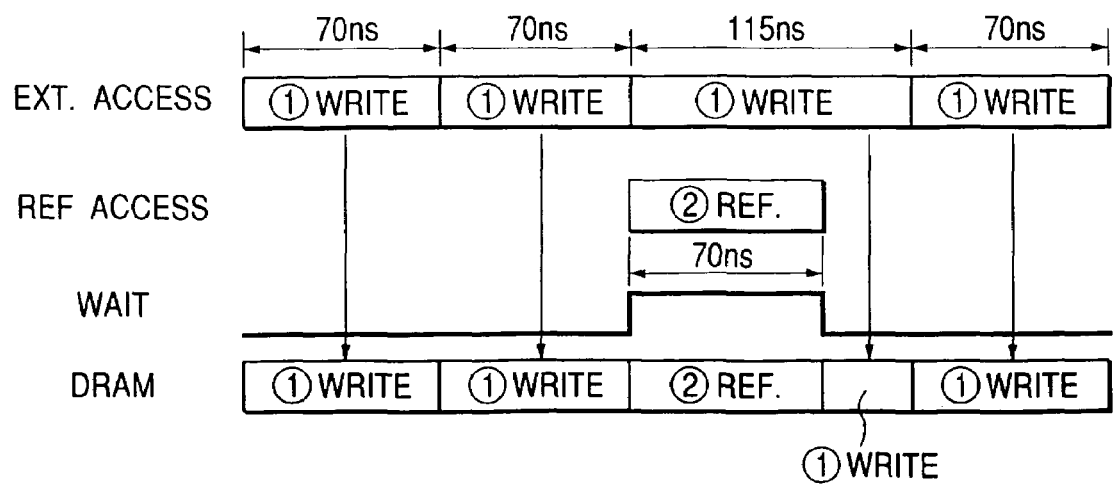

FIG. 27B shows the operation of the DRAM, which is accessed with a READ command (read access) and a REF.

command (refreshing access) from external. FIG. 27C shows the operation of the DRAM, which is accessed with a WRITE command (write access) and a REF. command (refreshing access).

When no REF access is performed and an external access (i.e., READ or WRITE) is performed, the external access is accepted by the DRAM and enabled to read/write data therefrom/thereto. When both REF access and an external access are requested, the higher priority REF access is accepted, and then the external access is accepted. While the refreshing is performed, the WAIT signal is high, which denotes that the DRAM is accessed.

Figure 28A:
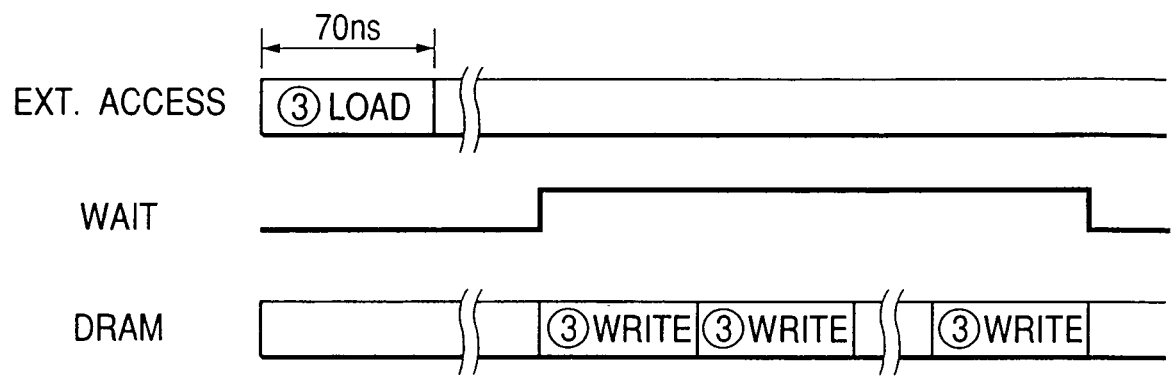
FIGS. 28A and 28B show an example of the operation of the DRAM, executed with LOAD and STORE commands issued from external.

FIG. 28A shows how data is transferred from the FLASH to the DRAM in response to a LOAD command written in the command register. In this case, target data is read from the FLASH and then held in the data buffer R/W BUFFER once. Thereafter, the DRAM is accessed to write the data. The WAIT signal is kept at High until this writing in the DRAM is completed. The signal denotes that an access to the DRAM has already begun.

Figure 28B:
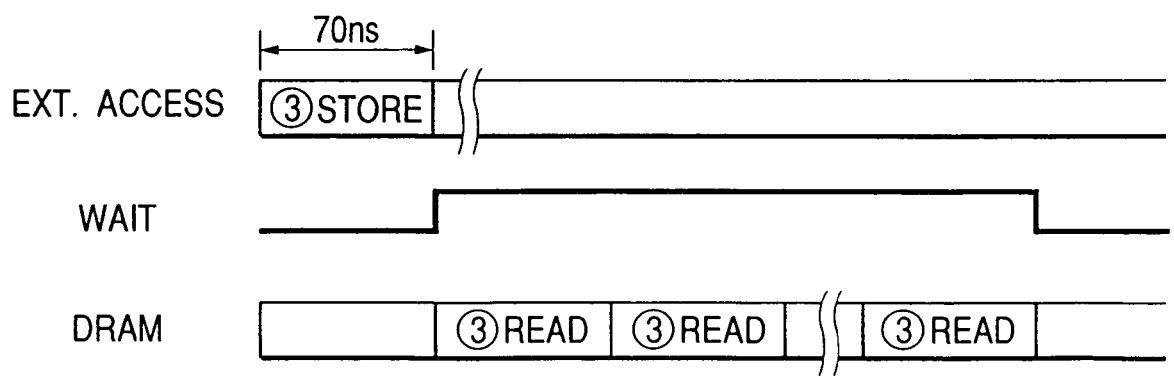

FIG. 28B shows how data is transferred from the DRAM to the FLASH in response to a STORE command written in the command register. In this case, target data is read from the DRAM and held in the data buffer R/W BUFFER once. Thereafter, the FLASH is accessed to write the data thereto. The WAIT signal is kept at High until the read access to the DRAM is completed. The signal denotes that the DRAM is being accessed.

Figure 29A:
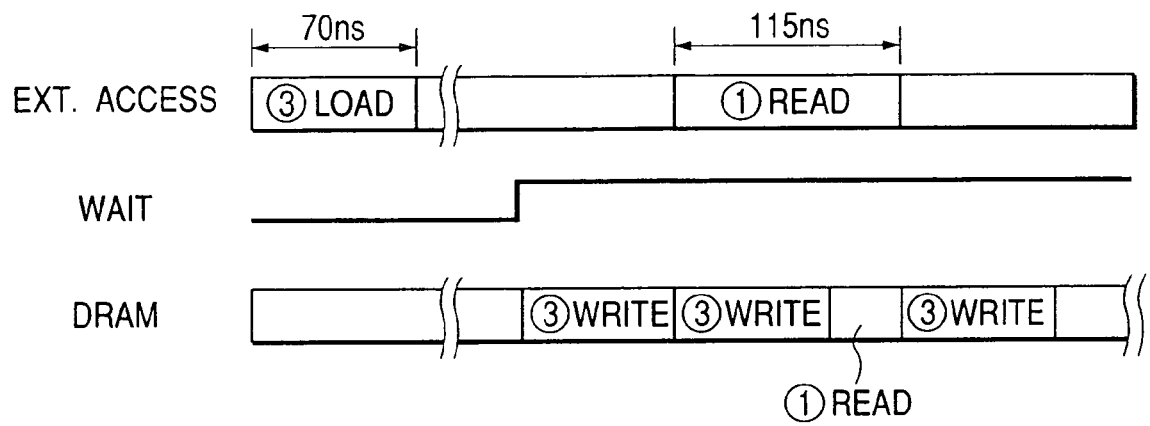
FIGS. 29A and 29B show an example of the operation of the DRAM, executed in response to an access from external while the DRAM is accessed with LOAD and STORE commands.

FIG. 29A shows how the DRAM works in response to a read access from external while a write access is being performed for the DRAM with a LOAD command. Although the type of the external access is not specifically limited at this time, the access is assumed as a read in this embodiment. For such an external access, the write access to the DRAM with the LOAD command is stopped once so that the external access can be processed. The write access to the DRAM with the LOAD command is restarted when the external access processing is completed.

Figure 29B:
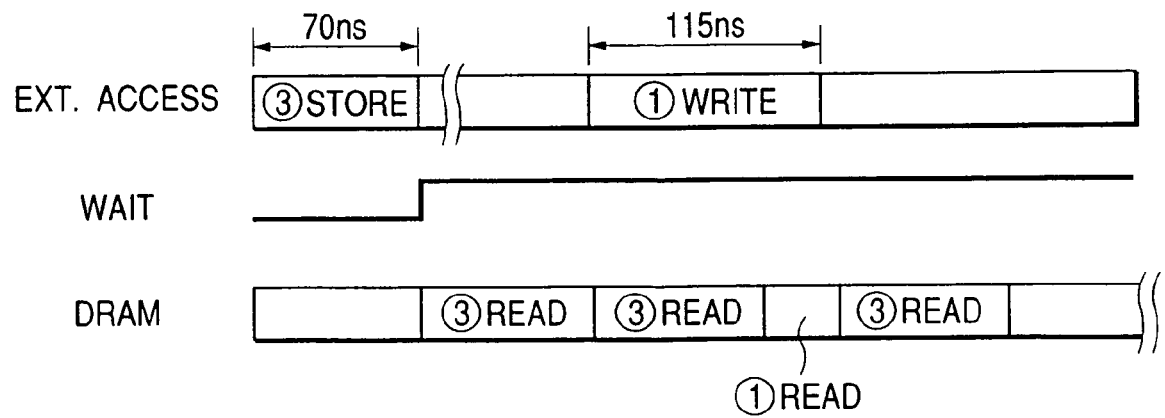

FIG. 29B shows how the DRAM works in response to a write/read access from external while a read access is being performed to the DRAM with a STORE command. Although the type of the external access is not specifically limited at this time, the access is assumed as a write in this embodiment. For such an external access, the read access to the DRAM with the STORE command is stopped once so that the external access may be processed. The read access to the DRAM with the STORE command is restarted when the external access processing is completed.

Figure 30:
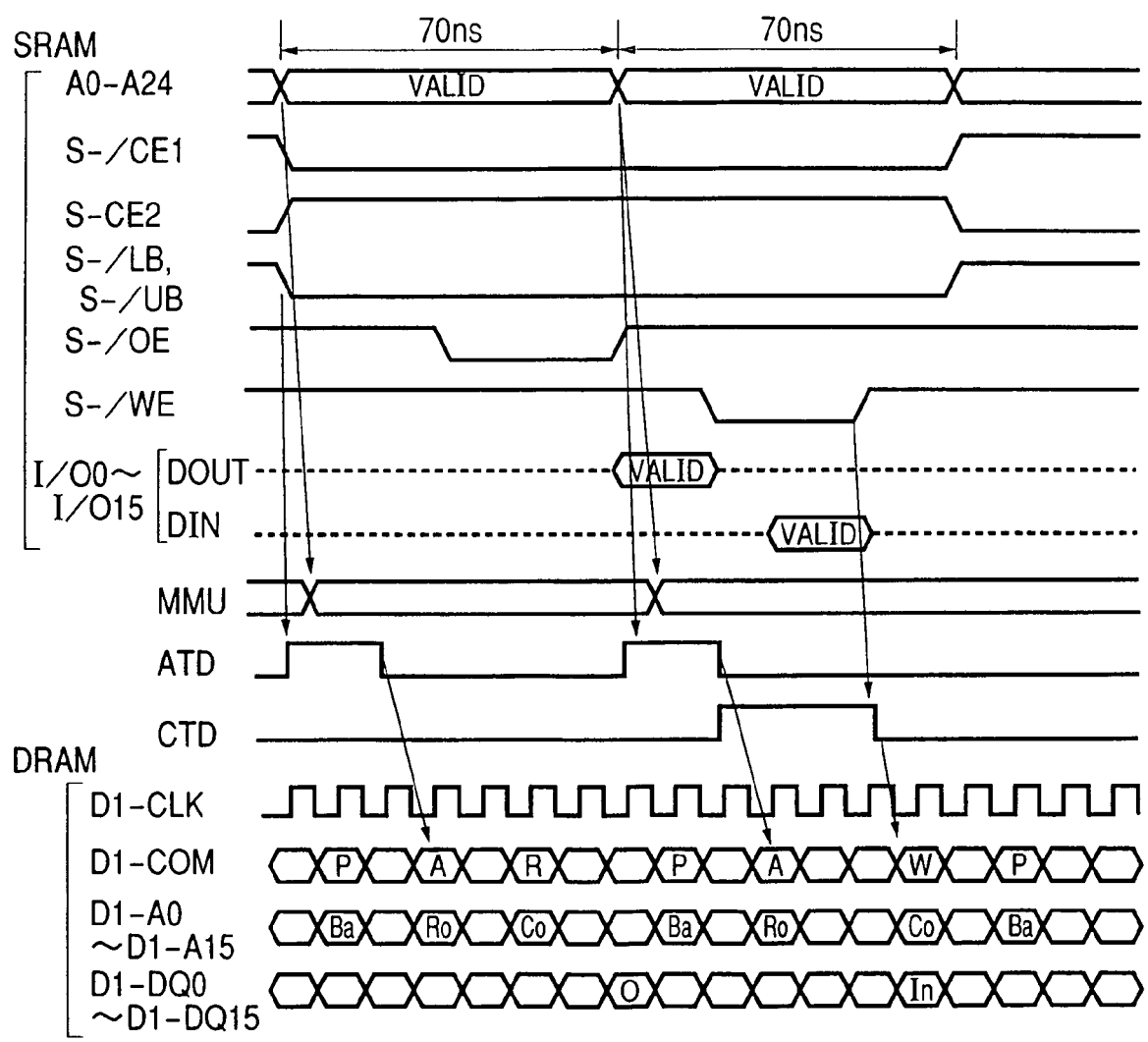
FIG. 30 is a timing chart for the memory module of the present invention.

FIG. 30 shows an example of the operation waveform of the memory module of the present invention. A0 to A24, S-/CE1, S-CE2, S-/LB, S-/UB, S-/OE, and S-/WE are so-called asynchronous SRAM interface signals to be input to the memory module. Data I/O signals I/O0 to I/O15 are divided into input signals and output signals and represented as DIN and DOUT, respectively. MMU, ATD, and CTD represent output signals from the MMU circuit, the ATD circuit, and the CTD circuit, respectively. D1-CLK is a clock signal supplied to the DRAM, and D1-COM is a generic name for the command signals supplied to the DRAM. D1-A0 to D1-A15 are addresses, and D1-DQ0 to D1-DQ15 are DRAM I/O signals.

Initially, a description will be made for a read access to the DRAM. When address signals are input via the address lines A0 to A24, the MMU circuit outputs translated addresses. When the ATD circuit detects a change in any of the address lines A0 to A24 and the command lines (S-/CE1, S-CE2, S-/LB, S-/UB, S-/OE, and S-/WE) and addresses and commands are determined, the ATD outputs pulses. This pulse becomes a trigger for issuing a BANK ACTIVE command A and a row address Ro and then a READ command R and a column address C0 to the DRAM. The data read from the DRAM is output to the D1-DQ0 to D1-DQ15 lines and output to the I/O0 to I/O15 lines via the R/W BUFFER.

An example of a write access will now be described. For a write access, a BANK ACTIVE command A and a row address Ro are issued at the falling of the ATD signal just like in the above read access. Thereafter, the CTD circuit detects a change in any of the command lines (S-/CE1, S-CE2, S-/LB, S-/UB, S-/OE, and S-/WE) to recognize a write access, and then outputs pulses. This pulse becomes a trigger for issuing a WRITE command W and a column address C0, whereby the write access is processed.

Figure 31:
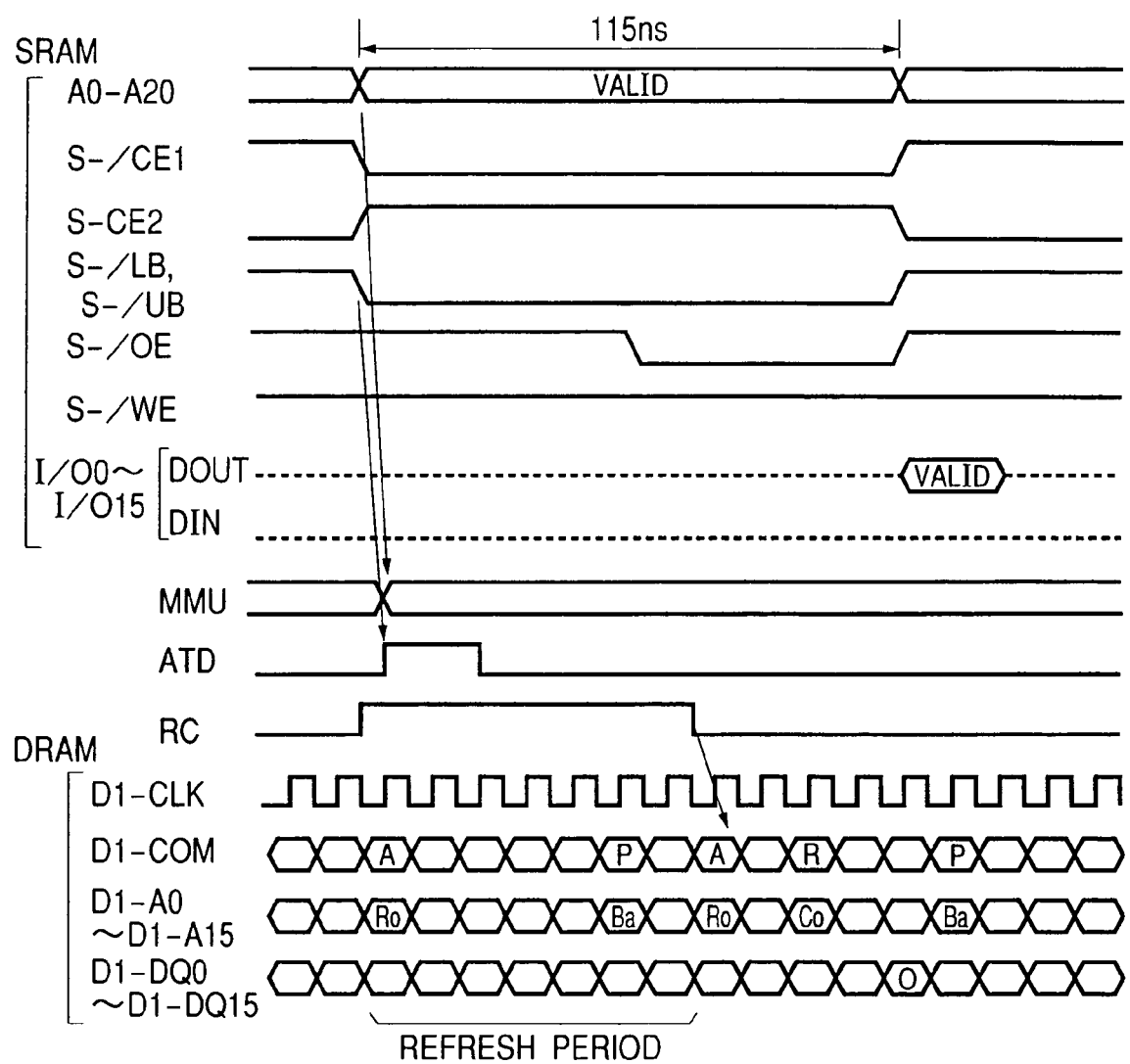
FIG. 31 is a timing chart for the memory module of the present invention.

FIG. 31 shows an example of the operation waveform of the memory module of the present invention. This waveform denotes that an external read access is performed while the DRAM is being refreshed.

To refresh the DRAM, a BANK ACTIVE command A and a row address Ro are issued to the DRAM, and a PRE-CHARGE command P and a bank address Ba are issued to the DRAM. While this refreshing is performed, the refresh counter outputs a signal RC that denotes that the DRAM is in a refresh period. An external read access, when requested during this refreshing period, will be processed as follows. When address signals are input to address lines (A0 to A24), the MMU circuit outputs translated addresses. When the ATD circuit detects a change in any of the address lines A0 to A24 and the command lines (S-/CE1, S-CE2, S-/LB, S-/UB, S-/OE, and S-/WE) and addresses and commands are determined, the ATD outputs pulses. This pulse triggers a latching of these addresses and commands. When the refreshing ends, a BANK ACTIVE command and a row address Ro, and a READ command R and a column address C0 are issued. The data read from the DRAM is output to the D1-DQ0 to D1-DQ15 lines and output to the I/O0 to I/O15 lines via the R/W BUFFER.

Figure 32:
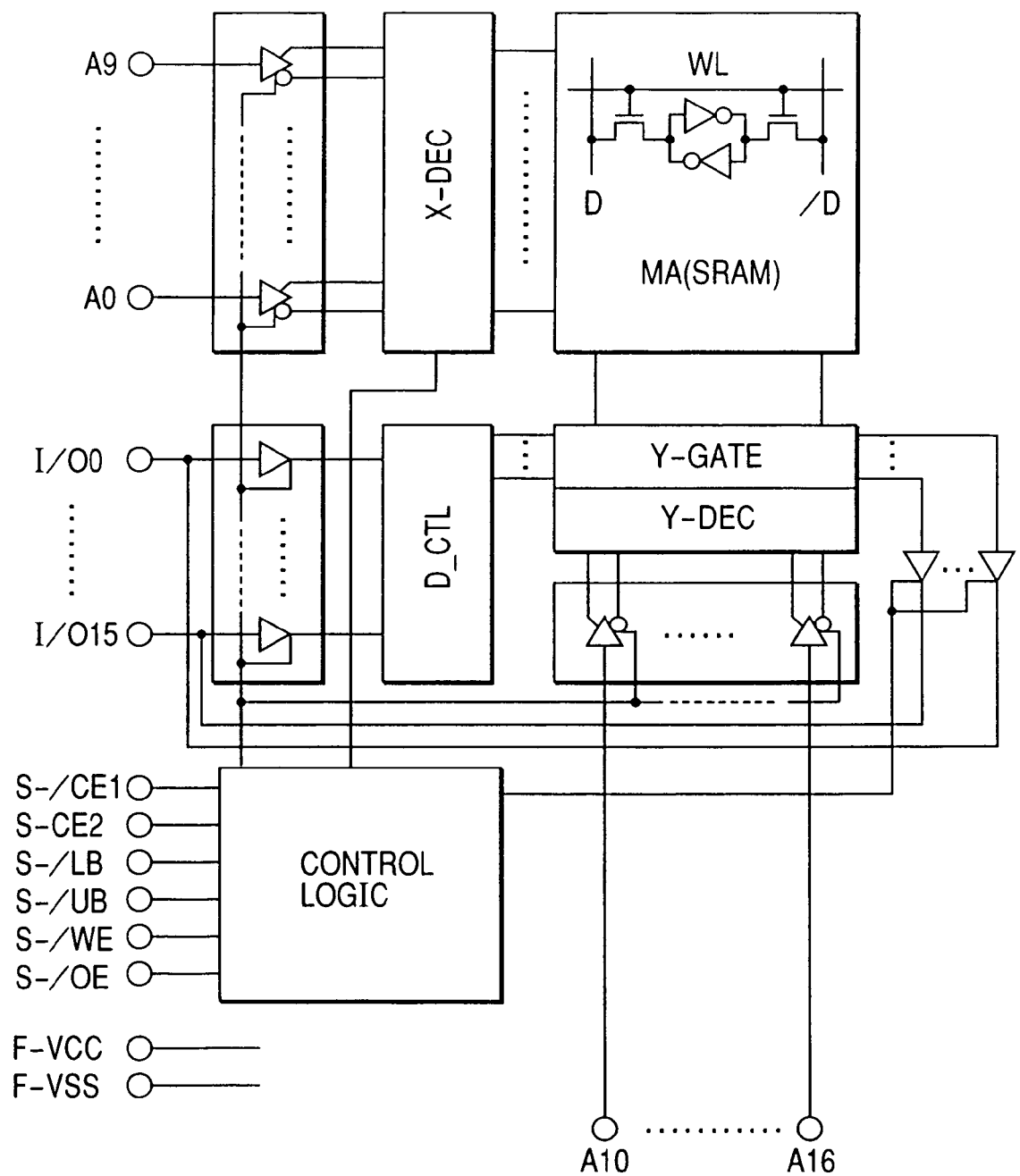
FIG. 32 is a block diagram of an SRAM.

FIG. 32 shows a block diagram of an SRAM according to this embodiment. The SRAM is comprised of an X decoder X-DEC; memory cell arrays MA (SRAM); a Y gate Y-GATE; a Y decoder Y-DEC; an input data control circuit D_CTL; a control circuit CONTROL LOGIC; and an I/O buffer of each signal line. This SRAM is known as "asynchronous" can be employed as a component of the memory module in this embodiment.

According to the embodiments as described above, it is possible to realize a large capacity memory module that uses general-purpose DRAM and SRAM interfaces. In the memory module of the present invention, a part or all of the FLASH data may be copied and transferred to the DRAM from the FLASH beforehand, so as to enable FLASH data to be read at the same speed as that of the DRAM (such as an SDRAM or SRAM). Because the target data written in the DRAM once can be written back in the FLASH as needed, the write access speed also becomes the same as that of the SRAM. When data is to be read from the FLASH, error detection and error correction are performed for the read data, so that a replacement processing is accomplished for each fail address in which data is not correctly written. Therefore, the processing in the memory module is sped up, and the memory module reliability is improved.

Because it is possible to secure a data retention area in the SRAM, as well as a FLASH data copy area and a work area in the DRAM with use of the memory management unit MMU, the memory module of the present invention can be used widely for various apparatuses. While the control circuit (CTL_LOGIC) of the present invention uses an SRAM as described above, the control circuit (CTL_LOGIC) is used to refresh the DRAM. It is therefore possible to use the DRAM just like an SRAM with no consideration for refreshing of the DRAM.

Furthermore, when the DRAM refreshing interval is narrowed, the DRAM can also be used at high temperatures, whereby the temperature range of the memory module can be more widely set. On the other hand, when the DRAM is used at a low temperature, the DRAM refreshing interval is widened, whereby the data retention power consumption can be reduced. The memory module can therefore reduce the data retention power consumption.

The power module PM can also be operated to stop the power supply to part or all of the DRAM, thereby limiting the use of the memory area and reducing the data retention power. Furthermore, the power supply to the control circuit can also be stopped to reduce the data retention power consumption of the memory module of the present invention.

Third Exemplary Embodiment

Figure 33A:
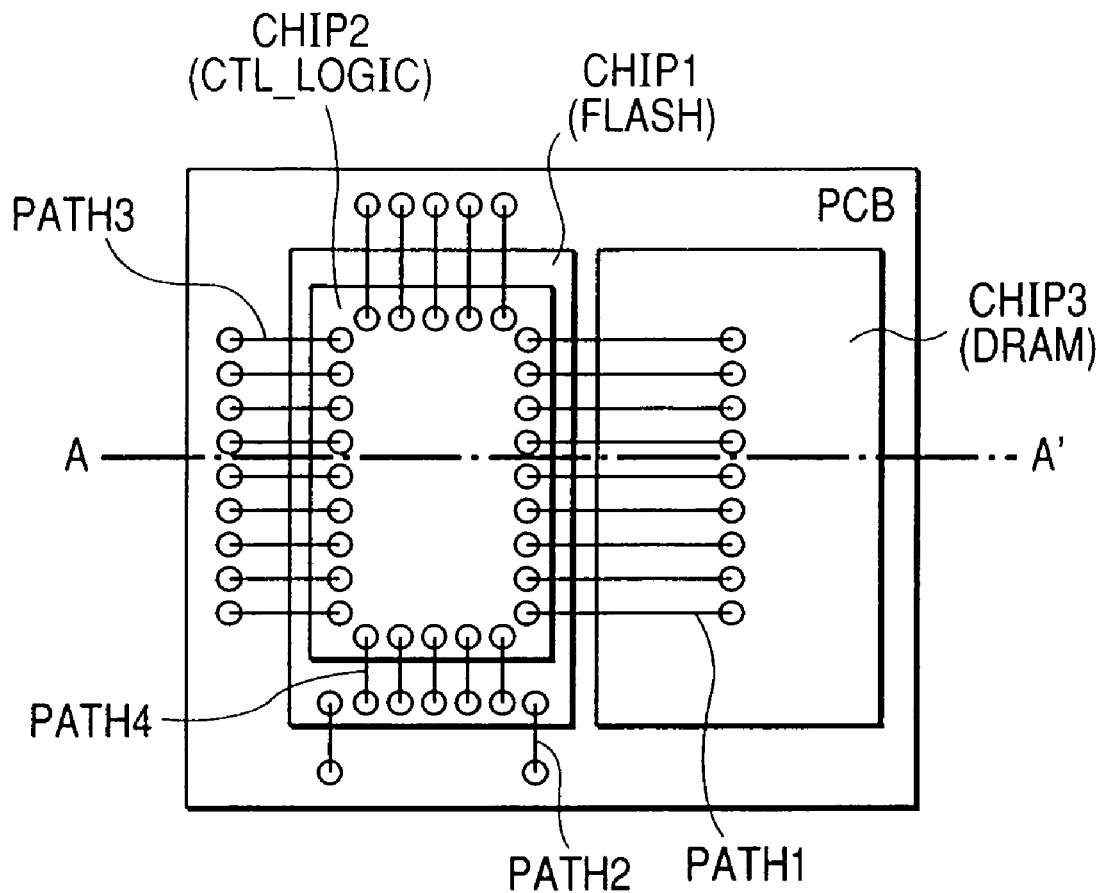
FIGS. 33A and 33B show an example of mounting chips on the memory module of the present invention.
Figure 33B:
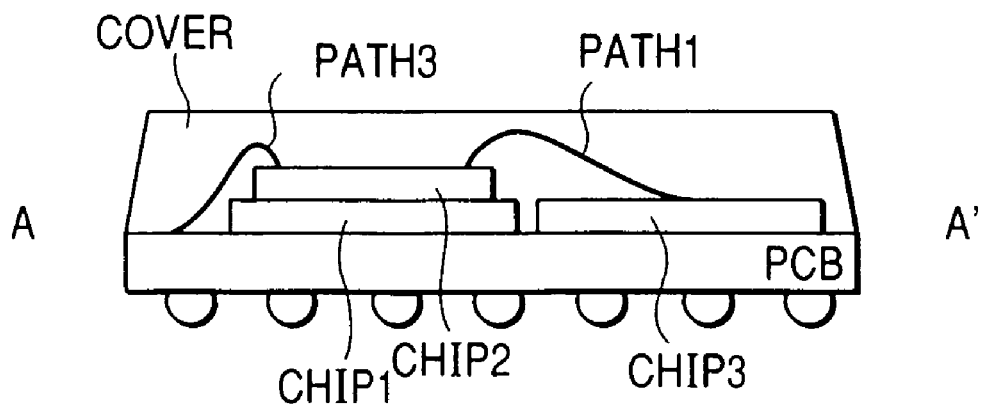

FIGS. 33A and 33B show a third exemplary embodiment of the memory module of the present invention. FIG. 33A shows a top view and FIG. 33B shows a cross sectional view through line A–A' of the memory module, respectively. This memory module enables chip 1 (FLASH) chip 2 (CTL_LOGIC), and chip 3 (DRAM) described in the first embodiment or chip 1 (FLASH), chip 2 (SRAM+CTL_LOGIC), and chip 3 (DRAM) described in the second embodiment to be mounted on a substrate (for example, a printed circuit board PCB made of glass epoxy) mounted on an apparatus with use of ball grid arrays (BGA). Although not specifically limited, chip 1 uses a general-purpose DRAM bear chip at one end of which signal and power supply pads are disposed in a line, and chip 3 uses a general-purpose DRAM bear chip in the center of which signal and power supply pads are disposed in a line.

The bonding pads on chip 1 are connected to the bonding pads on the substrate via bonding wires (PATH2), and the bonding pads on chip 2 are connected to the bonding pads on the substrate via bonding wires (PATH3). The bonding pads on chip 3 are connected to the bonding pads on chip 2 via bonding wires (PATH1). Chip 1 and chip 2 are connected to each other via bonding wires (PATH4). The chip-mounted surface of the substrate is molded with resin to protect the chips and the wirings thereon. The surface may further be protected by a metallic, ceramic, or resin cover (COVER).

In this embodiment of the present invention, the memory module can be configured with a smaller mounting area because bear chips are mounted on the printed circuit board PCB directly. In addition, because the chips can be disposed close to each other, the wiring among the chips may be shortened. Because the bonding wire method is employed for all the wirings between the chips, as well as between each chip and the substrate, the memory module can be fabricated in fewer process steps. Furthermore, because the chips are connected to each other via bonding wires directly, the number of bonding pads and the number of bonding wires on the substrate may be reduced, whereby the memory module can be fabricated in fewer process steps.

The memory module may use general-purpose DRAM bear chips that are produced in large quantities, whereby the memory module can be stably supplied at a low price. When the substrate surface is protected with a resin cover, the strength of the memory module structure increases. When the substrate surface is protected with a ceramic or metallic cover, the strength of the memory module structure increases and the characteristics of heat flux and shielding are improved.

Figure 34A:
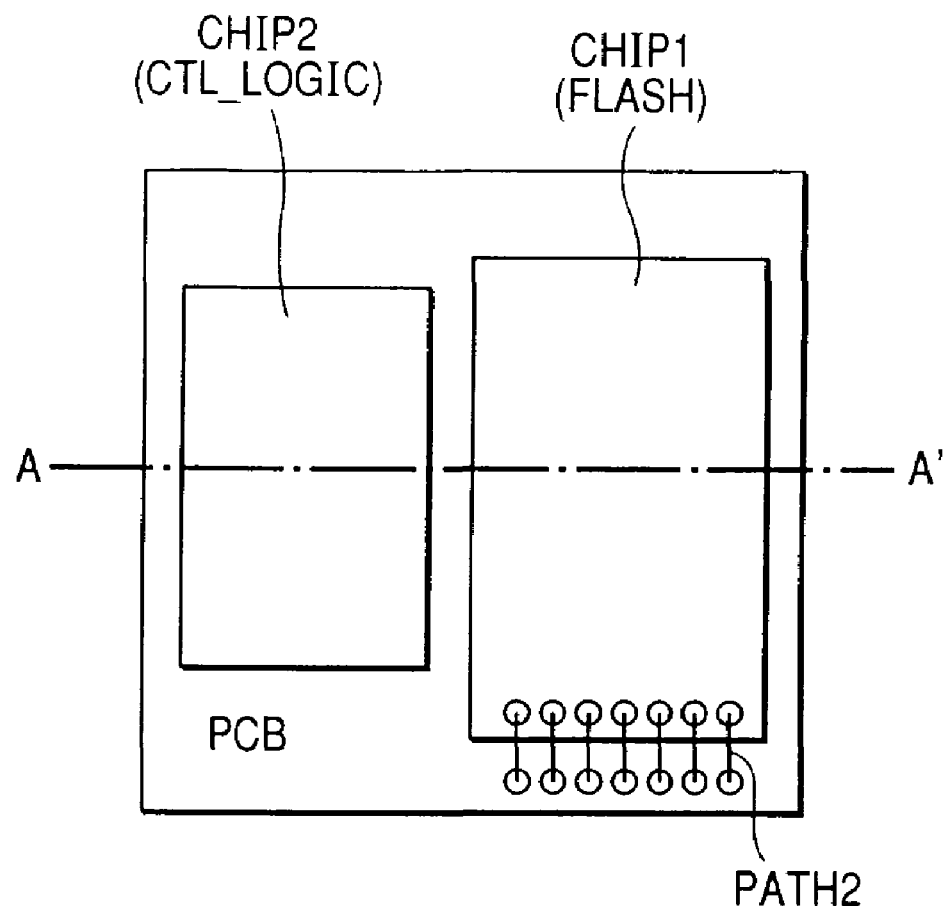
FIGS. 34A and 34B show an example of mounting chips on the memory module of the present invention.
Figure 34B:
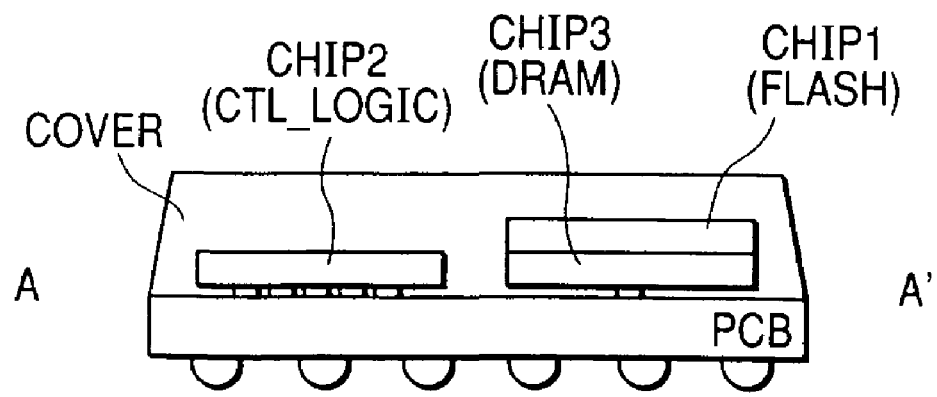

FIGS. 34A and 34B show a variation of the memory module of the present invention shown in FIGS. 33A and 33B. FIG. 34A shows a top view and FIG. 34B shows a cross sectional view of the memory module. In this example, ball grid arrays (BGA) are used for mounting and wiring chip 3 (DRAM) and chip 2 (CTL_LOGIC or SRAM+CTL_LOGIC). The bonding pads on chip 1 are connected to the bonding pads on the substrate via bonding wires (PATH2). This mounting method can omit the bonding between chip 2 (CTL_LOGIC or SRAM+CTL_LOGIC) and chip 3 (DRAM), as well as between chip 2 (CTL_LOGIC) and the substrate, thereby reducing the number of bonding wires. It is thus possible to reduce the number of fabrication process steps and further improve the reliability of the memory module.

Fourth Exemplary Embodiment

Figure 35:
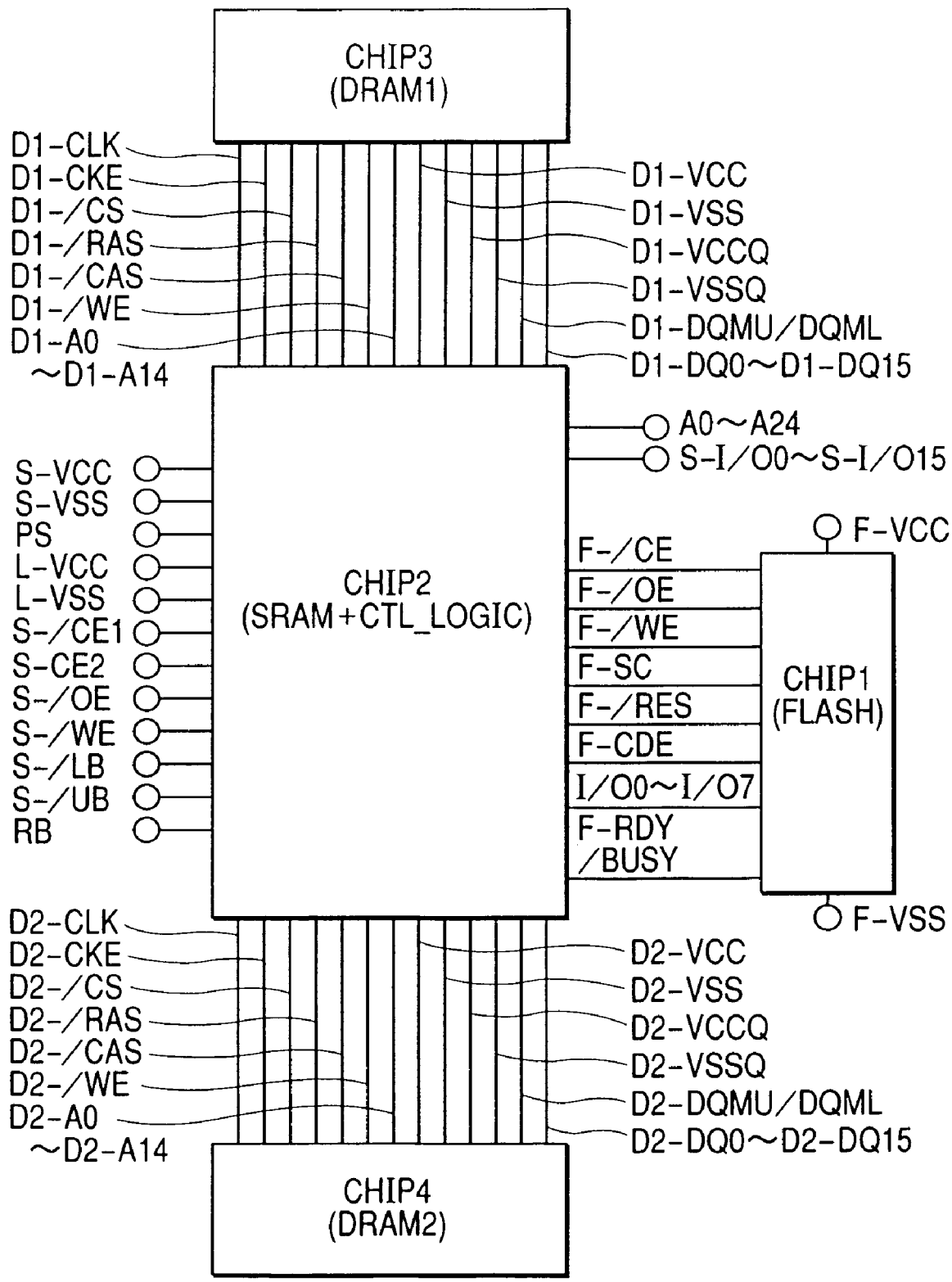
FIG. 35 is another block diagram of the memory module of the present invention.

FIG. 35 shows another embodiment of the memory module of the present invention. The memory module in this embodiment is preferably comprised of four chips. Each of these chips will now be described in detail. Chip 1 (FLASH) is a non-volatile memory. The non-volatile memory may be a ROM (Read Only Memory), an EEPROM (Electrically Erasable and Programmable ROM), a flash memory, or the like. In this embodiment, a flash memory is employed. Chip 2 (SRAM+CTL_LOGIC) is comprised of a static random access memory (SRAM) and a control circuit (CTL_LOGIC) that are integrated thereon. The control circuit controls the SRAM and chips 3 and 4 which are integrated on chip 2. Chip 3 (DRAM1) and chip 4 (DRAM2) are dynamic random access memories (DRAM). DRAMs are classified into various types such as EDO, SDRAM, and DDR, according to the differences in the internal configuration and the interface types among them. Although any type of DRAM may be used for this memory module, the ADRAM is employed in this embodiment.

This memory module receives addresses (A0 to A24) and command signals (S-/CE1, S-CE2, S-/OE, S-/WE, S-/LB, S-/UB, LS-EN, F-EN) input from external. The power is supplied to this memory module via S-VCC, S-VSS, F-VCC, F-VSS, L-VCC, and L-VSS. The S-I/O0 to S-I/O15 are used to input/output data. This memory module uses so-called SRAM interfaces for operations.

Chip 2 supplies signals required for the operation of chips 3 and 4. Chip 2 supplies a serial clock (F-SC), addresses (A0 to A24), FLASH data (I/O0 to I/O7), commands (F-CE, F-/OE, F-/WE, F-SC, F-/RES, F-CDE, F-RDY/BUSY), and DRAM data (D1-DQ0 to D1-DQ15, D2-DQ0 to D2-DQ15) to chip 1. In addition, chip 2 supplies clocks (D1-CLK, D2-CLK), addresses (D1-A0 to D1-A14, D2-A0 to D2-A14), commands (D1-CKE, D2-CKE, D1-/CS, D2-/CS, D1-/RAS, D2-/RAS, D1-/CAS, D2-/CAS, D1-/WE, D2-/WE, D1-DQMU/DQML, D2-DQMU/DQML), DRAM data (D1-DQ0 to D1-DQ15, D2-DQ0 to D2-DQ15), powers (D1-VCC, D2-VCC, D1-VSS, D2-VSS, D1-VSSQ, D2-VCCQ, D1-VSSQ, D2-VSSQ) to chips 3 and 4.

Each of the above commands input to chip 2 will now be described: the S-/CE1 and the S-CE2 are chip enable signals: the S-/OE is an output enable signal: the S-/WE is a write enable signal: the S-/LB is a lower byte select signal: and the S-/UB is an upper byte select signal.

The commands input to chip 1 are as follows: the F-/CE is a chip enable signal, the F-/OE is an output enable signal, the F-/WE is a write enable signal, the F-SC is a serial clock signal, the F-/RES is a reset signal, the F-CDE is a command data enable signal, the F-RDY/BUSY is a ready/busy signal, and the I/O0 to I/O7 are I/O signals used to control the flash memory respectively.

The control circuit (CTL_LOGIC) of chip 2 selects the command register of the control circuit (CTL_LOGIC) of chip 2, the SRAM of chip 2, the DRAM of chip 3/chip 4, or the FLASH of chip 1 according to an address value received from external. It is also possible to select the command register, the SRAM, the DRAM, or the FLASH according to a value set beforehand in the control register provided in the control circuit (CTL_LOGIC). The so-called "SRAM interface" is preferably used for the access to any of them.

To access an SRAM area in chip 2, the addresses of the SRAM area and the necessary commands are input to the control circuit (CTL_LOGIC). For a read access, data is read from the SRAM and output via the data I/O lines (S-I/O0 to S-I/O15) of the memory module. For a write access, the write data is input via the data I/O lines (S-I/O0 to S-I/O15) of the memory module and written in the SRAM.

When the command register in the control circuit (CTL_LOGIC) is accessed to write a LOAD command or STORE command therein, it is possible to copy (load) FLASH data to the FLASH data copy area in the DRAM or write back (store) the data in the FLASH from the FLASH data copy area of the DRAM. When addresses for accessing the command register are input from the address signal lines (A0 to A24), a WRITE command is input from the command signal line (S-/CE1, S-CE2, S-/OE, S-/WE, S-/UB), and a LOAD instruction code followed by start and end addresses of a FLASH area are input from the I/O data signals (I/O0 to I/O15), the LOAD command followed by the start and end addresses are written to the command register. Then, the target data is read from the FLASH area between the start and end addresses, and the data is transferred to the FLASH data copy areas in DRAM1 and in the DRAM2, respectively. Consequently, the FLASH data is held in the DRAM.

Likewise, when a STORE instruction code followed by start and end addresses of a FLASH area are written to the command register, the target data is written back in the FLASH area between the start and end addresses from the FLASH data copy area of DRAM1 or DRAM2. The address correspondence between the address range of the FLASH area and the address range of the FLASH data copy area in each of DRAM1 and DRAM2 can be determined by a value preset in the control register provided in the control circuit (CTL_LOGIC).

The reliability of the FLASH, when rewriting is repeated therein, is degraded, whereby written data is incorrectly read and rewriting is disabled sometimes. When reading data from the FLASH, chip 2 (CTL_LOGIC) makes error detection and error correction for read data so as to transfer corrected data to the DRAM1/DRAM2. When writing data in the FLASH, chip 2 (CTL_LOGIC) checks whether or not data is written correctly. If not written correctly, chip 2 writes the data in another address (replacement processing). Chip 2 also manages such a fail address and the replacement processing performed for such the fail address.

To access the FLASH data copy area in the DRAM, the addresses of the FLASH area are input from the address signal lines (A0 to A24) along with a command signal input from a command line (S-/CE1, S-CE2, S-/OE, S-/WE, S-/LB, S-/UB). When the command signal is a READ command, the control circuit of chip 2 accesses the DRAM to read the target data from the address range in the FLASH data copy area of the DRAM corresponding to the address range of the FLASH area via the DRAM data I/O lines (D1-DQ0 to D1-DQ15 or D2-DQ0 to D2-DQ15). When the command signal is a WRITE command, the write data is input from the data I/O lines (S-I/O0 to S-I/O15) of the memory module and then input to the DRAM via the DRAM data I/O lines (D1-DQ0 to D1-DQ15 and D2-DQ0 to D2-DQ15). Consequently, the read and write access times of the FLASH become the same as those of the SRAM.

To access the work area in the DRAM, the address and command signals required for the access are input to the command register. The control circuit (CTL_LOGIC) then generates the addresses of the work area in the DRAM and accesses the DRAM. For a read access, the data read from the DRAM is output to the data I/O lines (S-I/O0 to S-I/O15) via the DRAM data I/O lines (D1-DQ0 to D1-DQ15 or D2-DQ0 to D2-DQ15). For a write access, the write data is input from the data I/O lines (S-I/O0 to S-I/O15) of the memory module and input to the DRAM via the DRAM data I/O lines (D1-DQ0 to D1-DQ15 and D2-DQ0 to D2-DQ15).

The power to DRAM1 is supplied via the LD-VCC and the LD-VSS. LD-VCC and LD-VSS are connected to the D1-VCC, the D1-VSS, the D1-VCCQ, and the D1-VSSQ via the control circuit (CTL_LOGIC). The power supply to the DRAM is controlled by the command signal PS, and the power supply may be shut off as needed. When the power supply to the DRAM is to be shut off, the control circuit (CTL_LOGIC) enables only necessary data to be automatically written back to the FLASH from the DRAM and then shuts off the power supply to the DRAM after the writing-back is ended. When the power supply to the DRAM is to be restored, the DRAM and the FLASH must be re-initialized. The control circuit (CTL_LOGIC) generates a signal required for the initialization of the DRAM and controls the timing.

The control circuit (CTL_LOGIC) can also issue a BANK ACTIVE command periodically to refresh the DRAM. Generally, the refreshing characteristics of the DRAM are degraded at high temperatures. To avoid such trouble, the control circuit (CTL_LOGIC) may be provided with a thermometer so that the interval for issuing the BANK ACTIVE command may be narrowed at high temperatures, whereby the DRAM may be used in a wider temperature range. Furthermore, because two DRAMs are used for the memory module of the present invention, the work area and each FLASH area are duplicated, so that one data item is held in the two DRAMs while the refreshing timing is adjusted so that the refreshing is hidden from external, whereby accesses to the memory module are not limited by refreshing from external.

As described above, according to this embodiment, it is possible to realize a large capacity memory module, which employs the SRAM interface, has a low-price general-purpose SDRAM and FLASH, and has the same access speed as that of the SRAM. The memory module of the present invention enables the copying of part or all of the FLASH data to be secured in the DRAM so that data is transferred from the FLASH to the DRAM before it is accessed. FLASH data can thus be read at the same speed as that of the SRAM. When data is to be written to the FLASH, the data may be written in the DRAM once and then written back into the FLASH as needed. This is why the data write access speed becomes the same as that of the SRAM.

When data is read from the FLASH, error detection and error correction are preferably performed for the read data. In the case where data is not written correctly in an address during writing in the FLASH, the data is written in another address (address replacement processing), whereby the write processing is sped up and the reliability of the memory module is improved. Because the memory module of the present invention uses a large capacity SDRAM, an area that can copy part of or all of the FLASH data and a large capacity work area can be secured in the SDRAM.

In the memory module of the present invention, which uses a DRAM, the DRAM is refreshed in the module, thereby each DRAM can be used just like an SRAM without consideration to the refreshing of each DRAM during operation. In addition, the interval of refreshing performed in the module may be changed, whereby the temperature range of DRAM operation can be widened. This is why the present invention can realize a large capacity memory module with a wider temperature range.

Furthermore, the memory module of the present invention can hide refreshing of each DRAM from external because data is held in two DRAMs and the refreshing timing of each of the DRAMs is adjusted. Therefore, there is no need to adjust the DRAM refreshing timing to give consideration to the refreshing when this memory module is accessed. Consequently, this memory module can be used just like any memory module that uses only a conventional SRAM. Therefore, no modification is required for any conventional system that uses a large capacity memory module.

The present invention also preferably provides a memory module that requires less data retention current. The DRAM refreshing in the module may be performed at longer intervals especially when operating at a low temperature, whereby the data retention current can be reduced. To further reduce the data retention current, the power supply to the DRAM is shut off, and only the data stored in the SRAM is held. Because only necessary data is stored in the SRAM and the power supply to the memory that stores other unnecessary data is shut off in this way, the data retention current can be minimized to hold the necessary data in the memory module.

Figure 36:
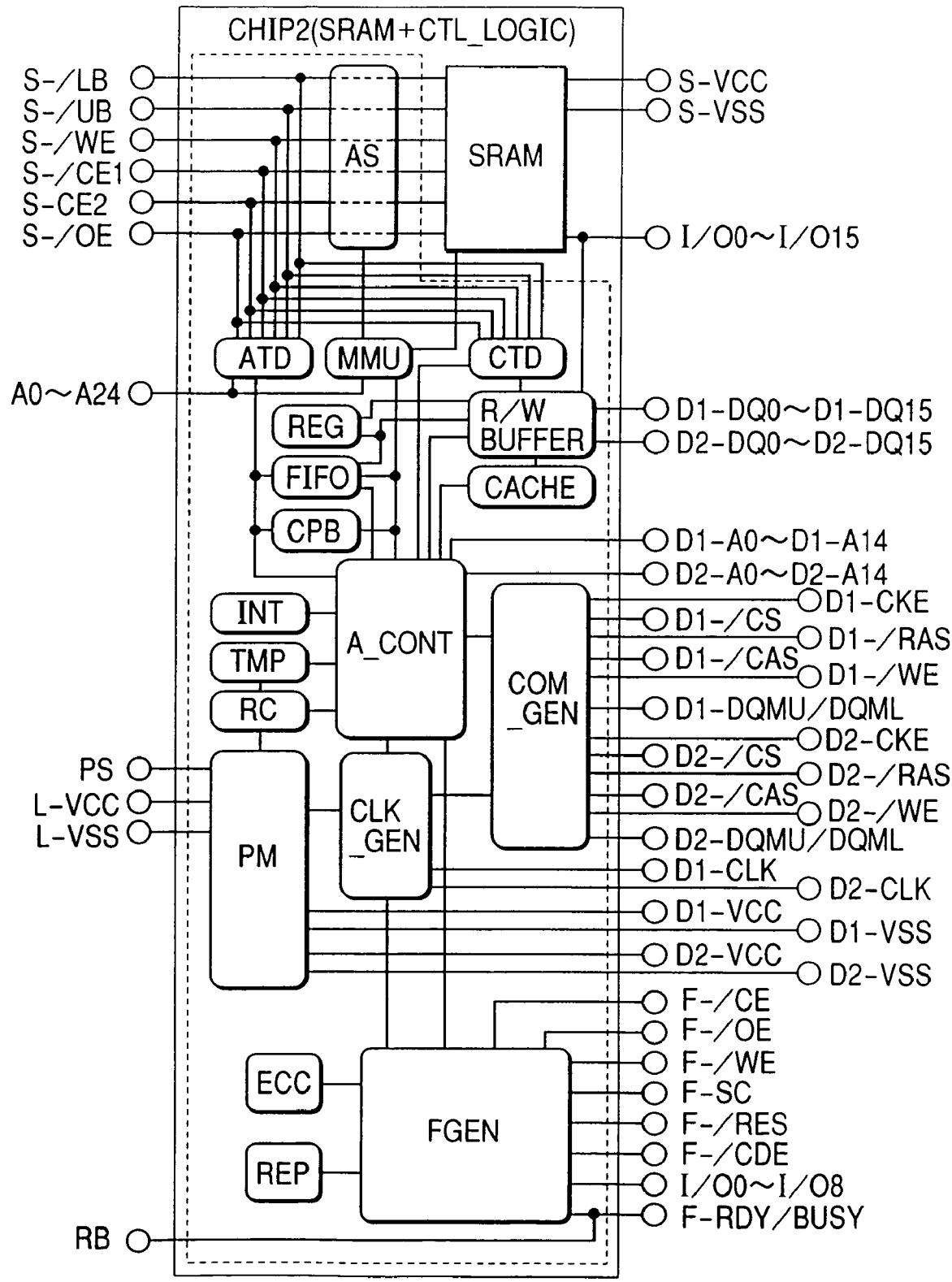
FIG. 36 is a block diagram of the chip 2 shown in FIG. 35.

FIG. 36 shows a block diagram of chip 2 (SRAM+CTL_LOGIC). Chip 2 (SRAM+CTL_LOGIC) is comprised of an SRAM and a control circuit (CTL_LOGIC). The SRAM integrated on chip 2 is a conventional asynchronous SRAM. The control circuit (CTL_LOGIC) is comprised of: AS; MMU; ATD; CTD; REG; FIFO; CPB; R/W BUFFER; CACHE; A-CONT; INT; TMP; RC; PM; CLK_GEN; FGEN; and COM_GEN located in an area outside the SRAM of chip 2. This area is enclosed by a broken line in FIG. 36.

Hereunder, the operation of each circuit block of chip 2 (SRAM+CTL_LOGIC) will be described in detail. The initialization circuit INT initializes the control register located in the memory management unit MMU and the DRAM when the power is supplied.

The memory management unit MMU translates addresses received from external and selects the command register REG, the SRAM, the work area in the DRAM, the FLASH data copy area in the DRAM, or the FLASH for access according to a value preset in the built-in control register. The value in the control register is initialized by the initialization circuit INT when the power is supplied. The value in the control register is updated in response to an MMU CHANGE command input to the command register REG When the SRAM is selected, the access switch (AS) sends address and command signals to the SRAM, whereby the SRAM is accessed.

Upon detecting a change in any of the address and command signals, the address transition detector circuit (ATD) outputs pulses. The command transition detector circuit (CTD) also detects a change in any of the command signals and then outputs pulses. When those detector circuits detect such signal changes, the target memory access begins.

The data buffer R/W BUFFER temporarily holds data before the data is read/written from/to the DRAM. The first-in first-out memory (FIFO) is a buffer circuit that outputs data in the order it is input thereto. The FIFO temporarily holds data and addresses before the data is written to those addresses in the DRAM. The cache CACHE temporarily stores data read/written from/to the DRAM when DRAMs are changed for refreshing and an access is continued for a long time. In addition, the CACHE also stores data to be written in the DRAM with a LOAD command temporarily.

The data renewing management circuit CPB holds information of addresses or an address range in the FLASH data copy area allocated in the DRAM, in which data is renewed, that is, information of addresses or an address range in which data is written.

The command register REG holds instruction codes of commands such as LOAD, STORE, memory management MMU CHANGE, POWER-OFF, as well as start and end addresses for loading, storing, and other functions therein. The command generator COM_GEN generates commands required for accessing the DRAM. The access controller A_CONT controls all of chip 2 and generates addresses required for accessing the DRAM. The FLASH control signal generator FGEN controls reading/writing data from/to the FLASH.

The error correction circuit ECC checks whether or not any error is included in the data read from the FLASH and corrects the error, if any. The replacement processing circuit REP checks whether or not data is correctly written in each address in the FLASH. When writing to an address fails, the REP writes the data in another address (replacement address) prepared beforehand in the FLASH.

The temperature measuring module (TMP) measures the temperature and outputs a signal corresponding to the measured temperature to the RC and the A_CONT. The RC is a refresh counter and generates addresses to which DRAM refreshing is to be performed in accordance with the DRAM refreshing interval. According to the output signal of the temperature measuring module TMP, the refreshing interval may be changed.

The power module PM controls the power supply to the control circuit (CTL_LOGIC) of chip 2 and the DRAM. The clock generator (CLK_GEN) generates a clock and supplies the clock to the DRAM and the control circuit (CTL_LOGIC)

The operation of this memory module will now be described. Access to a memory of chip 2 (SRAM+CTL_LOGIC) is accomplished via a conventional asynchronous SRAM interface. When the ATD detects a change in any of the address signal lines (A0 to A24) and in any of command signal lines (S-/LB, S-/UB, S-/WE, S-/CE1, S-CE2, S-/OE), an access to the command register REG, the SRAM, or the DRAM begins. A value input to an address signal line (A0 to A24) from external is initially translated by the MMU. Thereafter, an address translation pattern is determined by the value preset in a register in the MMU. The translated address determines the access destination (command register REG, SRAM, or DRAM).

When the SRAM is selected (to be accessed), the MMU sends the translated address to the SRAM and instructs the access switch AS to transfer a command. The access to the SRAM begins in response to the command received from the access switch AS. Hereinafter, an access to the asynchronous SRAM is performed.

For a read access to the DRAM, addresses input from external and translated by the MMU, as well as commands detected by the ATD, are all sent to the A_CONT. The A_CONT, determining which DRAM is to be accessed according to the addresses and the commands received from the MMU, instructs the COM_GEN to issue a command to the DRAM. The A_CONT also translates the addresses received from the MMU to row and column addresses of the DRAM and outputs the translated addresses to one of the two DRAMs which is to be accessed. The COM_GEN issues a command to the DRAM to be accessed synchronously with the clock generated by the CLK_GEN. Receiving the command and the addresses, the DRAM outputs data, which is then transferred to the I/O0 to I/O15 via the R/W BUFFER. The read access is thus ended.

For a write access to the DRAM, the A_CONT receives addresses input from external and translated by the MMU, as well as commands and data detected by the ATD and by the DTD. The A_CONT determines which DRAM is to be accessed according to the received addresses and commands, then instructs the COM_GEN to issue a command to the DRAM. The A_CONT also translates addresses received from the MMU to addresses of the DRAM and outputs the translated addresses to the DRAM to be accessed. The COM_GEN issues a command to the DRAM to be accessed synchronously with the clock generated by the CLK_GEN. The write data is input from the data lines I/O0 to I/O15 and held in the R/W buffer before it is written to the DRAM to be accessed. The write data and the addresses are held in the FIFO once and are then written to the other DRAM after the refreshing is ended.

When the memory module is to be used at a high temperature, the DRAM refreshing interval may be shortened so as to more frequently perform the refreshing. In this memory module, the temperature measuring module TMP measures the temperature and sends the measured temperature to both the refresh counter and the access controller. When the temperature rises, the refresh counter shortens the refreshing interval and outputs the addresses for refreshing. On the contrary, when the temperature falls, the DRAM refreshing interval may be extended to reduce the data retention current. The temperature measuring module TMP again measures the temperature and sends the measured temperature to both the refresh counter and the access controller. When the temperature falls, the refresh counter extends the refreshing interval and outputs the addresses for refreshing.

The user may desire a reduction in the current consumption according to the operation state of the subject apparatus in which the above memory module is mounted. A description will now be made of a method for controlling a power supply so as to reduce the power consumption of the memory module according to the operation state of the memory module with use of a power module.

Initially, the simplest method for reducing power consumption is to enable the power module to stop the refreshing performed by the refresh counter according to the command signal PS. In this case, the data stored in the DRAM is erased, but the refreshing power will be reduced. To further reduce the power consumption, the power supply to the DRAM is shut off in the memory module. In this case, the power module stops the power supply to the D1-VCC and the D2-VCC according to the command signal PS output from the subject apparatus. Such a shut-off of the power supply may be performed on both of the DRAMs or may be performed on only one of the DRAMs.

To further reduce the power consumption, the power module may stop the power supply to a part of chip 2 (SRAM+CTL_LOGIC) which is related to the access to the DRAM, according to the command signal PS. In this state, for example, it is possible that power is supplied only to the SRAM, the MMU, and the AS on chip 2 (SRAM+CTL_LOGIC) so as to put the memory module into a mode in which only the SRAM can be accessed. Furthermore, it is possible to operate the memory module with use of the command signal PS so that only SRAM data is held. In this case, all the power supplies except for the S-VCC and the S-VSS connected to the SRAM are shut off, thereby accesses to the memory module is disabled. In this state, the memory module holds data stored in the SRAM.

To restart the DRAM after the power supply thereto is shut off, the DRAM must be initialized, in addition to restarting the power supply. While the initialization method is a conventional one, the initialization of the DRAM in this memory module is accomplished by the access controller (A_CONT) in an initialization procedure instructed by the initialization circuit (INT).

The DRAM, when it is refreshed, must also be initialized before it is restarted. The DRAM in this memory module is also initialized by the access controller (A_CONT) in an initialization process instructed by the initialization circuit (INT).

Figure 37:
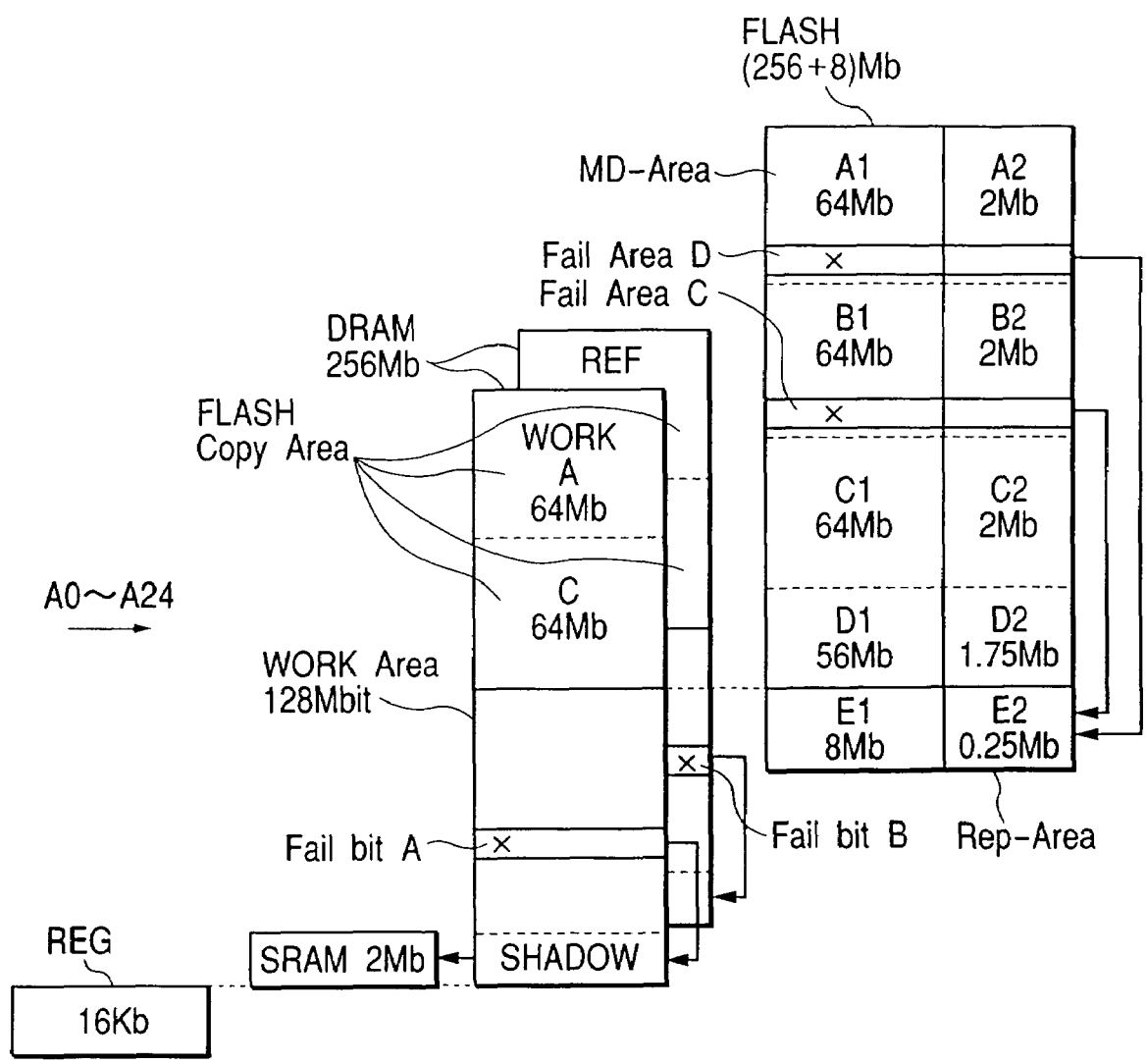
FIG. 37 is an example of memory maps of the memory module of the present invention.

FIG. 37 shows examples of memory maps in which addresses are translated by the MMU. The user can select any of those memory maps according to a value preset in the built-in control register of the MMU. Although not specifically limited, it is assumed in this embodiment that the memory maps are for a memory module in which the FLASH memory area is 256+8 Mb, the SRAM data retention area is 2 Mb, and the DRAM memory area is 256 Mb in capacity, respectively. In the memory maps shown in FIG. 37, the memory management unit MMU translates addresses input via the address lines A0 to A24 to those used in the command register REG, the SRAM, the work area in the DRAM, the FLASH data copy area in the DRAM, and the FLASH. One of the REG, the SRAM, the work area, the FLASH data copy area, and the FLASH is selected and accessed according to the translated addresses.

The command register located in the control circuit (CTL_LOGIC) receives instruction codes such as LOAD, STORE, MMU register CHANGE, and POWER-OFF, as well as start and end addresses for loading, storing, and the like written therein from external. When a LOAD command is written to the command register REG, the control circuit transfers target data from the FLASH to the DRAM. In other words, the control circuit writes the data to the DRAM. When a STORE command is written to the command register, the control circuit transfers target data from the DRAM to the FLASH. In other words, the control circuit reads the data from the DRAM.

The two DRAMs (chips 3 and 4) are preferably mapped to the same address space and hold the same data. Each of the DRAMs repeats an access period (working period) and a refreshing period (REF period) that is alternately given priority execution. Each memory access to the DRAM from external is performed during a working period.

In this example, the 2 Mb SRAM area is localized at the lower portion of the address space. This area is duplicated with the DRAM in the mapping of the memory space, but only the SRAM is accessed in this memory space; the DRAM is not accessed. The SRAM area can be managed to control the power supply to the memory module so as to hold and use only the data in the SRAM.

Any DRAM area (SHADOW) that is not accessed can be used to save the memory cells of the DRAM from being lost. While this memory module is preferably provided with a function that reduces the power consumption to extend the DRAM refreshing interval when the memory module is used at a low temperature, data retention may be difficult in some memory cells (fail bits). In such a case, this SHADOW DRAM area is used to hold the data instead of those fail bits. FIG. 37 illustrates a case in which the DRAM includes a fail bit A during a WORK period and a fail bit B during a REF period. These addresses are registered beforehand, whereby the SHADOW area is used instead of each of those fail bits. In this way, the fail bits are saved by the SHADOW area and the refreshing interval is extended at a low temperature, whereby a memory module with reduced power consumption may be realized.

FIG. 38 shows the principle of the access controlling method for hiding the DRAM refreshing from external. The operation of the DRAM of the present invention will be understood using a concept in which priority is given to an access to a bank during a REF period.

Figure 38A:
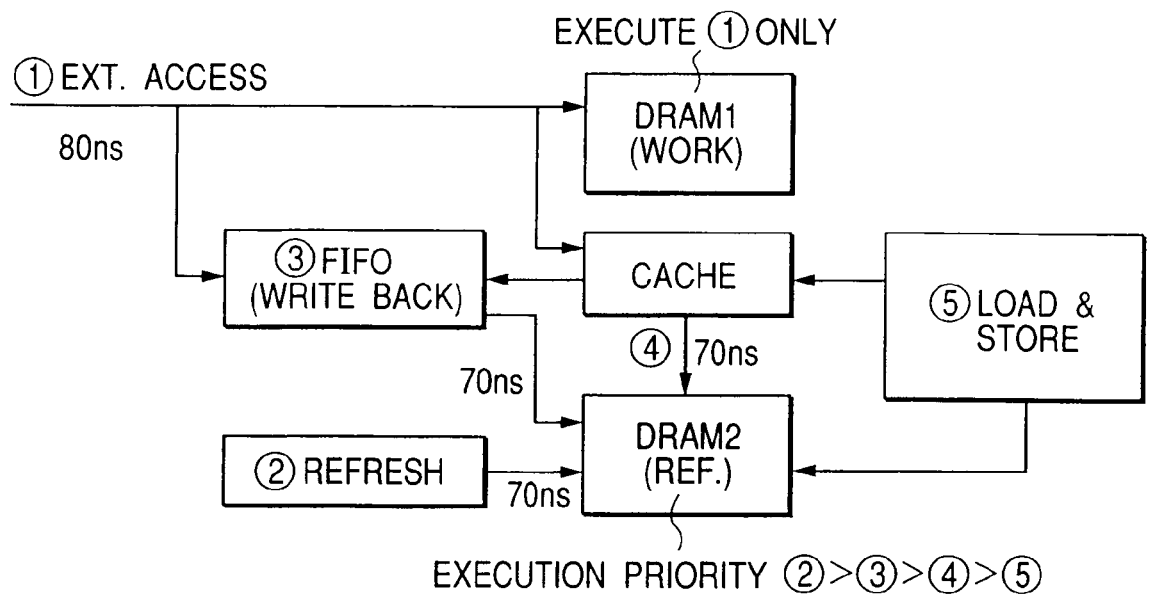
FIGS. 38A to 38C are flowcharts describing a process by which the DRAM is accessed and refreshed concurrently from external.

FIG. 38A shows an explanatory view of an access priority order. In FIG. 38A, DRAM1 is in the WORK period and DRAM2 is in the REF period. FIG. 38A also shows DRAM accesses to be performed in response to a refresh request, a LOAD command, and a STORE command issued from the CACHE that takes over an access temporarily, the FIFO that stores write data temporarily, and the RC.

DRAM1, while it is in the WORK period, is accessed (1) from external. On the other hand, DRAM2, while it is in the REF period, gives top priority to the refreshing (2). Thereafter, data held in the FIFO is written (3) to DRAM2, and data is written back (4) to DRAM2 according to the LOAD command held in the CACHE. Finally, DRAM2 is accessed (5) according to a LOAD/STORE command. The control circuit (CTL_LOGIC) determines the priority order among those operations and executes each processing in the priority order.

The external access (1) is performed, each for 80 ns. However, the refreshing (2), the writing-back from the FIFO (3), the write access from the CACHE (4), and an access by a LOAD/STORE command (5) is executed for 70 ns. This memory module makes use of such a time difference to hide the DRAM refreshing from external.

Figure 38B:
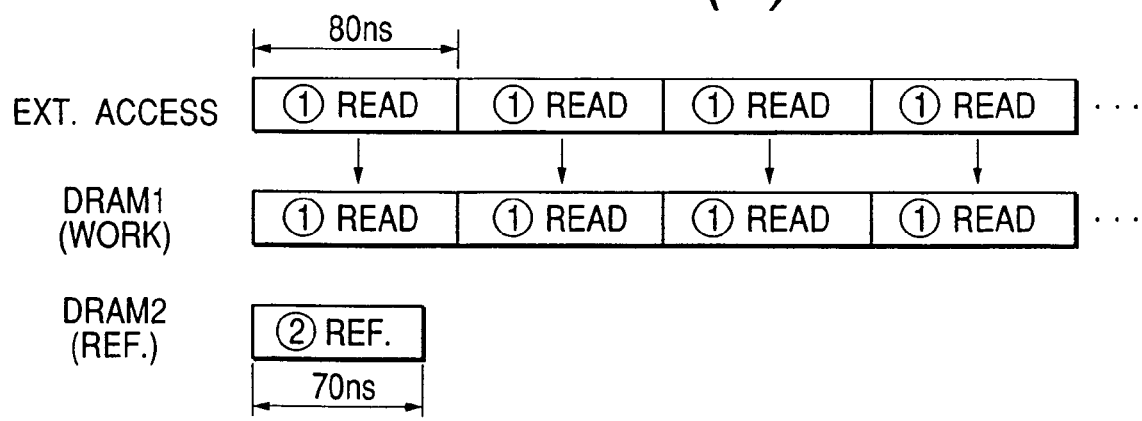

FIG. 38B shows how read accesses are consecutively accomplished to DRAM1 during a WORK period. Only an external access (3) is executed to DRAM1 for 80 ns, and the access is completed after the target data is read. On the other hand, DRAM2 is refreshed (2) for 70 ns.

Figure 38C:
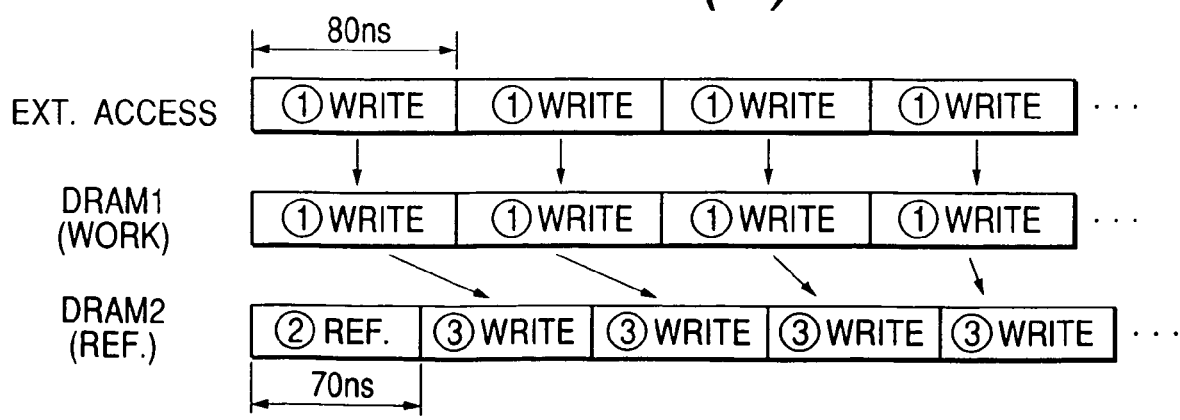

FIG. 38C shows how a write access is accomplished to DRAM1. An external write access (1) is initially executed to DRAM1 during a WORK period. At the same time, write data is held in the FIFO. In DRAM2 during a REF period, top priority is given to the refreshing (2). Thereafter, the data held in the FIFO is written back (3) in DRAM2. At this time, while 80 ns is taken for completing one cycle of operation of DRAM1 during a WORK period, only 70 ns is used for completing one cycle of operation of DRAM2 during a REF period. Consequently, even while DRAM2 is refreshed, writing in DRAM2 is performed faster than DRAM1. It is thus possible to catch up with DRAM1 soon after all the data items stored in the FIFO are written to DRAM2.

Figure 39A:
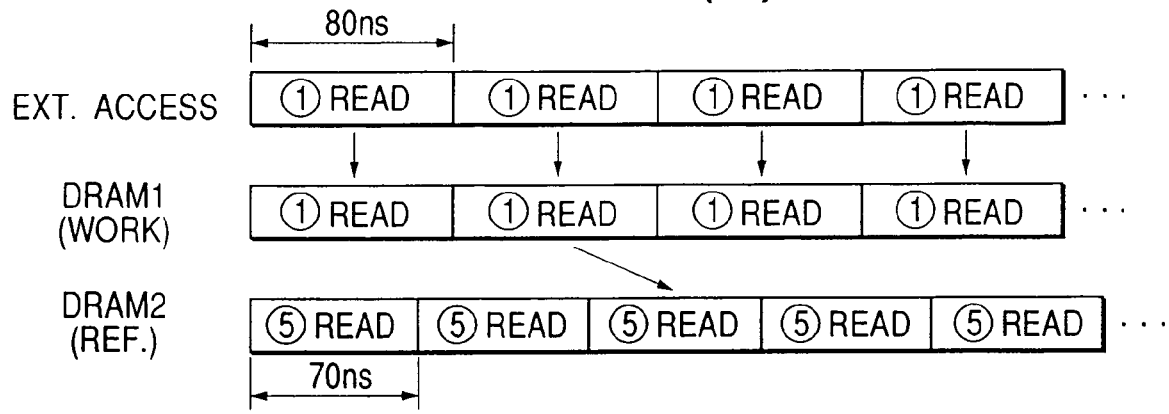
FIGS. 39A to 39C are flowcharts describing a process by which the DRAM is accessed from external and in the memory module of the present invention concurrently.

FIG. 39 shows how write and read accesses to/from the DRAM with LOAD and STORE commands may be hidden from external. FIG. 39A shows how the DRAM is accessed in response to read and write accesses from external while a read access to the DRAM by a STORE command is processed. In FIG. 39A, DRAM1 is in a WORK period and DRAM2 is in a REF period. In DRAM1, only the read access (1) from external is executed for 80 ns. On the other hand, in DRAM2, only the read access (4) to the DRAM with a STORE command is processed for 70 ns.

Figure 39B:
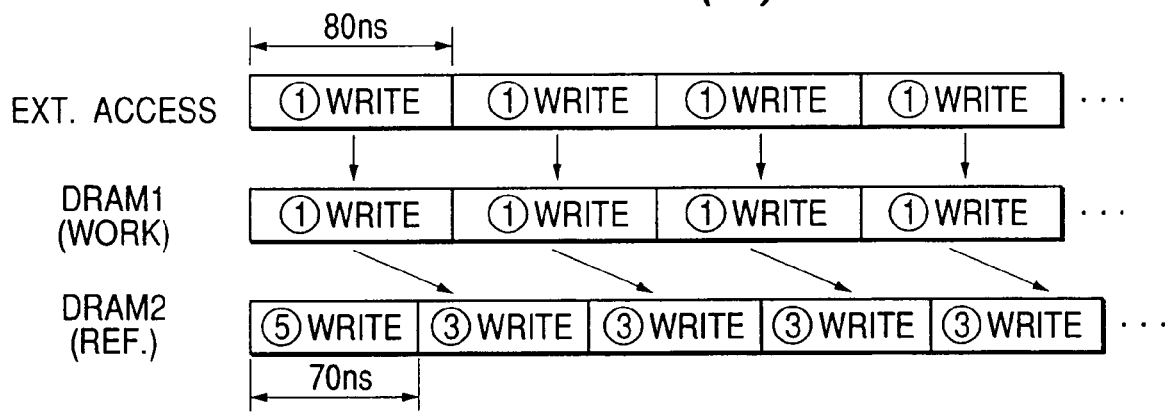

FIG. 39B shows how the DRAM is accessed in response to a write access from external while a write access to the DRAM with a LOAD command is processed. In DRAM1, only the write access (1) from external is executed for 80 ns. At this time, the write data is held in the FIFO. In DRAM2 during a REF. period, the write access (5) to the DRAM is processed with a LOAD command. At this time, the write data is held in the CACHE. After this, the data held in the FIFO is written (3) to the DRAM. The data held in the CACHE is written back to DRAM1 when DRAM1 goes into a REF period. In this case, DRAM2 in a REF period takes 70 ns to end one cycle of operation while DRAM1 in a WORK period takes 80 ns to end one cycle of operation. Consequently, because DRAM2 can write data with a LOAD command faster than DRAM1, DRAM2 can follow up with DRAM1 soon even after writing all the data items are written in the FIFO into the DRAM.

Figure 39C:
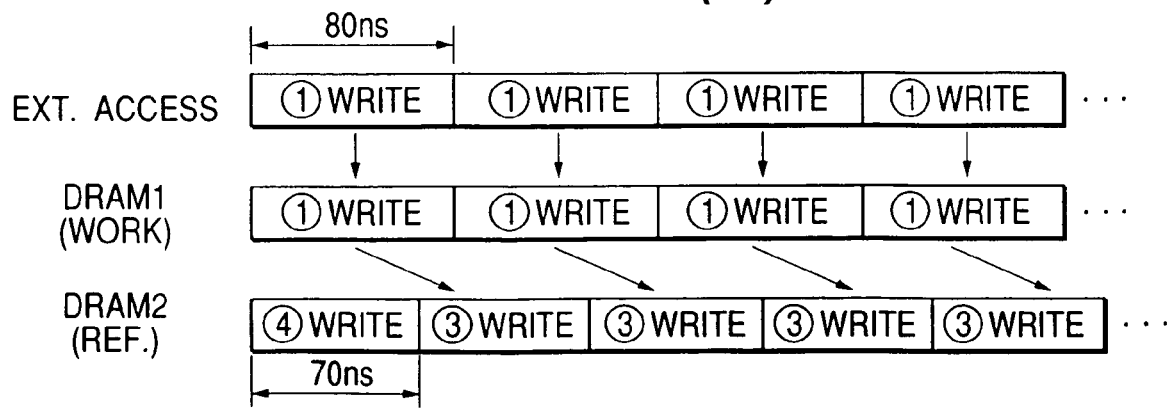

FIG. 39C shows how the DRAM is accessed in response to a write access from external while a write access to the DRAM from the CACHE is processed after the DRAM1 is shifted into a REF period and DRAM2 is shifted into a WORK period respectively. In DRAM2, the write access (1) from external is processed for 80 ns and the write data is held in the FIFO. In DRAM1 in a REF period, the write access (4) to the DRAM from the CACHE is processed, and the data held in the FIFO is written (3) in the DRAM. In this case, DRAM1 in a REF period takes 70 ns to end one cycle of operation while DRAM2 in a WORK period takes 80 ns to end one cycle of operation. Consequently, because DRAM1 is faster than DRAM2 in writing from the CACHE, DRAM1 can follow up with DRAM2 soon even after writing all the data items held in the FIFO are written to DRAM1. Internal accesses to the DRAM with LOAD and STORE commands can be hidden so that external accesses are enabled as described above.

Figures 40A, 40B:
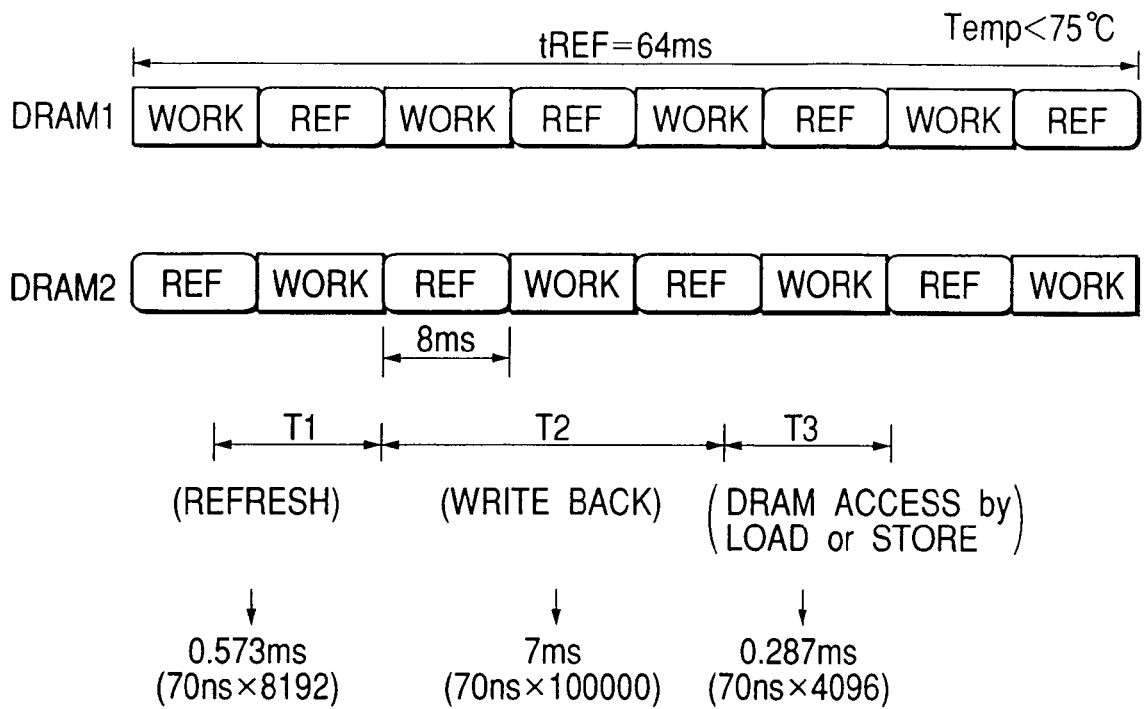
FIGS. 40A and 40B show exemplary DRAM refreshing methods.

FIG. 40 shows how the two DRAMs work in a time division manner so as to hide DRAM refreshing and internal accesses to the DRAM with LOAD and STORE commands. FIG. 40A shows an example of DRAM operation at 75.degree. C. or under, which is a normal operation temperature range. The two DRAMs (DRAM1 and DRAM2) alternately repeat WORK and REF periods. One of the two DRAMs, which is in a WORK period (displayed as WORK) processes external accesses. Initially, DRAM1 goes into a WORK period and processes external accesses. On the other hand, DRAM2 is in a REF period and gives priority to refreshing. When an external access is a write, DRAM2 writes data after the refreshing ends.

The memory cells of a DRAM are typically refreshed within 64 ms. In the example shown in FIG. 40, the WORK period and the REF period are changed at least eight times within this time, so that each of DRAM1 and DRAM2 alternately repeats the WORK period and the REF period four times.

A description will now be made for refreshing enabled during a REF period and a write access and writing back enabled with a LOAD command on the presumption that an 8 ms refreshing time, which is one REF period, is defined as T1, a time required for writing back data from the FIFO in response to a write access during the T1 is defined as T2, and a time enabled for a write access with a LOAD command is defined as T3. For an SDRAM that is 256 Mb in capacity, the memory cell configuration is 8192 rows.times.512 columns.times.4 16-bit banks. The SDRAM is typically required to be refreshed only 32,768 times (for 8192 rows.times.4 banks) for 64 ms. Consequently, in the example shown in FIG. 40A, one DRAM has 4 REF periods for 64 ms, so that the DRAM is refreshed 8192 times in one REF period (8 ms).

One necessary refreshing time is 70 ns, so that T1 becomes 70 uns.times.8192 times=0.574 ms. On the other hand, the maximum number of external write accesses enabled for 80 ms becomes 100,000 times (8 ms/80 ns) when all the accesses are write ones. The time T1 required for writing back data in the DRAM during a REF period is 7 ms (70 ns.times.100,000 times). When 4096 write accesses are performed with a LOAD command, the time T3 required for the write accesses with the LOAD command becomes 70 uns.times.4096 times=0.287 ms.

Consequently, the result of T1+T2+T3 becomes 7.861 ms<8 ms. Thus, it will be understood that refreshing in a REF period, as well as write accesses and writing-back with the LOAD command, can be sufficiently performed. In addition, it is also possible to refresh a plurality of banks in a REF period in the DRAM simultaneously. In this case, the number of refreshing times to be performed in a T1 period may be reduced so that the T1 period can be reduced. When the T1 time is reduced in this way, it is also possible to reduce the FIFO capacity, as well as to shorten the external access interval so as to speed up the processing of the memory module.

FIG. 40B shows a case in which the DRAM refreshing interval is changed. Generally, the DRAM refreshing characteristics are degraded at high temperatures. Consequently, for example, when the temperature is higher than about 75.degree. C., the refreshing interval is shortened, whereby data retention is enabled and the DRAM operation is enabled in a wider temperature range. In this example, the refreshing interval is shortened to 48 ms when the temperature is high. When the T1 remains the same while the T2 is 5.25 ms and the T3 is 0.144 ms, the result of T1+T2+T3 becomes 5.97 ms<6 ms. It will thus be understood that refreshing in a REF period, as well as both write access and write-back at the time of loading can be sufficiently processed.

On the other hand, the DRAM refreshing interval can be shortened when the temperature is low to reduce the data retention current. In the illustrated example, the refreshing time is extended to 128 ms, which is double, when the temperature is reduced. In this case, the REF period becomes 16 ms. When the T1 remains the same, the T2 is 14 ms and the T3 is 1.15 ms, with a result T1+T2+T3 of 15.8 ms<16 ms. It will thus be understood that refreshing in a REF period, as well as both write access and writing-back at the time of loading can be sufficiently processed.

While the DRAM operation has been described for each chip in this embodiment, the operation may be performed for each bank according to the memory module performance and the memory chip configuration. In addition, while the refreshing interval (64 ms) is divided into 8 WORK and REF periods, the refreshing period may be divided into more periods so as to reduce the FIFO capacity for holding data and addresses. On the contrary, the refreshing interval may also be divided into fewer divisions so as to reduce the change-over times between WORK and REF periods, whereby the control circuit that makes such change-over operations can be simplified.

Figure 41A:
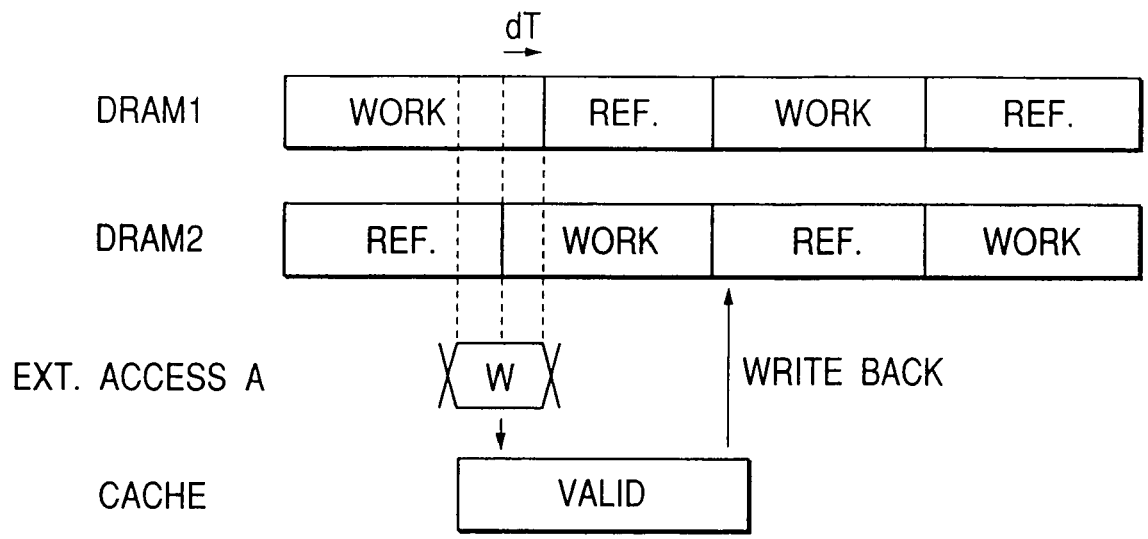
FIGS. 41A and 41B are charts which describe a process by which an access is taken over when WORK and REF. periods are changed over.
Figure 41B:
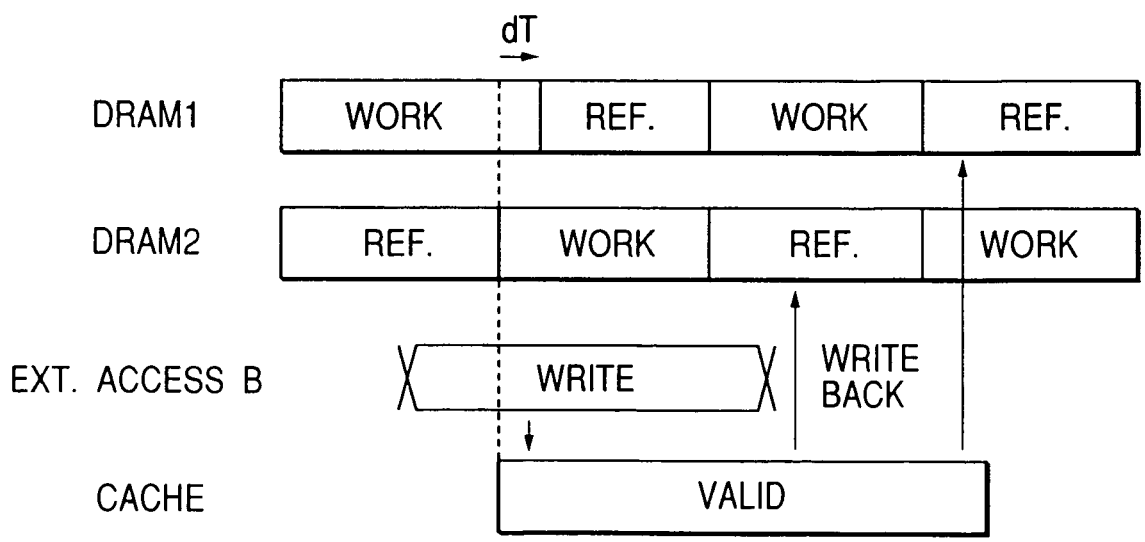

FIGS. 41A and 41B show the CACHE operations. FIG. 41A shows a case in which a write access is requested from external just before WORK and REF periods are changed over. In this case, an external access A is performed when the WORK period of DRAM1 ends. In such a case, the WORK period of the DRAM1 is extended by dT until the write access ends. On the other hand, DRAM2 goes into a WORK period as scheduled, whereby DRAM2 stands by without enabling data to be written therein until the write access ends. The data that is not written in DRAM2 is held in the CACHE. When an access is performed to an address of the same data as that held in the CACHE during a WORK period, data is preferably read/written from/to the CACHE instead of from/to DRAM2. When the access is a write, data is written as usually to DRAM1 during a REF period via the FIFO. The data held in the CACHE is written back to DRAM1 in the next REF period after the WORK period of DRAM2 ends. When this writing-back ends, the data in the CACHE is cleared. When the access is a read, the WORK period of DRAM1 is extended only by dT until the access ends.

FIG. 41B shows a case in which an access is performed for longer than the WORK/REF period and a case in which the operation cannot be completed within the extended period dT. The external access B began while DRAM1 is in a WORK period passes the extended period dT, and the access is continued in the next REF period undisturbed. In this case, the access is also executed to the CACHE and DRAM1 goes into a REF period. DRAM2 goes into a WORK period as scheduled and then into the stand-by state. When the access is a read, data is transferred from DRAM1 to the CACHE. When the access is a write, the data written in the CACHE is written back into both of DRAM1 and DRAM2 when the access ends. The writing-back is performed when each DRAM goes into a REF period. When the writing-back ends, the data in the CACHE is cleared. In this way, the CACHE may be used to process accesses to be performed in both WORK and REF periods, as well as accesses to be performed in one or more WORK periods.

Figure 42:
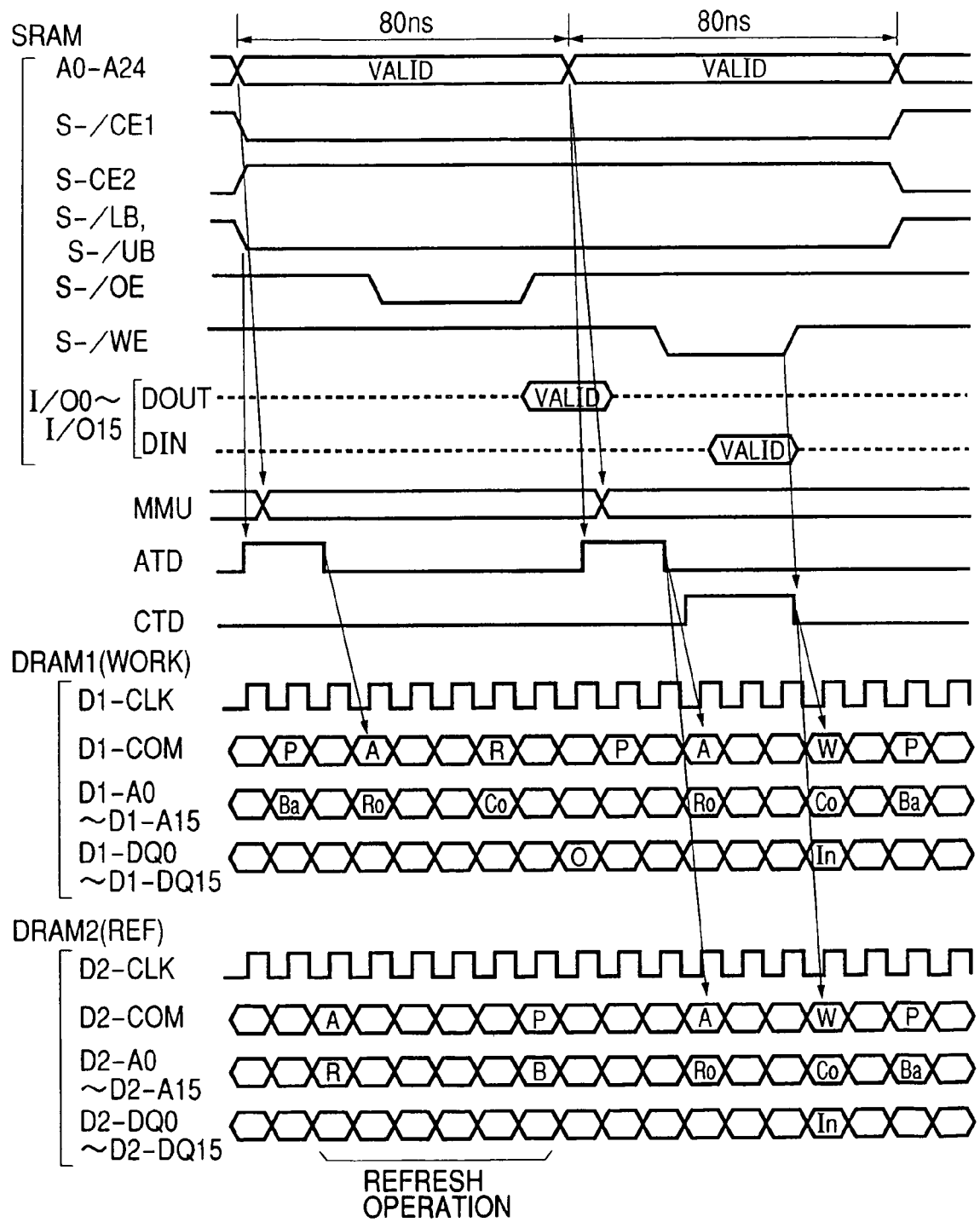
FIG. 42 is a timing chart of the memory module of the present invention.

FIG. 42 shows an example of the operation waveform of the memory module of the present invention. A0 to A20, S-/CE1, S-CE2, S-/LB, S-/UB, S-/OE, and S-/WE are signals to be input to the memory module. They are asynchronous SRAM interface signals. Data I/O signals I/O0 to I/O15 are divided into input signals and output signals and represented as DIN and DOUT. MMU, ATD, and DTD are output signals of the MMU circuit, the ATD circuit, and the CTD circuit. D1-CLK is a clock supplied to DRAM1 and D1-COM is a nominal name of command signals supplied to DRAM1. DL-A0 to D1-A15 are address signals supplied to DRAM1, and D1-DQ0 to D1-DQ15 are DRAM I/O lines used to input/output data signals of DRAM1.

D2-CLK is a clock supplied to DRAM2 and D2-COM is a nominal name of the command signals supplied to DRAM2. D2-A0 to D2-A15 are address signals supplied to the DRAM (DRAM2). D2-DQ0 to D2-DQ15 are DRAM I/O lines used to input/output data signals of DRAM2.

A first read access will now be described. When an address is input via an address line (A0 to A24), the MMU circuit translates the address and outputs the result. The ATD circuit then detects a change in any of the address lines A0 to A24 and the command lines (S-/CE1, S-CE2, S-/LB, S-/UB, S-/OE, and S-/WE) and outputs pulses when both addresses and commands are determined. This pulse triggers the issuance of a BANK ACTIVE command A and a row address Ro and then a READ command R and a column address C0 to DRAM1 during a WORK period. The data read from DRAM1 is output to the D-DQ0 to D-DQ15 and to the I/O0 to I/O15 lines via the R/W BUFFER. On the other hand, a BANK ACTIVE command A and a PRECHARGE command P are input to the DRAM during a REF period to refresh DRAM2.

A description will now be made for a write access to be processed in the next cycle. For a write access, a BANK ACTIVE A and a row address Ro are issued to both DRAM1 and DRAM2 at the falling of the ATD signal just like in the above read access. Because no refreshing is done at the time of a write access, both commands and addresses are issued to both DRAM1 and DRAM2. After this, the CTD circuit detects a change in any of the command lines (S-/CE1, S-CE2, S-/LB, S-/UB, S-/OE, and S-/WE) and recognizes a write operation to be executed, and CTD outputs pulses. This pulse triggers the issuance of a WRITE command W and a column address C0 to both DRAM1 and DRAM2, whereby data is written in the target DRAM.

As described above, according to this embodiment, it is possible to realize a large capacity memory module that uses SRAM interfaces and low-priced DRAMs. The control circuit (CTL_LOGIC) of the present invention, which uses DRAMs, refreshes the DRAMs such that each DRAM can be used just like an SRAM without giving any consideration to the refreshing process. In addition, because two DRAMs are used to hold the same data and it is possible to adjust the refreshing timing and internal accesses to each DRAM with LOAD and STORE commands, the DRAM refreshing and the internal accesses can be hidden from external. Thus, there is no need to give consideration to the DRAM refreshing and internal accesses to each DRAM so as to adjust timings for accessing this memory module. Consequently, the memory module may be used just like any memory module that uses only a conventional SRAM. The large capacity memory module can be used with any conventional systems without modification. In addition, when the DRAM refreshing interval is narrowed, it is possible to operate the DRAMs at high temperatures, thereby allowing the memory module to work in a wider temperature range. On the other hand, when the temperature is low, the DRAM refreshing interval can be extended to reduce the data retention power consumption, whereby the memory module can be realized with reduced data retention power consumption.

It is also possible to stop the power supply to part or all of each DRAM with use of a power module PM to limit the memory area, thereby reducing the data retention power consumption. In addition, when the power supply to the control circuit is stopped, the data retention power consumption of the memory module can further be reduced. In such a case, the data retention area can be freely specified by the MMU, so that the memory module can be used for a wide variety of apparatuses.

Fifth Exemplary Embodiment

Figure 43A:
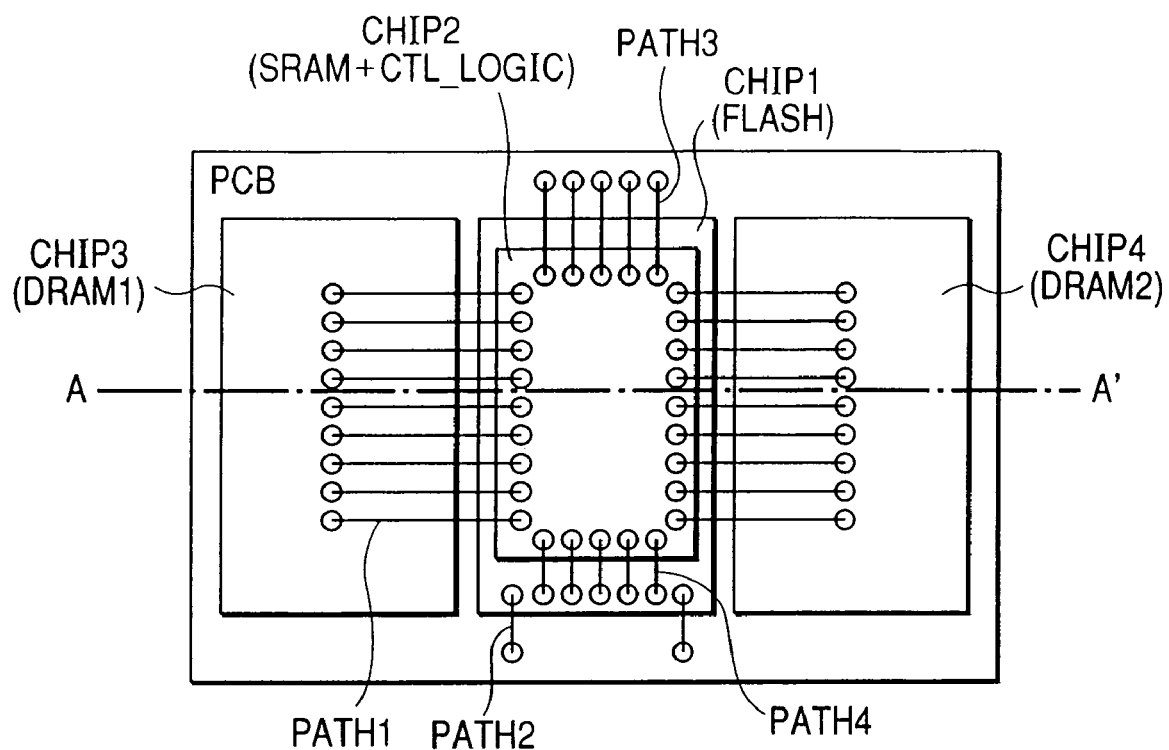
FIGS. 43A and 43B show an example of mounting chips on the memory module of the present invention.
Figure 43B:
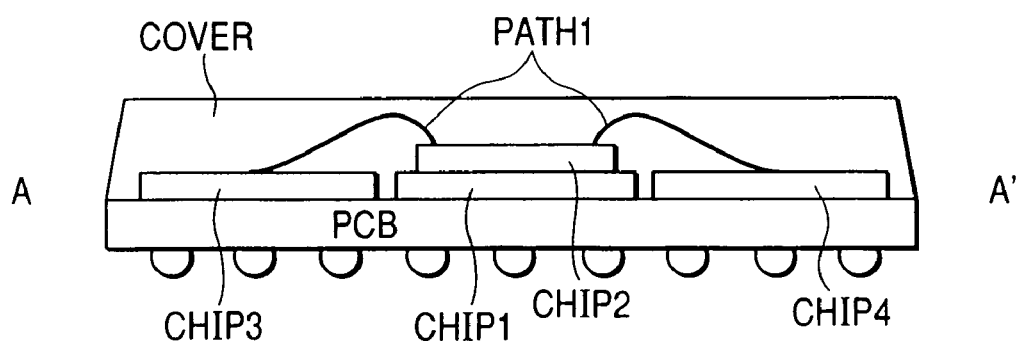

FIGS. 43A and 43B show a fifth exemplary embodiment of the memory module of the present invention. FIG. 43A shows a top view and FIG. 43B shows a cross sectional view through line A–A' of the memory module, respectively. This memory module includes chip 1 (FLASH), chip 2 (SRAM+ CTL_LOGIC), chip 3 (DRAM1), and chip 4 (DRAM2) that are mounted on a substrate (for example, a printed circuit board PCB composed of a glass epoxy substrate) with use of ball grid arrays (BGA). Although not specifically limited, chips 3 and 4 are general-purpose DRAM bear chips in the center of which signal and power supply pads are disposed in a line. Chip 1 is preferably a general-purpose bear chip at one end of which signal and power supply pads are disposed in a line.

The bonding pads on chip 1 are connected to those of the substrate via bonding wires (PATH2), and the bonding pads on chip 2 are connected to those of the substrate via bonding wires (PATH3). Chips 3 and 4 are connected to chip 2 via bonding wires (PATH1). Chips 1 and 2 are connected to each other via bonding wires (PATH4). The top surface of the chips, which are mounted on the substrate, is resin-molded to protect each chip and connection wiring. The top surface of the substrate may further be covered by a metallic, ceramic, or resin cover (COVER).

In all of the above embodiments of the present invention, bear chips are preferably mounted on a printed circuit board PCB directly. It is thus possible to reduce the chip mounting area of the memory module. In addition, because chips can be disposed close to each another on the substrate, the wiring between chips may be shortened. Further, because the bonding wire method is employed for the wiring between chips and the wiring between each chip and the substrate, the number of process steps for fabricating the memory module can be reduced. In addition, because chips are directly connected to each other via bonding wires, the number of bonding pads and the number of bonding wires on the substrate can be reduced, whereby the number of process steps for fabricating the memory module can also be reduced. Furthermore, because mass produced general-purpose DRAM bear chips are used, the memory module can be stably supplied at a low price. When a resin cover is used, the memory module can be configured more strongly. When a ceramic or metallic cover is used, the memory module can be configured more strongly with improved heat flux and shielding characteristics.

Figure 44A:
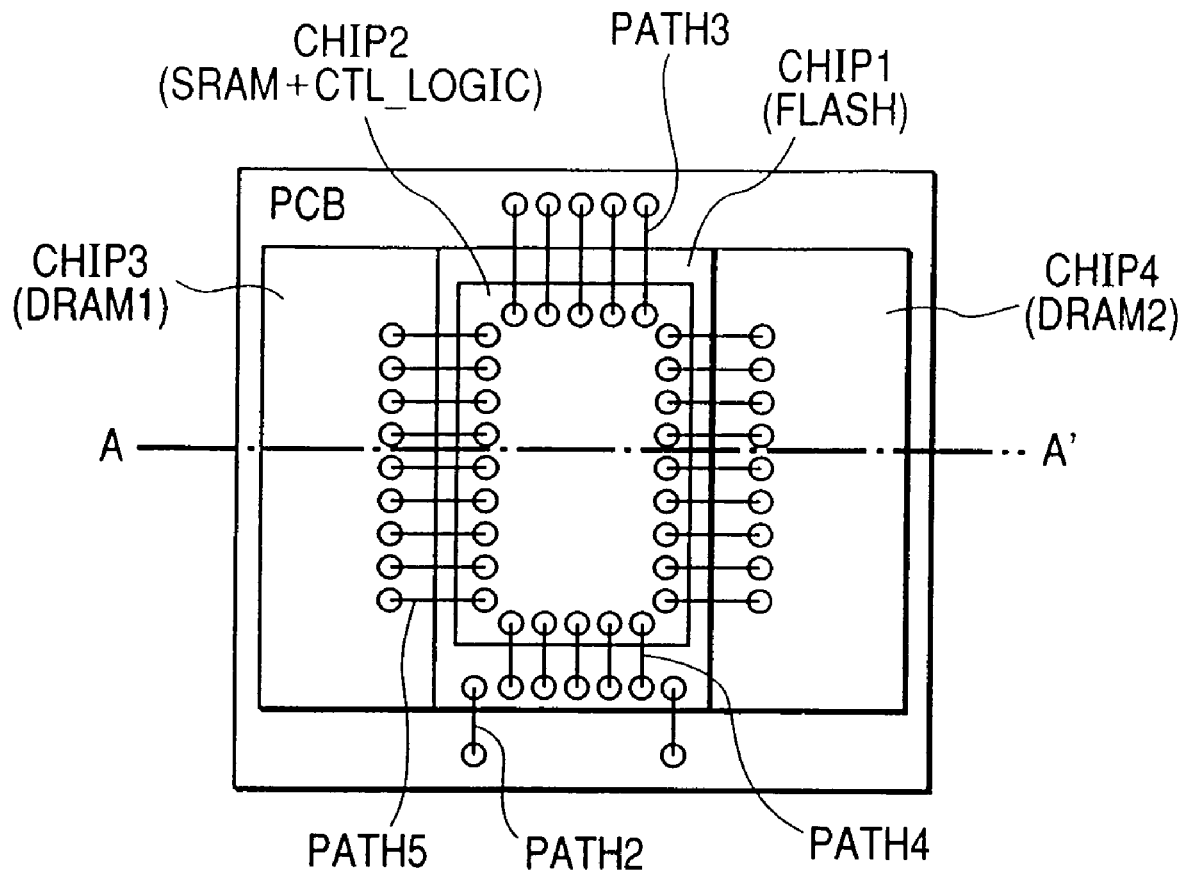
FIGS. 44A and 44B show an example of mounting chips on the memory module of the present invention.
Figure 44B:
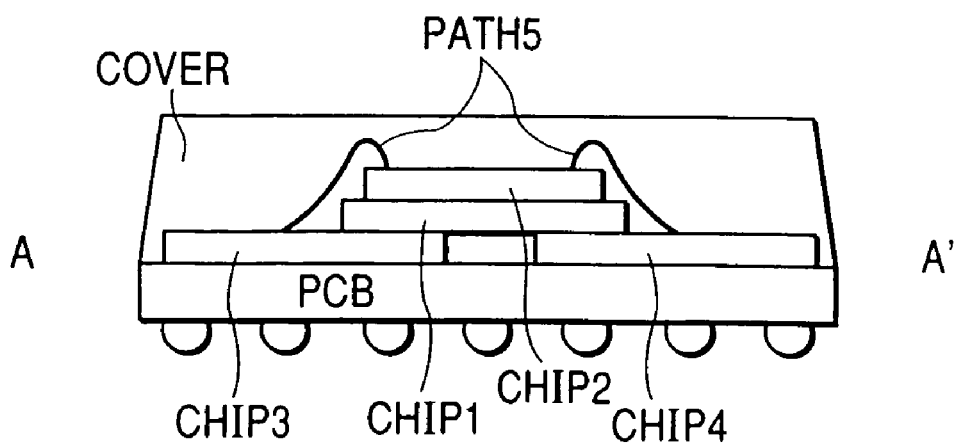

FIGS. 44A and 44B show a variation of the memory module of the present invention shown in FIG. 43. FIG. 44A shows a top view and FIG. 44B shows a cross section of the memory module, respectively. In this example, chip 2 (SRAM+CTL_LOGIC) is mounted over both chips 3 and 4. The PATH5 is used for the wiring between chip 2 and chip 3 or 4. The bonding pads on chip 1 are connected to those on the substrate via bonding wires (PATH2), and the bonding pads on chip 2 are connected to those on the substrate via the bonding wires (PATH3). Chips 1 and 2 are connected to each other via the bonding pads (PATH4).

This chip mounting method can reduce the area of the printed circuit board PCB. In addition, the wiring PATH1 between integrated chips can shorten the wiring, so that the reliability of the wiring can be improved and the noise radiated externally can be reduced.

Sixth Exemplary Embodiment

Figure 45:
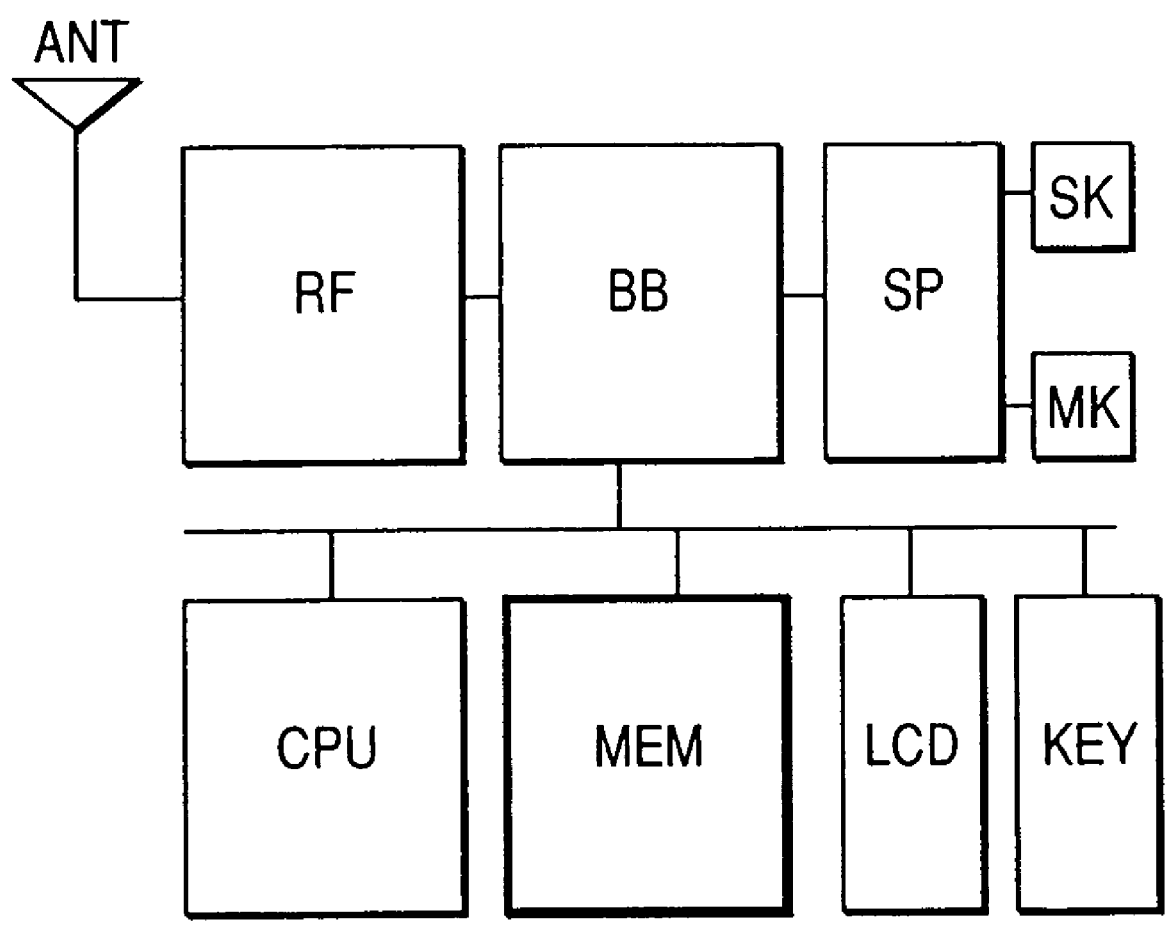
FIG. 45 is a block diagram of a cellular phone including the memory module of the present invention.

FIG. 45 shows an embodiment of a cellular phone that uses the memory module of the present invention. The cellular phone is preferably comprised of: an antenna ANT; a wireless block RF; a base band block BB; a voice codec block SP; a speaker SK; a microphone MK; a processor CPU; a liquid crystal display LCD; a keyboard KEY, and the memory module MEM of the present invention.

The operation of the cellular phone will now be described. A voice received via the antenna ANT is amplified in the wireless block and input to the base band block BB. The base band block BB converts the analog signals of the voice to digital signals, and an error correction is performed for the signals. These signals are then decoded and output to the voice codec block SP. When the voice codec block SP converts the digital signals to analog signals and outputs them to the speaker SK, the voice on the other side of the connection is output from the speaker SK.

A description will now be made for a series of operations for accessing a home page on the Internet to down-load music data, play back the music, and save the down-loaded music data from a cellular phone. The memory module MEM stores a basic program and application programs (mail, Web browser, music play-back, and game programs). When the user starts up the Web browser from the keyboard KEY, the Web browser program stored in the FLASH provided in the memory module MEM is transferred to the DRAM located in the same memory module. After this program transfer, the processor CPU executes the Web browser program in the DRAM, and the Web browser is displayed on the liquid crystal display LCD. When the user accesses a desired home page and specifies down-loading of desired music data from the keyboard, the music data is received via the antenna ANT, amplified in the wireless block RF, and input to the base band block BB. The base band block BB converts the analog signals of the music data to digital signals. Thereafter, both error correction and decoding are performed on the signals. Finally, the music data consisting of digital signals is saved in the DRAM in the memory module MEM and then transferred to the FLASH.

The user then starts the music playback program using the keyboard KEY. Then, the music playback program is transferred from the FLASH in the memory module MEM to the DRAM located in the same memory module. When the program transfer to the DRAM completes, the processor CPU executes the music playback program in the DRAM and the program is displayed on the LCD. Thereafter, the user specifies listening to the music down-loaded to the DRAM from the keyboard. The processor CPU executes the program to process the music data held in the DRAM, whereby the user can listen to the music output from the speaker SK.

At this time, the large capacity memory module of the present invention holds both Web browser and music playback program in the DRAM, and the processor CPU executes both of the programs simultaneously. In addition, the CPU may start up the e-mail program to send/receive e-mails concurrently. The Web browser is preferably held in the DRAM in the memory module MEM even when idle. The Web browser can thus be restarted immediately. When the user inputs a command for shutting off the power supply, the memory module operates only the SRAM and holds the minimum data to minimize the power consumption.

As described above, the use of the memory module of the present invention enables many mails, application programs, music data, still image data, motion picture data, and the like to be stored, as well as lots of music and a plurality of programs to be played back and to be executed, respectively.

Nothing in the above description is meant to limit the present invention to any specific materials, geometry, or orientation of parts. Many part/orientation substitutions are contemplated within the scope of the present invention. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A memory module comprising:
   a plurality of first terminals for inputting a plurality of command signals from outside of the memory module;
   a plurality of second terminals for inputting an address from outside of the memory module;
   a plurality of third terminals for inputting a plurality of data from outside of the memory module;
   a non-volatile memory;
   a random access memory for reading data out to outside of the memory module via the plurality of third terminals;
   a command register into which is written load instruction code, the load instruction code being inputted from outside of the memory module via the plurality of third terminals; and
   an error correction circuit for checking whether or not data read from the non-volatile memory contains any error and correcting the error when detected,
   further wherein when the load instruction code is written into the command register, the data stored in the non-volatile memory is transferred from the non-volatile memory to the random access memory via the error correction circuit, and
   further wherein the random access memory outputs the data after correcting the error by the error correction circuit from the plurality of third terminals when the memory module is accessed to read out data.

2. A memory module according to claim 1,
   wherein the memory module selects the command register or the random access memory according to the address inputted to the plurality of second terminals when the write instruction is inputted to the plurality of first terminals.

3. A memory module according to claim 2, further comprising:
   a controller generating control signals to control the non-volatile memory,
   wherein the controller generates the control signal when the load instruction code is written into the command register.

4. A memory module according to claim 1,
   wherein when the memory module is inputted the address which indicates the non-volatile memory to the plurality of second terminals and a read instruction to the plurality of first terminals, the random access memory outputs the data transferred from non-volatile memory.

5. A memory module according to claim 1,
   wherein the random access memory is a dynamic random access memory, and
   further wherein a capacitance of the dynamic random access memory is equal to or larger than a capacitance of the non-volatile memory.

6. A memory module according to claim 5,
   wherein the memory module uses a SDRAM interface.

7. A memory module according to claim 1,
   wherein the memory module uses a SRAM interface.

* * * * *